United States Patent
Caldwell et al.

(10) Patent No.: US 7,530,033 B2
(45) Date of Patent: May 5, 2009

(54) METHOD AND APPARATUS FOR DECOMPOSING FUNCTIONS IN A CONFIGURABLE IC

(75) Inventors: Andrew Caldwell, Santa Clara, CA (US); Herman Schmit, Palo Alto, CA (US); Steven Teig, Menlo Park, CA (US)

(73) Assignee: Tabula, Inc., Santa Clara, CA (US)

( * ) Notice: Subject to any disclaimer, the term of this patent is extended or adjusted under 35 U.S.C. 154(b) by 174 days.

(21) Appl. No.: 11/269,141

(22) Filed: Nov. 7, 2005

(65) Prior Publication Data

US 2007/0257700 A1     Nov. 8, 2007

Related U.S. Application Data

(63) Continuation-in-part of application No. 11/081,883, filed on Mar. 15, 2005, now Pat. No. 7,298,169.

(51) Int. Cl.
*G06F 17/50*     (2006.01)
(52) U.S. Cl. .................... 716/1; 716/11; 716/12; 716/19
(58) Field of Classification Search ........... 716/1, 716/11, 12, 19
See application file for complete search history.

(56) References Cited

U.S. PATENT DOCUMENTS

| | | | |
|---|---|---|---|
| 4,873,459 A | 10/1989 | El Gamal et al. |
| 5,245,575 A | 9/1993 | Sasaki et al. |
| 5,349,250 A | 9/1994 | New |
| 5,357,153 A | 10/1994 | Chiang et al. |
| 5,365,125 A | 11/1994 | Goetting et al. |
| 5,369,622 A | 11/1994 | McLaury |
| 5,426,378 A | 6/1995 | Ong |
| 5,521,835 A | 5/1996 | Trimberger |
| 5,532,958 A | 7/1996 | Jiang et al. |
| 5,552,721 A | 9/1996 | Gould |
| 5,600,263 A | 2/1997 | Trimberger et al. |
| 5,610,829 A | 3/1997 | Trimberger |
| 5,629,637 A | 5/1997 | Trimberger et al. |
| 5,631,578 A | 5/1997 | Clinton et al. |
| 5,646,544 A | 7/1997 | Iadanza |
| 5,646,545 A | 7/1997 | Trimberger et al. |
| 5,659,484 A | 8/1997 | Bennett et al. |
| 5,682,107 A | 10/1997 | Tavana et al. |
| 5,692,147 A | 11/1997 | Larsen et al. |
| 5,694,057 A | 12/1997 | Gould |

(Continued)

OTHER PUBLICATIONS

U.S. Appl. No. 11/082,221, filed Mar. 15, 2005, Hutchings.

(Continued)

*Primary Examiner*—Thuan Do
(74) *Attorney, Agent, or Firm*—Adeli & Tollen LLP

(57) ABSTRACT

Some embodiments of the invention provide a configurable integrated circuit ("IC"). The configurable IC includes a set of multiplexers that each has a set of input terminals, a set of output terminals, and a set of select terminals. The set of multiplexers includes a group of multiplexers, where at least one input terminal of each multiplexer in the group is a permanently inverting input terminal. During at least a set of cycles during the operation of the configurable IC, several multiplexers in the group of multiplexers are used to implement a particular function.

17 Claims, 36 Drawing Sheets

U.S. PATENT DOCUMENTS

| | | |
|---|---|---|
| 5,701,441 A | 12/1997 | Trimberger |
| 5,719,889 A | 2/1998 | Iadanza |
| 5,732,246 A | 3/1998 | Gould et al. |
| 5,737,235 A | 4/1998 | Kean et al. |
| 5,745,422 A | 4/1998 | Iadanza |
| 5,745,734 A | 4/1998 | Craft et al. |
| 5,761,483 A | 6/1998 | Trimberger |
| 5,764,954 A | 6/1998 | Fuller et al. |
| 5,768,178 A | 6/1998 | McLaury |
| 5,777,360 A | 7/1998 | Rostoker et al. |
| 5,802,003 A | 9/1998 | Iadanza et al. |
| 5,815,726 A | 9/1998 | Cliff |
| 5,825,662 A * | 10/1998 | Trimberger .................... 716/3 |
| 5,889,411 A | 3/1999 | Chaudhary |
| 5,914,616 A | 6/1999 | Young et al. |
| 5,914,906 A | 6/1999 | Iadanza et al. |
| 5,982,655 A | 11/1999 | Doyle |
| 6,002,991 A | 12/1999 | Conn, Jr. |
| 6,023,421 A | 2/2000 | Clinton et al. |
| 6,038,192 A | 3/2000 | Clinton et al. |
| 6,044,031 A | 3/2000 | Iadanza et al. |
| 6,054,873 A | 4/2000 | Laramie |
| 6,069,490 A | 5/2000 | Ochotta et al. |
| 6,075,745 A | 6/2000 | Gould et al. |
| 6,078,191 A * | 6/2000 | Chan et al. .................... 326/40 |
| 6,084,429 A | 7/2000 | Trimberger |
| 6,086,631 A | 7/2000 | Chaudhary et al. |
| 6,091,263 A | 7/2000 | New et al. |
| 6,091,645 A | 7/2000 | Iadanza |
| 6,107,821 A | 8/2000 | Kelem et al. |
| 6,110,223 A | 8/2000 | Southgate et al. |
| 6,118,707 A | 9/2000 | Gould et al. |
| 6,130,854 A | 10/2000 | Gould et al. |
| 6,134,154 A | 10/2000 | Iwaki et al. |
| 6,140,839 A | 10/2000 | Kaviani et al. |
| 6,150,838 A | 11/2000 | Wittig et al. |
| 6,163,168 A | 12/2000 | Nguyen et al. |
| 6,173,379 B1 | 1/2001 | Poplingher et al. |
| 6,175,247 B1 | 1/2001 | Scalera et al. |
| 6,184,707 B1 | 2/2001 | Norman et al. |
| 6,205,076 B1 | 3/2001 | Wakayama |
| 6,233,191 B1 | 5/2001 | Gould et al. |
| 6,275,064 B1 | 8/2001 | Agrawal et al. |
| 6,292,019 B1 | 9/2001 | New et al. |
| 6,326,807 B1 | 12/2001 | Veenstra et al. |
| 6,346,824 B1 | 2/2002 | New |
| 6,348,813 B1 | 2/2002 | Agrawal et al. |
| 6,381,732 B1 | 4/2002 | Burnham et al. |
| 6,462,577 B1 | 10/2002 | Lee et al. |
| 6,469,540 B2 | 10/2002 | Nakaya |
| 6,480,954 B2 | 11/2002 | Trimberger et al. |
| 6,487,709 B1 | 11/2002 | Keller et al. |
| 6,490,707 B1 | 12/2002 | Baxter |
| 6,496,918 B1 | 12/2002 | DeHon et al. |
| 6,515,509 B1 | 2/2003 | Baxter |
| 6,526,559 B2 | 2/2003 | Schiefele et al. |
| 6,529,040 B1 | 3/2003 | Carberry et al. |
| 6,545,501 B1 | 4/2003 | Bailis et al. |
| 6,593,771 B2 | 7/2003 | Bailis et al. |
| 6,601,227 B1 | 7/2003 | Trimberger |
| 6,603,330 B1 | 8/2003 | Snyder |
| 6,629,308 B1 | 9/2003 | Baxter |
| 6,636,070 B1 | 10/2003 | Altaf |
| 6,642,744 B2 | 11/2003 | Or-Bach et al. |
| 6,667,635 B1 | 12/2003 | Pi et al. |
| 6,668,361 B2 | 12/2003 | Bailis et al. |
| 6,675,309 B1 | 1/2004 | Baxter |
| 6,703,861 B2 | 3/2004 | Ting |
| 6,714,041 B1 | 3/2004 | Darling et al. |
| 6,732,068 B2 | 5/2004 | Sample et al. |
| 6,806,730 B2 | 10/2004 | Bailis et al. |
| 6,809,979 B1 | 10/2004 | Tang |
| 6,829,756 B1 | 12/2004 | Trimberger |
| 6,831,479 B2 | 12/2004 | Lo |
| 6,838,902 B1 | 1/2005 | Elftmann et al. |
| 6,924,663 B2 | 8/2005 | Masui et al. |
| 6,937,535 B2 | 8/2005 | Ahn et al. |
| 6,956,399 B1 | 10/2005 | Bauer |
| 6,992,505 B1 | 1/2006 | Zhou |
| 6,998,872 B1 | 2/2006 | Chirania et al. |
| 7,028,281 B1 | 4/2006 | Agrawal et al. |
| 7,075,333 B1 | 7/2006 | Chaudhary et al. |
| 7,126,372 B2 | 10/2006 | Vadi et al. |
| 7,126,856 B2 | 10/2006 | Sun et al. |
| 7,129,746 B1 | 10/2006 | Balasubramanian et al. |
| 7,138,827 B1 | 11/2006 | Trimberger |
| 7,212,448 B1 | 5/2007 | Trimberger |
| 7,224,182 B1 * | 5/2007 | Hutchings et al. ............. 326/38 |
| 7,298,169 B2 | 11/2007 | Hutchings et al. |
| 7,307,449 B1 | 12/2007 | Redgrave et al. |
| 7,310,003 B2 | 12/2007 | Hutchings et al. |
| 2001/0007428 A1 | 7/2001 | Young et al. |
| 2002/0008541 A1 | 1/2002 | Young et al. |
| 2002/0010853 A1 | 1/2002 | Trimberger et al. |
| 2002/0113619 A1 | 8/2002 | Wong |
| 2002/0125910 A1 | 9/2002 | New et al. |
| 2002/0125914 A1 | 9/2002 | Kim |
| 2002/0161568 A1 | 10/2002 | Sample et al. |
| 2002/0163357 A1 | 11/2002 | Ting |
| 2003/0009731 A1 * | 1/2003 | Wallace ........................ 716/5 |
| 2003/0042931 A1 | 3/2003 | Ting |
| 2003/0080777 A1 | 5/2003 | Baxter |
| 2003/0110430 A1 | 6/2003 | Bailis et al. |
| 2004/0010767 A1 | 1/2004 | Agrawal et al. |
| 2004/0103265 A1 | 5/2004 | Smith |
| 2004/0196066 A1 | 10/2004 | Ting |
| 2004/0233758 A1 | 11/2004 | Kim et al. |
| 2005/0146352 A1 | 7/2005 | Madurawe |
| 2007/0241781 A1 | 10/2007 | Hutchings |
| 2007/0257702 A1 | 11/2007 | Hutchings et al. |

OTHER PUBLICATIONS

U.S. Appl. No. 11/081,883, filed Mar. 15, 2005, Hutchings.
U.S. Appl. No. 11/082,199, filed Mar. 15, 2005, Hutchings.
U.S. Appl. No. 11/081,850, filed Mar. 15, 2005, Hutchings.
U.S. Appl. No. 11/269,168, filed Nov. 7, 2005, Redgrave.
"§ Programmable Logic Devices," *Digital System Design*, 2001, pp. 3.1-3.28.
"Design for Low Power in Actel Antifuse FPGAs", Actel Application Note, 2000 Actel Corporation, Sep. 2000, pp. 1-8.
"The Effect of SRAM Table Sharing and Cluster Size on FPGA Area", pp. 1-10.
"The Xilinx Virtex Series FPGA," Jan. 22, 2001, slides 1-22.
"Unifying Sequential and Spatial Computing with a Single Instruction Set Architecture," *ISCA '04*, 2004, ACM, Munchen, Oberbayem, Germany.
Agrawal, O., et al., "An Innovative, Segmented High Performance FPGA Family with Variable-Grain-Architecture and Wide-gating Functions," *FPGA 99*, 1999, pp. 17-26, ACM, Monterey, CA, USA.
Ahmed, E., et al., "The Effect of LUT and Cluster Size on Deep-Submicron FPGA Performance and Density," *FPGA 2000*, 2000, ACM, Monterey, CA, USA.
Altera Corp., "6. DSP Blocks in Stratix II Devices," *SII52006-1.0*, Feb. 2004, pp. 1-32.
Altera, "Stratix II DSP Performance," *White Paper*, Feb. 2004, pp. 1-9, ver. 1.0, Altera Corporation, San Jose, CA.
Backus, J., "Can Programming be Liberated from the Von Neumann Style? A Functional Style and its Algebra of Programs," *Communications of the ACM*, Aug. 1978, pp. 613-641, vol. 21, No. 8, ACM.
Barker, R., "QuickSilver ACM SilverStream Design Methodology with the Inspire SDK Tool Set," *A Technology Application Whitepaper*, 2004, pp. 1-8, QuickSilver Technology, Inc., San Jose, California.

Brand, D., et al., "Minimization of AND-EXOR Expressions Using Rewrite Rules," *IEEE Transactions on Computers*, May 1993, pp. 568-576, IEEE.

Butts, M., "Future Directions of Dynamically Reprogrammable Systems," *IEEE 1995 Custom Integrated Circuits Conference*, 1995, pp. 487-494, IEEE.

Camposano, R., "The Growing Semiconductor Zoo: ASICs, CSSP, ASSP, ASIP, Structured Arrays, FPGAs, Processor Arrays, Platform... and Other Animalia," 2003, pp. 1-74, Synopsys, Inc.

Caspi, E., et al., "A Streaming Multi-Threaded Model," *MSP-3*, Dec. 2, 2001, pp. 1-23.

Caspi, E. et al., "Stream Computations Organized for Reconfigurable Executiion (SCORE): Introduction and Tutorial," Aug. 25, 2000, pp. 1-31, Version 1.0.

Ciemat, J.V., et al., "Annealing Placement by Thermodynamic Combinatorial Optimization," *ACM Transactions on Design Automation of Electronic Systems*, Jul. 2004, pp. 310-332, vol. 9, No. 3 ACM, New York, NY.

Compton, K., et al., "An Introduction to Reconfigurable Computing,".

Compton, K., et al., "Reconfigurable Computing: A Survey of Systems and Software," *ACM Computing Surveys*, Jun. 2002, pp. 171-210, vol. 34, No. 2, ACM, New York, NY.

Cong, J., et al., "A Theory on Partially-Dependent Functional Decomposition with Application in LUT-based FPGA," pp. 1-22.

Cong, J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.

Coudert, O., "Chapter 13: Doing Two-Level Logic Minimization 100 Times Faster," pp. 112-121.

Damiani, M., et al., "The Disjunctive Decomposition of Logic Functions," pp. 1-5.

Davare, A., et al., "The Best of Both Worlds: The Efficient Asynchronous Implementation of Synchronous Specifications," *DAC '04*, Jun. 7-11, 2004, ACM, San Diego, California, USA.

Dehon, A., Balancing Interconnect and Computation in a Reconfigurable Computing Array (or, why don't you really want 100% LUT utilizaiton). Pages 1-10. (Applicants believe that this article also appears in *Proceedings of the International Symposium on Field Programmable Gate Arrays*, Feb. 1999, pp. 125-134.).

Dehon, A., "DPGA Utilization and Application.".

Dehon, A., "Dynamically Programmable Gate Arrays: A Step Toward Increased Computational Density," *Proceedings of the Fourth Canadian Workshop on Field-Programmable Devices*, May 1996, pp. 47-54.

Dehon, A., "Reconfigurable Architectures for General-Purpose Computing," *A.I. Technical Report No. 1586*, Oct. 1996, pp. 1-353.

Dehon, A., "The Density Advantage of Configurable Computing," Apr. 2000, pp. 41-49, IEEE.

Dehon, A., "Transit Note #121: Notes on Programmable Interconnect," *M.I.T. Transit Project*, Feb. 1995, pp. 1-13.

Dehon. A., et al., "Design Patterns for Reconfigurable Computing," *Proceedings of the IEEE Symposium on Field-Programmable Custom Computing Machines*, Apr. 2004.

Dehon, A., et al., "DPGA-Coupled Microprocessors: Commodity ICs for the Early 21st Century," *FCCM '94-IEEE Workshop on FPGAs for Custom Computing Machines*, Apr. 10-13.

Dehon, A., et al., "Reconfigurable Computing: What, Why, and Implications for Design Automation," *DAC 99, New Orleans, Louisiana*, 1999, ACM.

Enzler, R., et al., "Virtualizing Hardware with Multi-Context Reconfigurable Arrays," pp. 151-160.

Gayasen, A., et al., "Reducing Leakage Energy in FPGAs Using Region-Constrained Placement," *FPGA '04*, Feb. 22-24, 2004, pp. 51-58, ACM, Monterey, California, USA.

George, V., "Low Energy Field-Programmable Gate Array," *A Dissertation Submitted in Partial Satisfaction of the Requirements for the Degree of Doctor of Philosophy in Engineering-Electrical Engineering and Computer Sciences in the Graduate Division of the University of California, Berkeley*, Fall 2000, pp. 1-190.

Giraud-Carrier, c., "A Reconfigurable Data Flow Machine for Implementing Functional Programming Languages.".

Goldstein, S.C. et al., "PipeRench: A Coprocessor for Streaming Multimedia Acceleration.".

Goldstein, S.C., et al., "PipeRench: A Reconfigurable Architecture and Compiler," 2000, pp. 70-77, IEEE.

Hauck, S., et al., "Montage: An FPGA for Synchronous and Asynchronous Circuits," pp. 1-4. (Applicants believe that this article also appears in *Field-Programmable Gate Arrays: Architectures and Tools for Rapid Prototyping*, 1993, pp. 44-51, Springer-Verlag, Berlin.).

Hauck, S., et al., "Totem: Domain-Specific Reconfigurable Logic," pp. 1-25.

Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, California.

Hofstee, H.P., "Cell Broadband Engine Architecture from 20,000 Feet," Aug. 24, 2005, pp. 1-6.

Huang, A.S., "Tao: An Architecturally Balanced Reconfigurable Hardware Processor," *Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.

IBM, "Cell Broadband Engine Architecture, Version 1.0" Aug. 8, 2005, pp. 1-319, USA.

IBM, "SPU Application Binary Interface Specification, Version 1.3," *CBEA JSRE Series*, Aug, 1, 2005, pp. iv-26, USA.

IBM, "SPU Assembly Language Specification, Version 1.2," *CBEA JSRE Series*, Aug. 1, 2005, pp. iii-22, USA.

IBM, "SPU C/C++ Language Extensions, Version 2.0" *CBEA JSRE Series*, Aug. 1, 2005, pp. iv-84, USA.

IBM, "Synergistic Processor Unit Instruction Set Architecture, Version 1.0," Aug. 1, 2005, pp. 1-257, USA.

Kaviani, A., et al., "Computational Field Programmable Architecture.".

Kaviani, A., et al., "Hybrid FPGA Architecture," Department of Electrical and Computer Engineering, University of Toronto, Canada.

Keutzer, K., "Overview of *configurable* architectures," slides 1-29.

Kocan, F., et al., "Logic Modules with Shared SRAM Tables for Field-Programmable Gate Arrays," *FPL 2004*, 2004, pp. 289-300, Springer-Verlag, Berlin Heidelberg.

Kravets, V.N, et al., "Generalized Symmetries in Boolean Functions".

Lehn, D.I., et al., "Evaluation of Rapid Context Switching on a CSRC Device,".

Lemieux, G., et al., "Generating Highly-Routable Sparse Crossbars for PLDs," *FPGA 2000*, 2000, ACM, Monterey, California, USA.

Lemieux, G., et al., "Using Sparse Crossbars within LUT Clusters," *FPGA 2001*, Feb. 11-13, 2001, ACM, Monterey, CA.

Lertora, F., et al., "Handling Different Computational Granularity by a Reconfigurable IC Featuring Embedded FPGAs and a Network-On-Chip,".

Lewis, D., et al., "The Stratix-II Routing and Logic Architecture," pp. 1-22.

Ling, A., "The Search for the Optimal FPGA Logic Block," 2001, ACM.

M2000, "FlexEOS Embedded FPGA Cores," 2003, M2000.

Markovskiy, Y., et al., "Analysis of Quasi-Static Scheduling Techniques in a Virtualized Reconfigurable Machine," *FPGA '02*, Feb. 24-26, 2002, ACM, Monterey, California, USA.

Master, P., "The Next Big Leap in Reconfigurable Systems," *A Technology Vision Whitepaper*, Apr. 28, 2004 but © 2003, pp. 1-8, QuickSilver Technology, Inc., San Jose, California.

MathStar, Inc., "MathStar FPOA Architecture: A New Approach to High Throughput, Scalable, and Reprogrammable Design," *Technology Overview*, 2003, MathStar, Inc..

Mirsky, E., et al., "Matrix: A Reconfigurable Computing Architecture with Configurable Instruction Distribution and Deployable Resouces," *Proceedings of the IEEE Workshop on FPGAs for Custom Computing Machines*, Apr. 1996.

Mirsky, E., et al., "Matrix: A Reconfigurable Computing Device with Configurable Instruction Distribution and Deployable Resources," *Hot Chips Symposium 1997*, 1997.

Mishchenko, A., "Fast Computation of Symmetries in Boolean Functions".

Mishchenko, A., et al., "A New Enhanced Constructive Decomposition and Mapping Algorithm," DAC 2003, Jun. 2-6, 2003, pp. 143-148, ACM, Anaheim, California, USA.

Morris, K., "Lattice Launches XP: Non-Volatility at the Forefront of FPGA,"*FPGA and Programmable Logic Journal*, 2005, pp. 1-5, Techfocus Media, Inc.

Morris, K., "Rationalizing Reconfigurability: The Importance of Being Programmable," *FPGA and Structured ASIC Journal*, Sep. 27, 2005.

Nelson, B.E., "Reconfigurable Computing: An Introduction and Overview," Sep. 23, 1998, pp. 1-43.

Niedzielski, D., "An Overview of Reconfigurable Computing,".

Ochotta, E.S., et al., "A Novel Predictable Segmented FPGA Routing Architecture," *FPGA 98*, 1998, pp. 3-11, ACM, Monterey, CA, USA.

Ohkura, J., et al., "Dataflow in the Adaptive Computing Machine (ACM)," *A Technology Application Whitepaper*, Apr. 28, 2004 but ©2003, pp. 1-9, QuickSilver Technology, Inc., San Jose, California.

Parhami, B., "Part IV: Low-Diameter Architectures," *ECE 254B: Advanced Computer Architecture: Parallel Processing, UCSB*, Spring 2005, slides 1-93, Behrooz Parhami, Santa Barbara, Ca.

Pedram, M., "IEEE Circuits and Systems Society Distinguished Lecturer Program.".

Perissakis, S., et al., "Embedded DRAM for a Reconfigurable Array,".

Perissakis, S., et al., "Embedded DRAM for a Reconfigurable Array," *Proceedings of the 1999 Symposium on VLSI Circuits*, Jun. 1999.

Perkowski, M.A., "A New Representation of Strongly Unspecified Switching Functions and its Application to Multi-Level AND/OR/EXOR Synthesis.".

Plunkett, B., "In Search of the SDR Holy Grail," *A Technology Application Whitepaper*, Apr. 28, 2004 but ©2003, pp. 1-7, QuickSilver Technology, Inc., San Jose, California.

Plunkett, B., et al., "Adapt2400 ACM Architecture Overview," *A Technology Whitepaper*, 2004, pp. 1-9, QuickSilver Technology, Inc.

QuickLogic Corp., "Ultra-Low Power FPGA Combining Performance, Density, and Embedded RAM," *Eclipse II Family Data Sheet*, 2005, pp. 1-92, QuickLogic Corporation, US.

QuickSilver Technology, Inc., "Adapt2000 ACM System Platform," Apr. 2004, pp. 1-39, QuickSilver Technology, Inc., San Jose, California.

QuickSilver Technology, Inc., "InSpire SDK Tool Set," *Prodcut Brief*, 2004, QuickSilver Technology, Inc., San Jose, California.

QuickSilver Technology, Inc., "QS2412 Adaptive Computing Machine," *Product Brief*, 2004, QuickSilver Technology, Inc., San Jose, California.

Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.

Rose, J., "Hard vs. Soft: The Central Question of Pre-Fabricated Silicon," pp. 1-4.

Sambhwani, S., et al., "Implementing W-CDMA Transceiver Structure on an Adaptive Computing Platform," *A Technology Application Whitepaper*, Apr. 28, 2004 but ©2003, pp. 1-12, QuickSilver Technology, Inc., San Jose, California.

Scalera, S.M., et al., "A Mathematical Benefit Analysis of Context Switching Reconfigurable Computing.".

Schaumont, P., et al., "A Quick Safari Through the Reconfiguration Jungle,".

Schmit, H., "Extra-Dimensional Island-Style FPGAs," 2003.

Schmit, H., "Extra-dimensional Island-Style FPGAs," pp. 1-10.

Schmit, H., "Incremental Reconfiguration for Pipelined Applications.".

Schmit, H., et al., "FPGA Switch Block Layout and Evaluaiton," *FPGA '02*, Feb. 24-26, 2002, ACM, Monterey, California, USA.

Schmit, H., et al., "PipeRench: A Virtualized Programmable Datapatih in 0.18 Micron Technology,".

Schmit, H., et al., "Queue Machines: Hardware Compilation in Hardware.".

Scholl, C., "Multi-output Functional Decomposition with Exploitation of Don't Cares," May 19-21 1997.

Sharma, A., et al., "Accelerating FPGA Routing Using Architecture-Adaptive A* Techniques".

Singh, A., et al., "Interconnect Pipelining in a Throughput-Intensive FPGA Architecture," *FPGA 2001*, Feb. 11-13, 2001, pp. 153-160, ACM, Monterey, CA, USA Singh, A., et al., "Pitia: An FPGA for Throughput-Intensive Applications," *IEEE Transactions on Very Large Scale Integration (VLSI) Systems*, Jun. 2003, pp. 354-363, vol. 11, No. 3, IEEE.

Slade, A.L. et al, "Reconfigurable Computing Application Frameworks,".

Snider, G., "Performance-Constrained Pipelining of Software Loops onto Reconfigurable Hardware," *FPGA '02*, Feb. 24-26. 2002, pp. 177-186, ACM, Monterey, California, USA.

Stankovic, R.S., et al., "Remarks on the Number of Logic Networks with Same Complexity Derived from Spectral Transform Decision Diagrams," pp. 1-8.

Tau, E., et al., "A First Generation DPGA Implementation," *Proceedings of the Third Canadian Workshop on Field-Programmable Devices*, May 1995, pp. 138-143.

Tau, E., et al., "Transit Note #114: A First Generation DPGA Implementation," *M.I.T. Transit Project*, Jan. 1995, pp. 1-8.

Teifel, J., et al., "Highly Pipelined Asynchronous FPGAs" *FPGA '04*, ACM, Monterey, California, USA.

Tessier, R., et al., "Balancing Logic Utilization and Area Efficiency in FPGAs,".

Tom, M., et al., "Clustering of Large Designs for Channel-Width Constrained FPGAs," Univsersity of British Columbia, Department of Electrical and Computer Engineering, slides 1-39, Vancouver, BC, Canada.

Tom, M., et al., "Logic Block Clustering of Large Designs for Channel-Width Constrained FPGAs," DAC 2005, Jun. 13-17, 2005, pp. 726-731, ACM, Anaheim, California, USA.

Trimberger, S., "Effects of FPGA Architecture on FPGA Routing,"[32nd] *ACM/IEEE Design Automation Conference*, 1995, ACM.

Tsu, W., et al., "HSRA: High-Speed, Hierarchical Synchronous Reconfigurable Array," pp. 1-10. (Applicants believe that this also appears in *Proceedings of the International Symposium on Field Programmable Gate Arrays*, Feb. 1999, pp. 69-78).

Wawrzynek, J., "EECS150-Digital Design: Lecture 5—Field Programmable Gate Arrays (FPGAs)," Feb. 4, 2002, pp. 1-4, slides 1-20, multiple slides per page.

Weaver, N., et al., "The SFRA: A Corner-Turn FPGA Architecture," *FPGA '04*, Feb. 22-24, 2004, ACM, Monterey, California, USA.

Wegener, I., "The Complexity of Boolean Functions," Wiley-Teubner Series in Computer Science, 1987, John Wiley & Sons Ltd. and B.G. Teubner, Stuttgart, New York.

Wilton, S.J.E., "Memory-to-Memory Connection Structures in FPGAs with Embedded Memory Arrays," *FPGA 97*, 1997, pp. 10-16, ACM, Monterey, California, USA.

XILINX, Inc., "Virtex-4 Family Overview," *Advance Product Specification*, Sep. 10, 2004, pp. 21-30, v1.1, Xilinx, Inc.

Zilic, Z. et al., "Using BDDs to Design ULMs for FPGAs," pp. 1-10.

Zuchowski, P.S., "A Hybrid ASIC and FPGA Architecture," 2002, IEEE.

U.S. Appl. No. 11/926,100, filed Oct. 28, 2007, Hutchings et al.
U.S. Appl. No. 11/933,311, filed Oct. 31, 2007, Redgrave et al.
U.S. Appl. No. 11/942,691, filed Nov. 19, 2007, Hutchings, et al.
U.S. Appl. No. 12/058,662, filed Mar. 28, 2008, Caldwell, et al.
U.S. Appl. No. 11/269,168, filed Aug. 2, 2007, Redgrave, et al.
U.S. Appl. No. 11/269,168, filed Mar. 30, 2007, Redgrave, et al.
U.S. Appl. No. 11/081,850, filed Sep. 10, 2007, Hutchings.
U.S. Appl. No. 11/082,199, filed Jul. 31, 2007, Hutchings, et al.
U.S. Appl. No. 11/082,199, filed Mar. 21, 2007, Hutchings, et al.
U.S. Appl. No. 11/081,883, filed Jul. 9, 2007, Hutchings, et al.
U.S. Appl. No. 11/081,883, filed Mar. 13, 2007, Hutchings, et al.
U.S. Appl. No. 11/739,095, filed Oct. 19, 2007, Hutchings, et al.
U.S. Appl. No. 11/082,221, filed Jan. 16, 2007, Hutchings, et al.

"§Programmable Logic Devices," *Digital System Design*, 2001 Month N/A, pp. 3.1-3.28.

"Unifying Sequential and Spatial Computing with a Single Instruction Set Architecture," *ISCA '04*, Jun. 19-23, 2004, ACM, Munchen, Oberbayern, Germany.

Agrawal, O., et al., "An Innovative, Segmented High Performance FPGA Family with Variable-Grain-Architecture and Wide-gating Functions," *FPGA 99*, Feb. 1999, pp. 17-26, ACM, Monterey, California, USA.

Ahmed, E., et al., "The Effect of LUT and Cluster Size on Deep-Submicron FPGA Performance and Density," *FPGA 2000*, Feb. 2000, ACM, Monterey, California, USA.

Barker, R., "QuickSilver ACM SilverStream Design Methodology with the Inspire SDK Tool Set," *A Technology Application Whitepaper*, Jan. 26, 2004, pp. 1-8, QuickSilver Technology, Inc., San Jose, California, USA.

Butts, M., "Future Directions of Dynamically Reprogrammable Systems," *IEEE 1995 Custom Integrated Circuits Conference*, May 1995, pp. 487-494, IEEE.

Camposano, R., "The Growing Semiconductor Zoo: ASICs, CSSP, ASSP, ASIP, Structured Arrays, FPGAs, Processor Arrays, Platforms . . . and Other Animalia," Aug. 29, 2003, pp. 1-74, Synopsys, Inc.

Compton, K., et a., "An Introduction to Reconfigurable Computing," *IEEE Computer*, Apr. 2000.

Cong, J., et al., "A Theory on Partially-Dependent Functional Decomposition with Application in LUT—based FPGA," 1995 Month N/A, pp. 1-22.

Coudert, O., "Chapter 13: Doing Two-Level Logic Minimization 100 Times Faster," *Proceedings of the 6th Annual ACM-SIAM Symposium on Discrete Algorithms*, Jan. 1995, pp. 112-121.

Damiani, M., et al., "The Disjunctive Decomposition of Logic Functions," *Proceedings of the 1997 IEEE/ACM International Conference on Computer-Aided Design*, Nov. 1997, pp. 78-82, San Jose, California, USA.

Dehon, A., "Balancing Interconnect and Computation in a Reconfigurable Computing Array (or, why don't you really want 100% LUT utilization)," *Proceedings of the International Symposium on Field Programmable Gate Arrays*, Feb. 1999, pp. 125-134.

Dehon, A., "DPGA Utilization and Application," *Proceedings of the 1996 ACM Fourth International Symposium on Field-Programmable Gate Arrays FPGA*, Feb. 11-13, 1996, Monterey, California, USA.

Dehon, A., et al., "DPGA-Coupled Microprocessors: Commodity ICs for the Early 21st Century," *FCCM '94-IEEE Workshop on FPGAs for Custom Computing Machines*, Apr. 1994, Napa Valley, California, USA.

Dehon, A., et al., "Reconfigurable Computing: What, Why, and Implications for Design Automation," *DAC 1999*, Jun. 1999, ACM, New Orleans, Louisiana.

Enzler, R., et al., "Virtualizing Hardware with Multi-Context Reconfigurable Arrays," *Lecture Notes in Computer Science*, Sep. 2003, pp. 151-160.

George, V., "Low Energy Field-Programmable Gate Array," *A Dissertation Submitted in Partial Satisfaction of the Requirements for the Degree of Doctor of Philosophy in Engineering-Electrical Engineering and Computer Sciences in the Graduate Division of the University of California, Berkeley*, Fall 2000 Month N/A, pp. 1-190.

Giraud-Carrier, C., "A Reconfigurable Data Flow Machine for Implementing Functional Programming Languages," *SIGPLAN Notices*, Sep. 1994, volume 29 (9): 22-28.

Goldstein, S.C. et al. "PipeRench: A Coprocessor for Streaming Multimedia Acceleration," *International Symposium on Computer Architecture (ISCA)*, May 1999, pp. 28-39.

Goldstein, S.C., et al., "PipeRench: A Reconfigurable Architecture and Compiler," Apr. 2000, pp. 70-77, IEEE.

Hauck, S., et al., "Montage: An FPGA for Synchronous and Asynchronous Circuits," *Field-Programmable Gate Arrays: Architectures and Tools for Rapid Prototyping*, 1993 Month N/A, Springer-Verlag, Berlin.

Hauck, S., et al., "Totem: Domain-Specific Reconfigurable Logic," *IEEE Transactions on VLSI Systems*, 2006 Month N/A, pp. 1-25.

Kaviani, A., et al., "Hybrid FPGA Architecture," *Proceedings of the 1996 ACM Fourth International Symposium on Field-Programmable Gate Arrays*, February 11-13, 1996, pp. 3-9, Monterey, California, USA.

Keutzer, K., "Overview of *configurable* architectures," Feb. 28, 2002, slides 1-29.

Kocan, F., et al., "Logic Modules with Shared SRAM Tables for Field-Programmable Gate Arrays," *FPL 2004*, Aug/Sep. 2004, pp. 289-300, Springer-Verlag, Berlin Heidelberg.

Kravets, V.N, et al., "Generalized Symmetries in Boolean Functions," *Proceedings of the 2000 IEEE/ACM International Conference on Computer-Aided Design*, Nov. 2000, San Jose, California, USA.

Lehn, D.I., et al., "Evaluation of Rapid Context Switching on a CSRC Device," *Proceedings of the International Conference on Engineering of Reconfigurable Systems and Algorithms*, Jun. 24-27, 2002.

Lemieux, G., et al., "Generating Highly-Routable Sparse Crossbars for PLDs," *FPGA 2000*, Feb. 2000, ACM, Monterey, California, USA.

Lewis, D. et al., "The Stratix-II Routing and Logic Architecture," *Proceedings of the 2005 ACM/SIGDA 13th International Symposium on Field-Programmable Gate Arrays*, Feb. 20-22, 2005, pp. 1-22, Monterey, California, USA.

Ling, A., "The Search for the Optimal FPGA Logic Block," 2001 Month N/A, ACM.

M2000, "FlexEOS Embedded FPGA Cores," 2003 Month N/A, M2000.

MathStar, Inc., "MathStar FPOA Architecture: A New Approach to High Throughput, Scalable, and Reprogrammable Design," *Technology Overview*, 2003 Month N/A, MathStar, Inc..

Mirsky, E., et al., "Matrix: A Reconfigurable Computing Device with Configurable Instruction Distribution (Extended Abstract)," *Hot Chips Symposium 1997*, Aug. 1997.

Mishchenko, A., "Fast Computation of Symmetries in Boolean Functions," *Computer-Aided Design of Integrated Circuits and Systems*, Nov. 2003.

Perkowski, M.A., "A New Representation of Strongly Unspecified Switching Functions and its Application to Multi-Level AND/OR/EXOR Synthesis," *Proceedings of the 2nd Workshop on Applications of Reed-Muller Expansion in Circuit Design*, Aug. 27-29, 1995, pp. 143-151, Chiba City, Japan.

Plunkett, B., et al., "Adapt2400 ACM Architecture Overview," *A Technology Whitepaper*, 2004 Month N/A, pp. 1-9, QuickSilver Technology, Inc.

QuickLogic Corp., "Ultra-Low Power FPGA Combining Performance, Density, and Embedded RAM," *Eclipse II Family Data Sheet*, Nov. 2005, pp. 1-92, QuickLogic Corporation, USA.

QuickSilver Technology, Inc., "InSpire SDK Tool Set," *Product Brief*, 2004 Month N/A, QuickSilver Technology, Inc., San Jose, California, USA.

QuickSilver Technology, Inc., "QS2412 Adaptive Computing Machine," *Product Brief*, 2004 Month N/A, QuickSilver Technology, Inc., San Jose, California, USA.

Rose, J., "Hard vs. Soft: The Central Question of Pre-Fabricated Silicon," 34th *International Symposium on Multiple-Valued Logic (ISMVL '04)*, May 2004, pp. 2-5.

Scalera, S.M., et al., "A Mathematical Benefit Analysis of Context Switching Reconfigurable Computing," *Proceedings of the 5th Reconfigurable Architectures Workshop (RAW)*, Mar. 30, 1998, vol. 1388 of *Lecture Notes in Computer Science*, pp. 73-78.

Schaumont,P., et al., "A Quick Safari Through the Reconfiguration Jungle," 38th *Design Automation Conference*, Jun. 2001, pp. 172-177, Las Vegas, Nevada, USA.

Schmit, H., "Extra-Dimensional Island-Style FPGAs," *Field Programmable Logic and Application (FPL 2003)*, Sep. 2003, pp. 406-415.

Schmit, H., "Incremental Reconfiguration for Pipelined Applications," *Proceedings of the 5h IEEE Symposium on FPGA-Based Custom Computing Machines*, Apr. 16-18, 1997.

Schmit, H., et al., "PipeRench: A Virtualized Programmable Datapath in 0.18 Micron Technology," *Proceedings of the IEEE 2002 Custom Integrated Circuits Conference*, May 12-15, 2002, pp. 63-66.

Schmit, H., et al., "Queue Machines: Hardware Compilation in Hardware," *Proceedings of the 10th Annual IEEE Symposium on Field-Programmable Custom Computing Machines*, Apr. 22-24, 2002..

Sharma, A., et al., "Accelerating FPGA Routing Using Architecture-Adaptive A* Techniques," *Proceedings of the IEEE Conference on Field-Programmable Technology 2005*, Dec. 11-14 2005.

Slade, A.L. et al., "Reconfigurable Computing Application Frameworks," *11th Annual IEEE Symposium on Field-Programmable Custom Computer Machines*, Apr. 9-11, 2003.

Stankovic, R.S., et al., "Remarks on the Number of Logic Networks with Same Complexity Derived from Spectral Transform Decision Diagrams," *Proceedings Int. TICS Workshop on Spectral Methods and Multi-rate Signal Processing, SMMSP '02*, Sep. 7-8, 2002, pp. 163-170, Toulouse, France.

Teifel, J., et al., "Highly Pipelined Asynchronous FPGAs" *Proceedings of the 2004 ACM/SIGDA 12th International Symposium on Field Programmable Gate Arrays*, Feb. 22-24, 2004, ACM, Monterey, California, USA.

Tessier, R., et al., "Balancing Logic Utilization and Area Efficiency in FPGAs," *Proceedings of the Roadmap to Reconfigurable Computing, 10th International Workshop on Field Programmable Logic and Applications*, Aug. 27-30, 2000, pp. 535-544.

Tom, M., et al., "Clustering of Large Designs for Channel-Width Constrained FPGAs," *University of British Columbia, Department of Electrical and Computer Engineering*, Jun. 2005, slides 1-39, Vancouver, BC, Canada.

Trimberger, S., "Effects of FPGA Architecture on FPGA Routing," *32nd ACM/IEEE Design Automation Conference*, Jun. 1995, ACM.

Tsu, W., et al., "HSRA: High-Speed, Hierarchical Synchronous Reconfigurable Array," *Proceedings of the International Symposium on Field Programmable Gate Arrays*, Feb. 1999, pp. 96-78.

Wegener, I., "The Complexity of Boolean Functions," *Wiley-Teubner Series in Computer Science*, 1987 Month N/A, John Wiley & Sons Ltd. and B.G. Teubner, Stuttgart, New York, USA.

Wilton, S.J.E., "Memory-to-Memory Connection Structures in FPGAs with Embedded Memory Arrays," *FPGA 97*, Feb. 1997, pp. 10-16, ACM, Monterey, California, USA.

Zilic, A. et al., "Using BDDs to Design ULMs for FPGAs," *Proceedings of the 1996 ACM Fourth International Symposium on Field-Programmable Gate Arrays (FPGA '96)*, Feb. 11-13, 1996, pp. 1-10, Monterey, California, USA.

U.S. Appl. No. 11/081,883, filed Mar. 15, 2005, Hutchings, et al.

U.S. Appl. No. 11/082,199, filed Mar. 15, 2005, Hutchings, et al.

* cited by examiner

METHOD AND APPARATUS FOR DECOMPOSING FUNCTIONS IN A CONFIGURABLE IC

CLAIM OF BENEFIT

This application is a continuation-in-part of U.S. patent application Ser. No. 11/081,883, filed Mar. 15, 2005, now U.S. Pat. No. 7,298,169.

CROSS REFERENCE TO RELATED APPLICATIONS

This Application is related to the following applications: U.S. patent application Ser. No. 11/082,221, filed Mar. 15, 2005, now issued as U.S. Pat. No. 7,224,182; U.S. patent application Ser. No. 11/739,095, filed Apr. 23, 2007; U.S. patent application Ser. No. 11/081,883, filed Mar. 15, 2005, now issued as U.S. Pat. No. 7,298,169; patent application Ser. No. 11/926,100, filed Oct. 28, 2007; U.S. patent application Ser. No. 11/082,199, filed Mar. 15, 2005, now issued as U.S. Pat. No. 7,310,003; U.S. patent application Ser. No. 11/942,691, filed Nov. 19, 2007; U.S. patent application Ser. No. 11/081,850, filed Mar. 15, 2005; U.S. patent application Ser. No. 11/269,168, filed Nov. 07, 2005, now issued as U.S. Pat. No. 7,307,449; and U.S. patent application Ser. No. 11/933,311, filed Oct. 31, 2007.

FIELD OF THE INVENTION

The present invention is directed towards method and apparatus for decomposing functions in a configurable IC.

BACKGROUND OF THE INVENTION

The use of configurable integrated circuits ("IC's") has dramatically increased in recent years. One example of a configurable IC is a field programmable gate array ("FPGA"). An FPGA is a field programmable IC that has an internal array of logic circuits (also called logic blocks). These logic circuits are connected together through numerous interconnect circuits (also called interconnects). The logic and interconnect circuits are surrounded by input/output blocks.

Like some other configurable IC's, the logic circuits and interconnect circuits of an FPGA are configurable. A configurable logic circuit can be configured to perform a number of different functions. Such a logic circuit typically receives input and configuration data. From the set of functions that the logic circuit can perform, the configuration data specifies a particular function that the logic circuit has to perform on the input data. A configurable interconnect circuit connects a set of input data to a set of output data. Such a circuit receives configuration data that specify how the interconnect circuit should connect its input data to its output data.

FPGA's have become popular as their configurable logic and interconnect circuits allow the FPGA's to be adaptively configured by system manufacturers for their particular applications. However, existing FPGA's as well as other existing configurable IC's do not provide robust multiplexer functionality. Specifically, the select lines of multiplexers in existing IC's are typically tied to memory cells that store configuration data. Hence, these multiplexers cannot be controlled by signals internally computed by the logic circuits of the IC's. This, in turn, limits the use of multiplexers in configurable IC's to applications that do not need to make the multiplexing choices based on internally computed IC signals.

Therefore, there is a need in the art for configurable IC's that use novel multiplexer circuits that can be controlled by signals internally computed by the IC's. There is also a need in the art for configurable IC's that have novel architectures that use such multiplexer circuits. There is further a need for configurable IC's that have devices that can take advantage of such novel multiplexer circuits.

SUMMARY OF THE INVENTION

Some embodiments of the invention provide a configurable integrated circuit ("IC"). The configurable IC includes a set of multiplexers that each has a set of input terminals, a set of output terminals, and a set of select terminals. The set of multiplexers includes a group of multiplexers, where at least one input terminal of each multiplexer in the group is a permanently inverting input terminal. During at least a set of cycles during the operation of the configurable IC, several multiplexers in the group of multiplexers are used to implement a particular function.

To implement the particular function, one of the multiplexers in the group of multiplexers performs an XOR function or its NPN equivalent in some cases, where NPN equivalent of an XOR function is the XOR function if one or more of its inputs are permuted or negated or its output is negated.

In some embodiments, the set of multiplexers in some embodiments further includes a second group of multiplexers that are used during the set of cycles to implement the particular function. The multiplexers in the second group either (i) do not have any permanently inverting input terminals or (ii) have permanently inverting input terminals but do not use the permanently inverting input terminals when implementing the particular function during the set of cycles.

The configurable IC of some embodiments includes (1) a configurable logic circuit for configurably performing a set of functions on a set of n inputs, and (2) a set of input select interconnect circuits for selecting the inputs of the configurable logic circuit. During certain operation cycles of the configurable IC, the configurable logic circuit and a group of the input select interconnect circuits from the set of input select interconnect circuits perform a particular m-input function, wherein m is a number greater than n. In some cases, a synthesis tool defines the operation of the configurable logic circuit and the group of input select interconnect circuits so that these circuits decompose the m-input function into a set of function each with less than m inputs.

In some embodiments, the group of input select interconnect circuits that perform the m-input function are hybrid interconnect/logic circuits each with a set of input terminals, a set of output terminals, and a set of select terminals. A hybrid interconnect/logic circuit operates as an interconnect circuit when it receives only configuration data at its select lines and operates as a logic circuit when it receives at least one user design signal at one of its select lines. In some embodiments, at least one hybrid interconnect/logic circuit in the group has a permanently inverting input.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

I. Terms and Concepts

A configurable IC is an IC that has configurable circuits. In some embodiments, a configurable IC includes configurable computational units (e.g., configurable logic circuits) and configurable routing circuits for routing the signals to and from the configurable computation units. In addition to configurable circuits, a configurable IC also typically includes non-configurable circuits (e.g., non-configurable logic circuits, interconnect circuits, memories, etc.).

A configurable circuit is a circuit that can "configurably" perform a set of operations. Specifically, a configurable circuit receives "configuration data" that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data that can configure the configurable IC (or more accurately, the configurable IC's configurable circuits) to implement the IC design.

Figure 1:
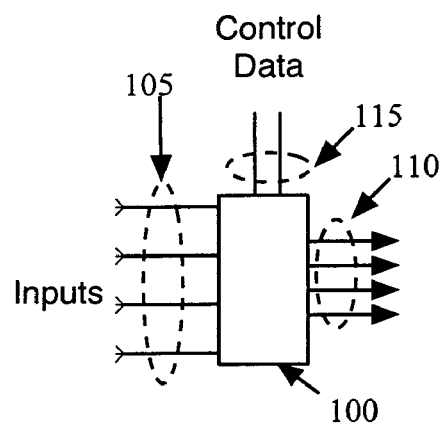
FIG. 1 illustrates a block diagram of an interconnect circuit.

Examples of configurable circuits include configurable interconnect circuits and configurable logic circuits. An interconnect circuit is a circuit that can connect an input set to an output set in a variety of manners. FIG. 1 presents a block diagram of a controllable interconnect circuit. This circuit 100 has a set of input terminals 105, a set of output terminals 110, and a set of control terminals 115. The interconnect circuit 100 receives control data along its control terminals 115 that causes the interconnect circuit to connect its input terminal set 105 to its output terminal set 110 in a particular manner.

An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in some or all of their interconnect circuits.

Figure 2:
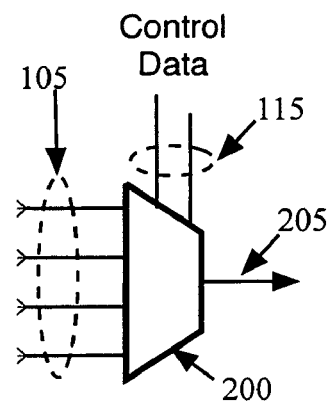
FIG. 2 illustrates an example of a multiplexer.

A multiplexer is one example of an interconnect circuit. A multiplexer is a device that has k inputs, n outputs, and s select lines. The select lines typically direct the multiplexer to output n of its k inputs along its n outputs. FIG. 2 illustrates an example of a multiplexer. This example is a four-to-one multiplexer 200 that connects one of its four input lines 105 to its output line 205 based on the control signals 115 that it receives along its two select lines.

A configurable interconnect circuit is an interconnect circuit that can configurably perform a set of connection operations. In some embodiments, a configurable interconnect circuit only receives configuration data along its set of control lines. Also, in some embodiments, all of the configurable interconnect circuit's control lines are permanently tied to configuration data. Specifically, in these embodiments, the configurable interconnect circuit's control lines receive configuration data either directly from the storage elements that store the configuration data, or through an indirect connection to these storage elements via one or more interconnect circuits that do not receive configuration data along their control terminals.

Figure 3:
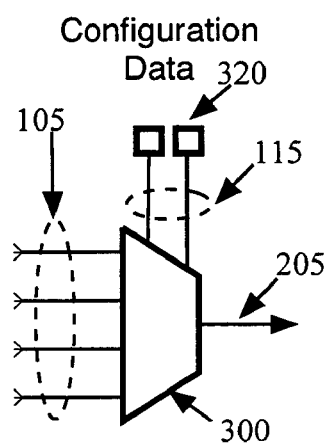
FIG. 3 illustrates an example of a configurable four-to-one multiplexer that receives configuration data from a set of storage elements.

FIG. 3 illustrates an example of a configurable four-to-one multiplexer 300 that receives configuration data from a set of storage elements 320 (e.g., a set of memory cells, such as SRAM cells). This multiplexer 300 connects one of its four input terminals 105 to its output terminal 205 based on the configuration data 115 that is output from the storage elements 320. In other words, the configuration data specify how the interconnect circuit 300 should connect the input terminal set 105 to the output terminal 205.

The multiplexer 300 is said to be configurable, as the configuration data set "configures" this multiplexer to use a particular connection scheme that connects its input and output terminal sets in a desired manner. Examples of configurable interconnect circuits can be found in Architecture and CAD for Deep-Submicron FPGAs, Betz, et al., ISBN 0792384601, 1999; and Design of Interconnection Networks for Programmable Logic, Lemieux, et al., ISBN 1-4020-7700-9, 2003. Other examples of configurable interconnect circuits can be found in U.S. patent application Ser. No. 10/882,583, entitled "Configurable Circuits, IC's, and Systems," filed on Jun. 30, 2004. This application is incorporated in the present application by reference.

A logic circuit is a circuit that can perform a function on a set of input data that it receives. A configurable logic circuit is a logic circuit that can configurably perform a set of functions. In some embodiments, a configurable logic circuit only receives configuration data along its set of control lines. In some embodiments, all of the configurable logic circuit's control lines are permanently tied to configuration data. Specifically, in these embodiments, the configurable logic circuit's control lines receive configuration data either directly from the storage elements that store the configuration data, or through an indirect connection to these storage elements via one or more interconnect circuits that do not receive configuration data along their control lines.

Figure 4:
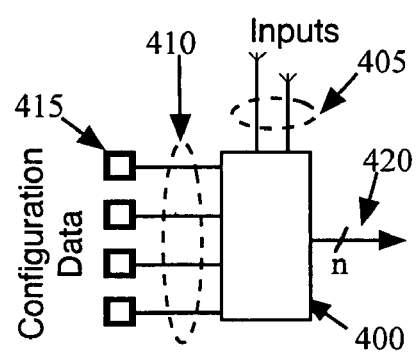
FIG. 4 illustrates a configurable logic circuit.

FIG. 4 illustrates a configurable logic circuit. As shown in this figure, a configurable logic circuit 400 is a logic circuit that receives configuration data along its set of control lines 410. In this example, the configurable logic circuit receives configuration data from a set of storage elements (e.g., SRAM's) 415. The logic circuit 400 is said to be configurable, as the configuration data set "configures" the logic circuit to perform a particular function (from its set of functions) on the input data received along its input terminals 405 to produce its output data (that is provided along its output terminal set 420). The logic circuit 400 can be reconfigured by writing new data in the storage elements 415.

Some examples of logic circuits include look-up tables (LUT's), universal logic modules (ULM's), sub-ULM's, multiplexers, and PAL's/PLA's. In addition, logic circuits can be complex logic circuits formed by multiple logic and interconnect circuits. Examples of simple and complex logic circuits can be found in Architecture and CAD for Deep-Submicron FPGAs, Betz, et al., ISBN 0792384601, 1999; and Design of Interconnection Networks for Programmable Logic, Lemieux, et al., ISBN 1-4020-7700-9, 2003. Other examples of configurable logic circuits are provided in the above-incorporated U.S. patent application Ser. No. 10/882, 583.

As further described below, multiplexers can be used as the logic circuits of some embodiments of the invention. Also, some embodiments use non-configurable logic circuits (i.e., logic circuits that do not receive configuration data or any other control signals). These logic circuits are simple computation circuits that perform a particular computation on an input data set.

A volatile configurable circuit is a configurable circuit that directly or indirectly receives its configuration data from a volatile memory storage. The volatile storage is typically part of the configurable circuit or it is placed adjacent to the configurable circuit within a circuit array that contains the configurable circuit. For instance, the multiplexer 300 is a volatile configurable multiplexer as its configuration data is stored in two volatile storage elements 320 of the multiplexer. Similarly, the logic circuit 400 is a volatile circuit as its configuration data is stored in its four storage elements 415. However, the volatile storage does not need to be part of or adjacent to the configurable circuit.

A user-design signal within a configurable IC is a signal that is generated by a circuit (e.g., logic circuit) of the configurable IC. The word "user" in the term "user-design signal" connotes that the signal is a signal that the configurable IC generates for a particular application that a user has configured the IC to perform. User-design signal is abbreviated to user signal in some of the discussion below.

In some embodiments, a user signal is not a configuration or clock signal that is generated by or supplied to the configurable IC. In some embodiments, a user signal is a signal that is a function of at least a portion of the configuration data received by the configurable IC and at least a portion of the inputs to the configurable IC. In these embodiments, the user signal can also be dependent on (i.e., can also be a function of) the state of the configurable IC. The initial state of a configurable IC is a function of the configuration data received by the configurable IC and the inputs to the configurable IC. Subsequent states of the configurable IC are functions of the configuration data received by the configurable IC, the inputs to the configurable IC, and the prior states of the configurable IC.

Figure 5:
FIG. 5 illustrates an example of a configurable node array that includes configurable nodes that are arranged in rows and columns.

A circuit array is an array with several circuit elements that are arranged in several rows and columns. One example of a circuit array is a configurable node array, which is an array formed by several configurable circuits (e.g., configurable logic and/or interconnect circuits) arranged in rows and columns. In some cases, all the circuit elements in a configurable node array are configurable circuit elements. For instance, FIG. 5 illustrates an example of a configurable node array 500 that includes 208 configurable nodes 505 that are arranged in 13 rows and 16 columns. Each configurable node in such a configurable node array is a configurable circuit that includes one or more configurable sub-circuits. In other cases, the circuit elements in a configurable node array also include non-configurable circuit elements.

In some embodiments, each configurable node in a configurable node array is a simple or complex configurable logic circuit. In some embodiments, each configurable node in a configurable node array is a configurable interconnect circuit. In such an array, a configurable node (i.e., a configurable interconnect circuit) can connect to one or more logic circuits. In turn, such logic circuits in some embodiments might be arranged in terms of another configurable logic-circuit array that is interspersed among the configurable interconnect-circuit array.

Some embodiments might organize the configurable circuits in an arrangement that does not have all the circuits organized in an array with several aligned rows and columns. Accordingly, instead of referring to configurable circuit arrays, the discussion below refers to configurable circuit arrangements. Some arrangements may have configurable circuits arranged in one or more arrays, while other arrangements may not have the configurable circuits arranged in an array.

In some embodiments, some or all configurable circuits in a circuit arrangement have the same or similar circuit structure. For instance, in some embodiments, some or all the circuits have the exact same circuit elements (e.g., have the same set of logic gates and circuit blocks and/or same interconnect circuits), where one or more of these identical elements are configurable elements. One such example would be a set of circuits positioned in an arrangement, where each circuit is formed by a particular set of logic and interconnect circuits. Having circuits with the same circuit elements simplifies the process for designing and fabricating the IC, as it allows the same circuit designs and mask patterns to be repetitively used to design and fabricate the IC.

In some embodiments, the similar configurable circuits not only have the same circuit elements but also have the same exact internal wiring between their circuit elements. For instance, in some embodiments, a particular set of logic and interconnect circuits that are wired in a particular manner forms each circuit in a set of configurable circuits that are in a configurable circuit arrangement. Having such circuits further simplifies the design and fabrication processes as it further simplifies the design and mask making processes.

Also, some embodiments use a circuit arrangement that includes numerous configurable and non-configurable circuits that are placed in multiple rows and columns. In addition, within the above described circuit arrangements (e.g., arrays), some embodiments disperse other circuits (e.g., memory blocks, macro blocks, etc.).

Several figures below illustrate several direct connections between circuits in a circuit arrangement. A direct connection between two circuits in an circuit arrangement is an electrical connection between the two circuits that is achieved by (1) a set of wire segments that traverse through a set of the wiring layers of the IC, and (2) a set of vias when two or more wiring layers are involved.

In some embodiments, a connection between two circuits in a circuit arrangement might also include a set of buffer circuits in some cases. In other words, two circuits are connected in some embodiments by a set of wire segments that possibly traverse through a set of buffer circuits and a set of vias. Buffer circuits are not interconnect circuits or configurable logic circuits. In some embodiments, buffer circuits are part of some or all connections. Buffer circuits might be used to achieve one or more objectives (e.g., maintain the signal strength, reduce noise, alter signal delay, etc.) along the wire segments that establish the direct connections. Inverting buffer circuits may also allow an IC design to reconfigure logic circuits less frequently and/or use fewer types of logic circuits. In some embodiments, buffer circuits are formed by one or more inverters (e.g., two or more inverters that are connected in series).

Figure 6:
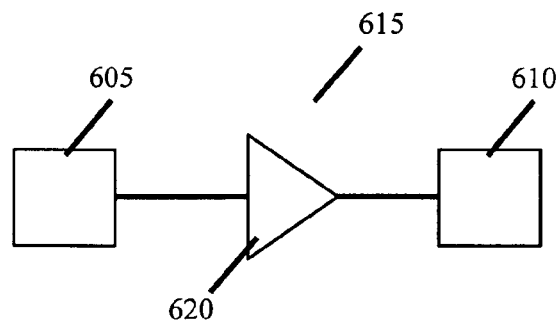
FIG. 6 illustrates an example of a connection between two circuits.
Figure 7:
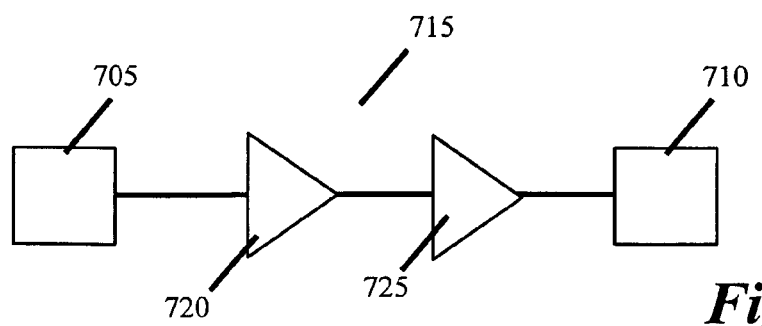
FIG. 7 illustrates an example of another connection between two circuits.

FIGS. 6 and 7 illustrate examples of two connections, each between two circuits in an arrangement. Each of these connections has one or more intervening buffer circuits. Specifically, FIG. 6 illustrates an example of a connection 615 between two circuits 605 and 610. As shown in this figure, this connection has an intervening buffer circuit 620. In some embodiments, the buffer circuit 620 is an inverter. Accordingly, in these embodiments, the connection 615 inverts a signal supplied by one circuit 605 to the other circuit 610.

FIG. 7 illustrates an example of a connection 715 between two circuits 705 and 710. As shown in this figure, this connection 715 has two intervening buffer circuits 720 and 725. In some embodiments, the buffer circuits 720 and 725 are inverters. Hence, in these embodiments, the connection 715 does not invert a signal supplied by circuit 705 to the other circuit 710.

Alternatively, the intermediate buffer circuits between the logic and/or interconnect circuits can be viewed as a part of the devices illustrated in these figures. For instance, the inverters that can be placed after the devices 705 and 710 can be viewed as being part of these devices. Some embodiments use such inverters in order to allow an IC design to reconfigure logic circuits less frequently and/or use fewer types of logic circuits Several figures below "topologically" illustrate several direct connections between circuits in an arrangement. A topological illustration is an illustration that is only meant to show a direct connection between two circuits without specifying a particular geometric layout for the wire segments that establish the direct connection.

II. UMUX

Some embodiments are configurable IC's that have "UMUX's". A UMUX is a multiplexer that receives user-design signals for at least one of its data inputs and one of its select inputs. A UMUX might receive a user-design signal directly from a configurable logic circuit or indirectly through one or more intermediate configurable interconnect circuits.

Figure 8:
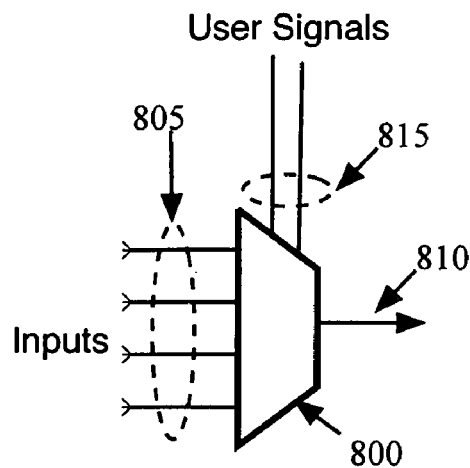
FIG. 8 illustrates a full UMUX.

Two kinds of UMUX's are full UMUX's and hybrid UMUX's. A full UMUX (or FUMUX) is a UMUX that receives user-design signals for all of its select signals. FIG. 8 illustrates a full UMUX 800. This UMUX has a set of input terminals 805, an output terminal 810, and a set of select terminals 815. The UMUX 800 is a four-to-one multiplexer that connects one of its four data inputs 805 to its data output 810 based on the value of the two user-signals that it receives along its select terminals 815.

Figure 9:
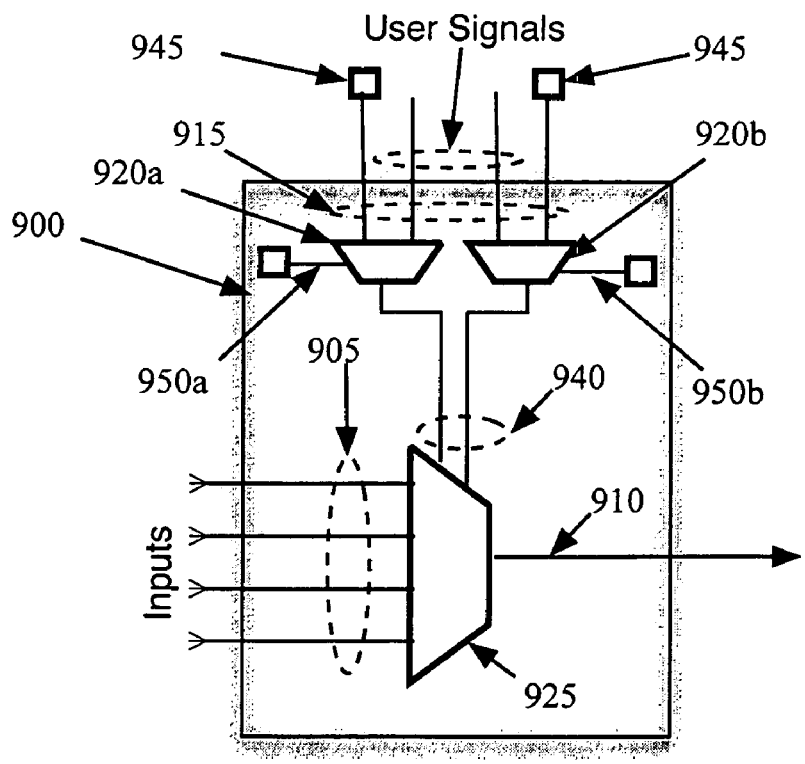
FIG. 9 illustrates a hybrid UMUX.

A hybrid UMUX (or HUMUX) is a UMUX that can receive user-design signals, configuration data, or both user-design signals and configuration data for its select signals. FIG. 9 illustrates an HUMUX 900. This HUMUX includes two two-to-one multiplexers 920, a four-to-one multiplexer 925, a set of input terminals 905, an output terminal 910, and a set of select terminals 915. From the outside, the HUMUX looks like a four-to-one multiplexer that has four data inputs 905, one data output 910, and four select terminals 915. Also, from the outside, the HUMUX looks like it passes one of its four data inputs 905 to its one data output 910 based on the value of two of the four signals that it receives along its four select lines 915.

Internally, the two two-to-one multiplexers 920 pass two of the signals from the four select lines 915 to the two select terminals 940 of the four-to-one multiplexer 925. As shown in FIG. 9, each two-to-one multiplexer 920 receives two input signals, which include one user-design signal and one stored configuration signal stored in a storage element 945. Each of the two-to-one multiplexers 920 outputs one of the two input signals that it receives based on the configuration bit that it receives along its select line 950. Although FIG. 9 illustrates two configuration bits stored in two storage elements, other embodiments might drive both multiplexers 920 off one configuration bit that is stored in one storage element.

The two signals output by the two multiplexers 920 then serve as the select signals of the multiplexer 925, and thereby direct this multiplexer to output on line 910 one of the four input signals that it receives on lines 905. The two multiplexers 920 can output on lines 940 either two user-design signals, two configuration signals, or one user-design signal and one configuration signal. Accordingly, through the two multiplexers 920, the operation of the multiplexer 925 can be controlled by two user-design signals, two configuration signals, or a mix of user/configuration signals.

References to UMUX's in the description below should be construed to cover either a FUMUX or an HUMUX.

III. UMUX Architectures

Figure 10:
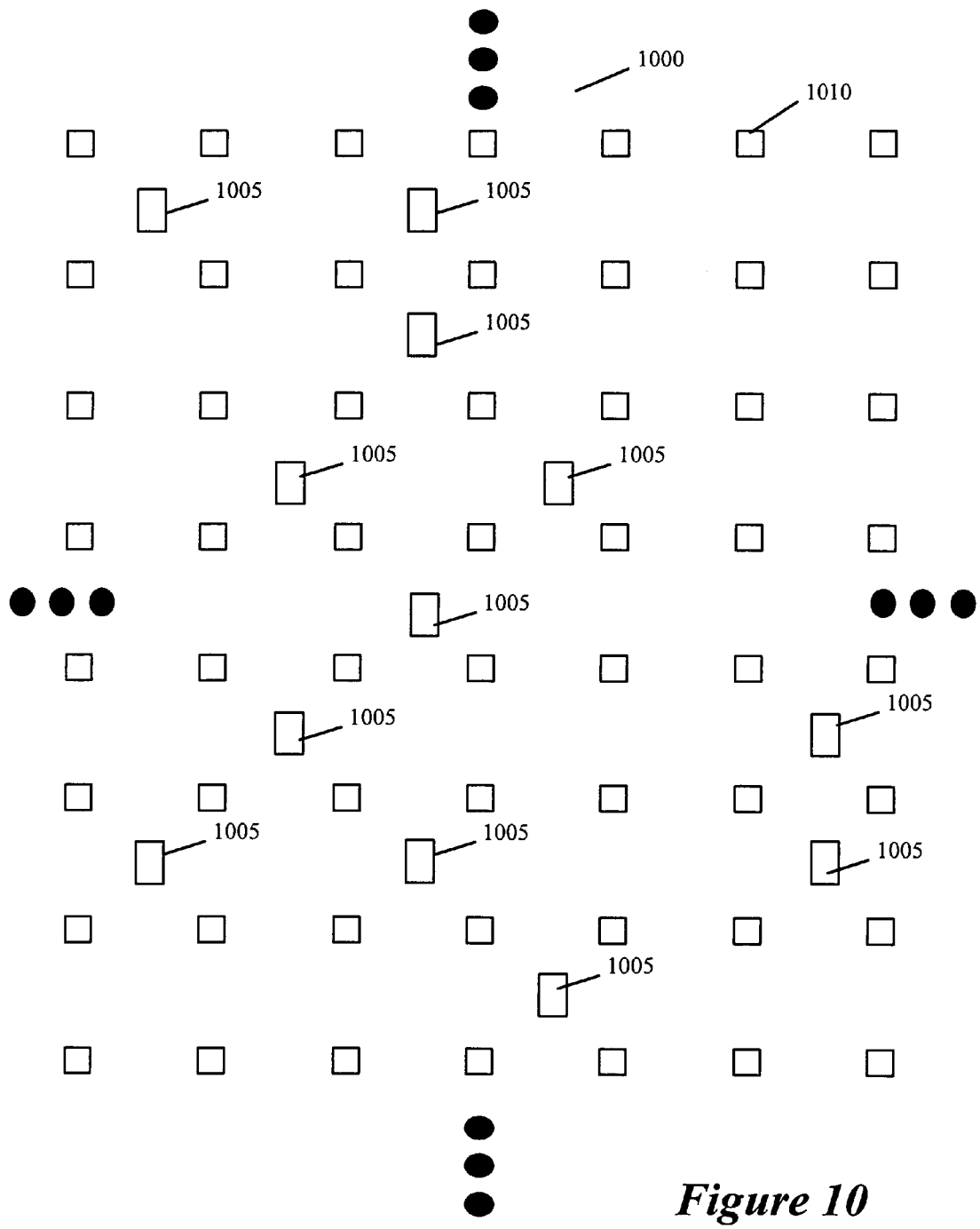
FIG. 10 illustrates that some embodiments place the UMUX's between the circuits of a circuit arrangement according to no particular pattern.
Figure 11:
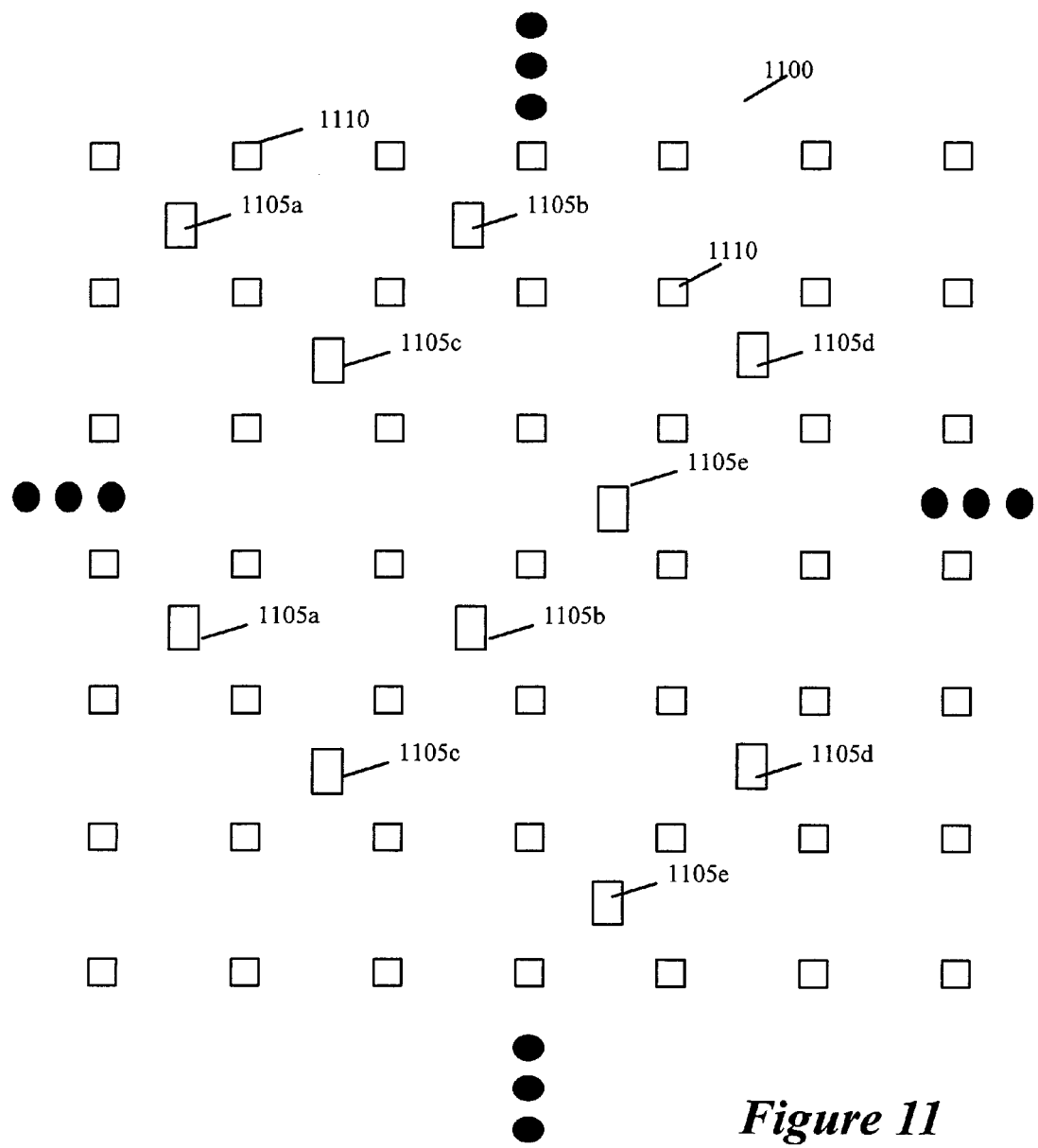
FIG. 11 illustrates that some embodiments place UMUX's between the circuits according to a particular pattern that repeats across the entire circuit arrangement or a portion of the arrangement.

Different embodiments of the invention use UMUX's differently in different configurable IC architectures. Some embodiments have a number of UMUX's dispersed between the circuits of a circuit arrangement. FIGS. 10 and 11 illustrate two such embodiments. FIG. 10 illustrates that some embodiments place the UMUX's 1005 between the circuits 1010 of a circuit arrangement 1000 according to no particular pattern. FIG. 11, on the other hand, illustrates that some embodiments place UMUX's 1105 between the circuits 1110 according to a particular pattern that repeats across the entire circuit arrangement 1100 or a portion of the arrangement. In FIG. 11, the pattern that is repeated is one that is formed by five UMUX's 1105a-1105e.

The circuits (e.g., 1110 or 1010) in such circuit arrangements are all logic circuits in some embodiments, while they are interconnect circuits in other embodiments. In yet other embodiments, the circuits (e.g., 1110 or 1010) in the circuit arrangement are both logic and interconnect circuits. Also, in some embodiments, the circuit arrangement is a configurable circuit arrangement. Thus, in these embodiments, all the circuits in the circuit arrangement are configurable circuits (i.e., all the circuits are configurable logic circuits, configurable interconnect circuits, or a mixture of configurable logic and interconnect circuits). In some of these embodiments, all or some of the configurable circuits are configurable volatile circuits (i.e., they are configurable volatile logic and/or interconnect circuits).

Figure 12:
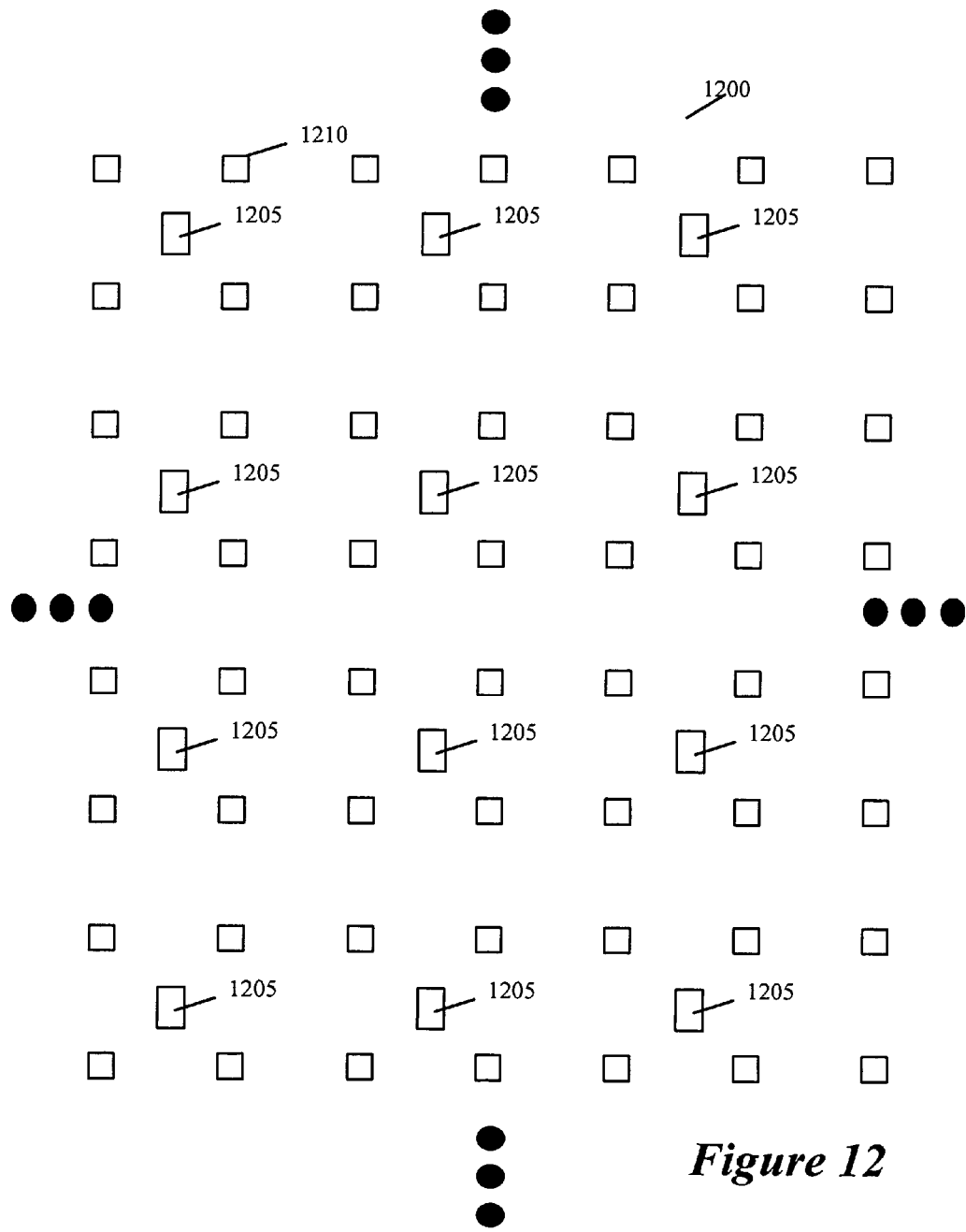
FIG. 12 illustrates an example where a number of UMUX's that are dispersed between the circuits of a circuit arrangement, form an arrangement of their own.
Figure 13:
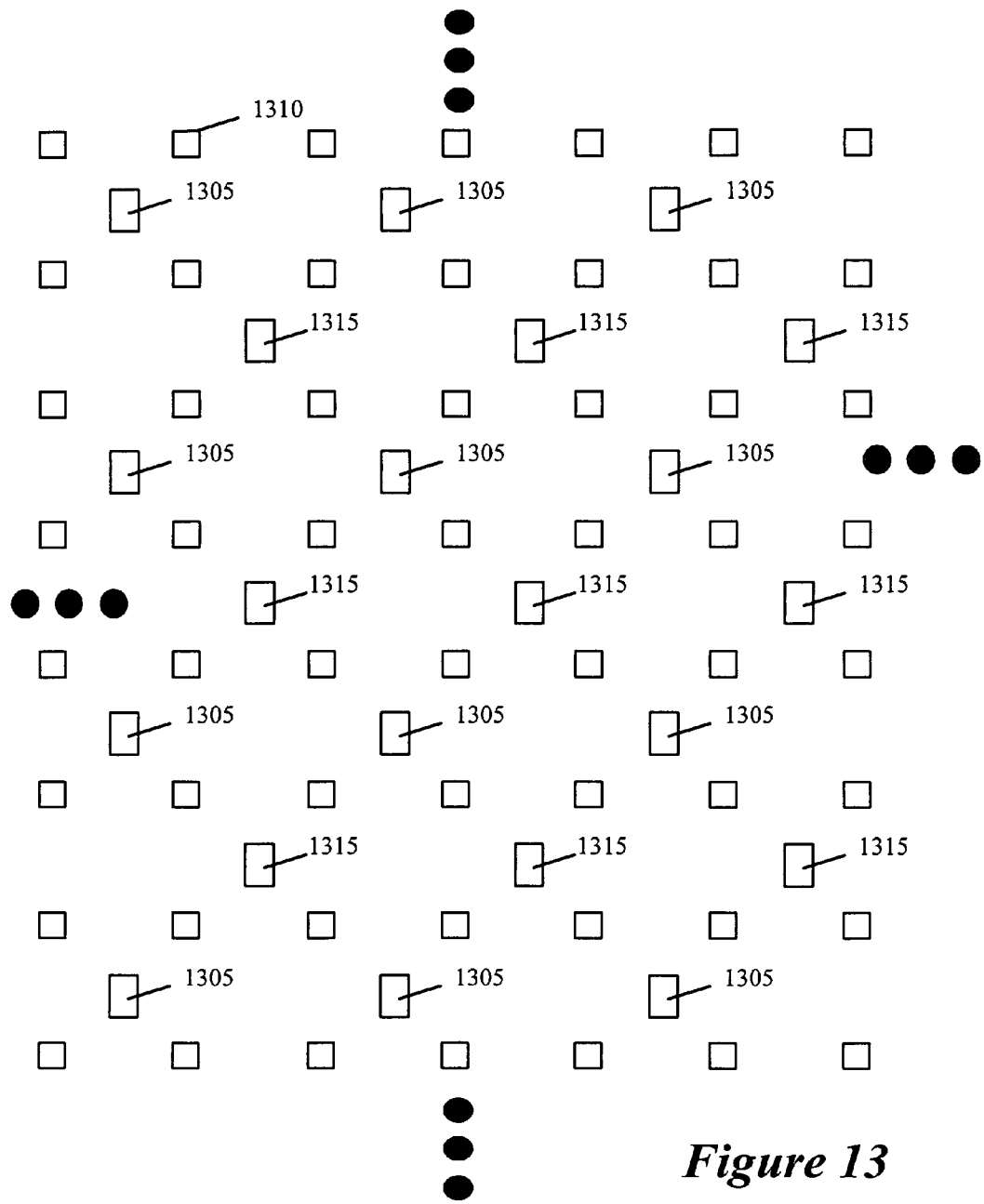
FIG. 13 illustrates an example of arranging UMUX's in two arrays that are dispersed between the circuits of a circuit arrangement.

In the embodiments that disperse UMUX's between the circuits of a circuit arrangement, the UMUX's can be arranged in one or more arrangements. FIG. 12 illustrates an example where a number of UMUX's 1205, that are dispersed between the circuits 1210 of a circuit arrangement, form an arrangement of their own. FIG. 13 illustrates an example of arranging UMUX's 1305 and 1315 in two arrays that are dispersed between the circuits 1310 of a circuit arrangement. Specifically, the UMUX's 1305 form one array, while the UMUX's 1315 form another array.

Figure 14:
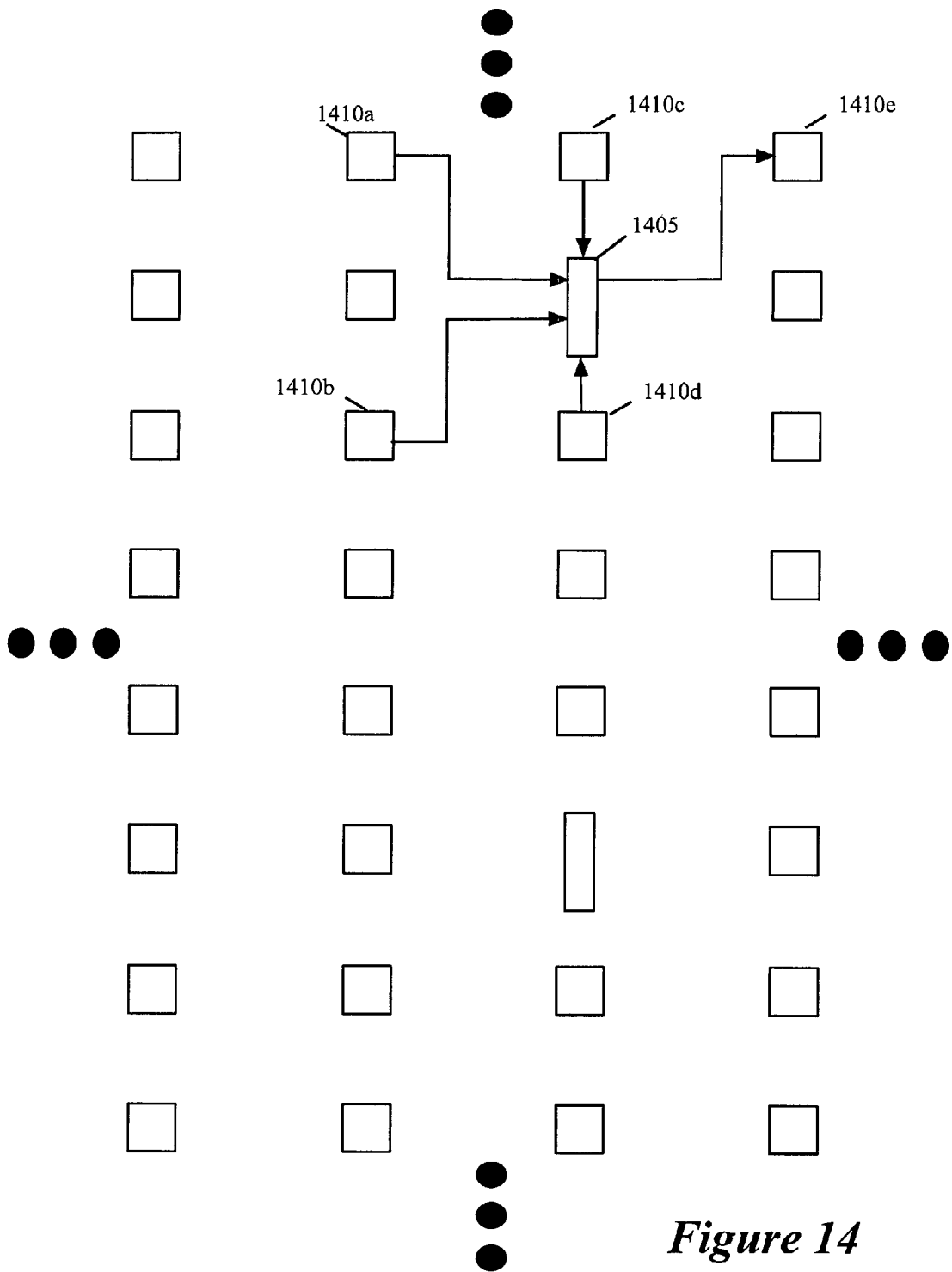
FIG. 14 illustrates an example of a UMUX that is positioned in an arrangement of circuit elements.

Some embodiments position the UMUX's in a circuit arrangement with other types of circuits. FIG. 14 illustrates an example of a UMUX 1405 that is positioned in an arrangement of circuit elements 1410. This UMUX receives input signals from two circuit elements 1410a and 1410b, and receives select signals from two circuits elements 1410c and 1410d. The UMUX 1405 then outputs a signal to circuit element 1410e. All the circuit elements 1410 are configurable circuits (e.g., configurable logic and/or interconnect circuits) in some embodiments. Also, in some embodiments, all these configurable elements are volatile elements. In other embodiments, only some of the circuit elements 1410 are volatile configurable circuit elements, while other circuit elements are non-volatile configurable circuit elements or non-configurable circuit elements.

Figure 15:
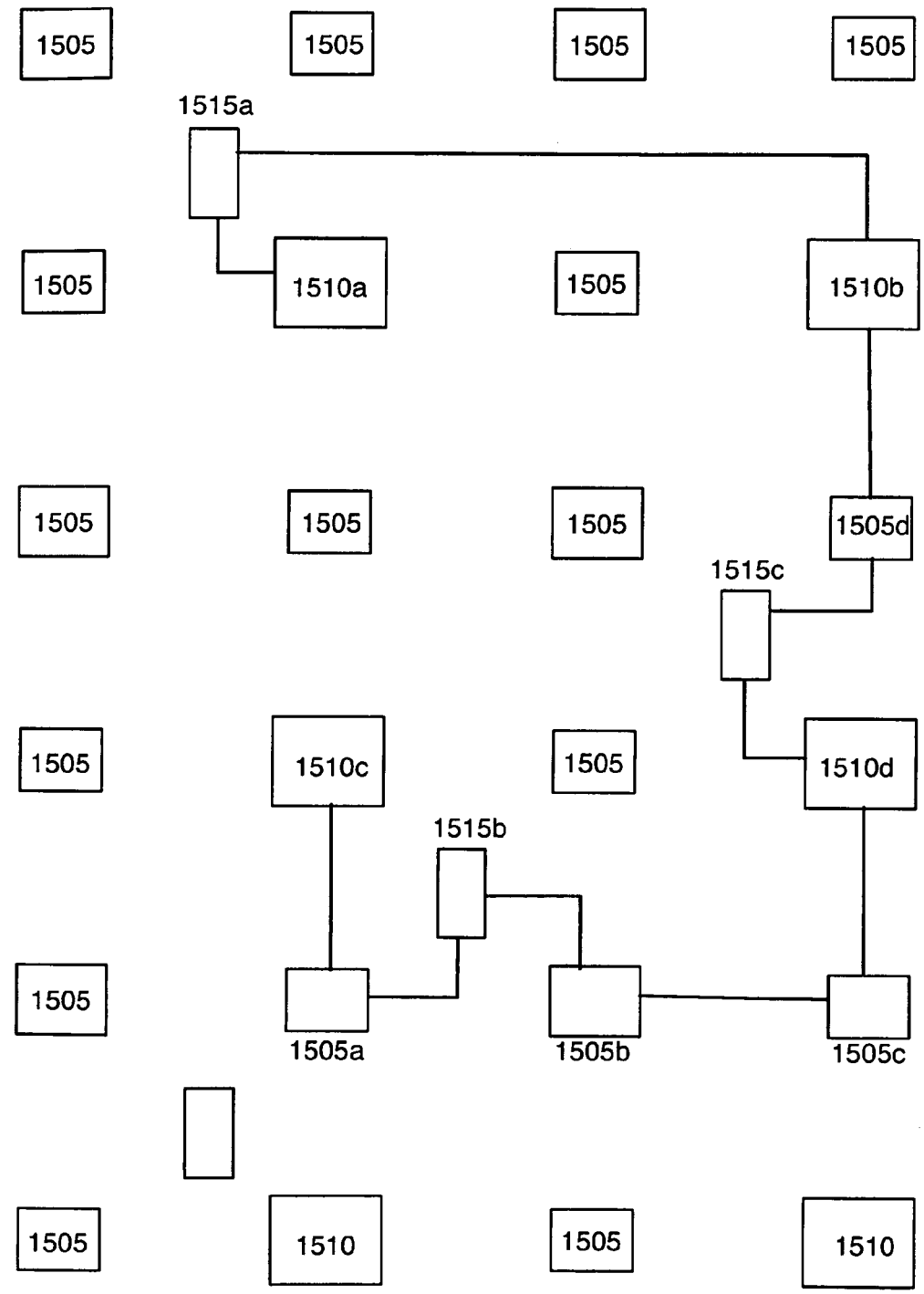
FIG. 15 illustrates a circuit arrangement having logic circuits, interconnect circuits, and UMUX's.

UMUX's can receive user-design signals directly from logic circuits, or indirectly from logic circuits through intervening interconnect circuits. FIG. 15 illustrates a circuit arrangement having logic circuits 1510, interconnect circuits 1505, and UMUX's 1515. In this example, a UMUX 1515a receives a user-design signal, as a select signal, directly from logic circuit 1510a, and receives a user-design signal, as an input signal, directly from the logic circuit 1510b. This figure also illustrates a UMUX 1515b that receives a user-design signal as an input signal from logic circuit 1510d through intervening interconnect circuits 1505*b* and 1505*c*. It also illustrates this UMUX 1515*b* receiving a user-design signal as a select signal from logic circuit 1510*c* through interconnect circuit 1505*a*. Finally, this figure illustrates a UMUX 1515*c* that receives a first user-design signal directly from a logic circuit 1510*d*, and a second user-design signal indirectly from the logic circuit 1510*b* through the interconnect circuit 1505*d*. In some embodiments, the intervening interconnect circuits 1505*a*, 1505*b*, 1505*c*, and 1505*d* are volatile configurable interconnect circuits.

In the examples illustrated in FIGS. 10-15, UMUX's are part of or are dispersed within a large circuit arrangement that has numerous circuits (e.g., tens, hundreds, thousands, etc. of circuits). In other words, these examples illustrate the use of UMUX's at a macrolevel in configurable IC's. However, in some embodiments, UMUX's are used at the microlevel in a circuit arrangement (e.g., within a circuit or circuits of a large circuit or circuit arrangement) of a configurable IC. For instance, in some embodiments, the circuits in a configurable IC's circuit arrangement include complex logic circuits that are formed by multiple logic and interconnect circuits. In such embodiments, complex logic circuits can be formed by one or more UMUX's.

Figure 16:
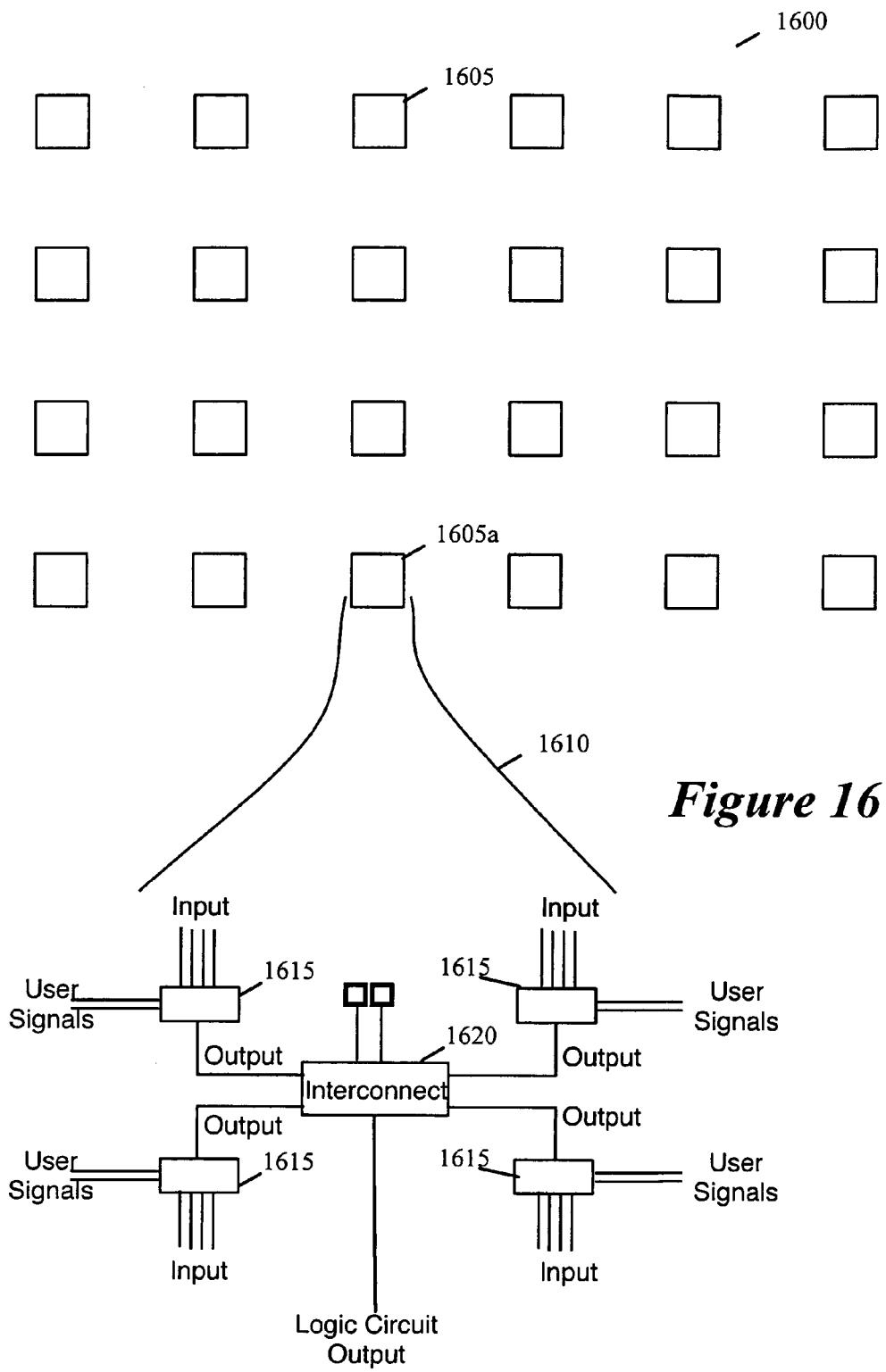
FIG. 16 illustrates an example of a circuit in a configurable IC's circuit arrangement that includes complex logic circuits that are formed by multiple logic and interconnect circuits.

FIG. 16 illustrates an example of such an embodiment. Specifically, this figure illustrates a circuit arrangement 1600 that includes a number of logic circuits 1605 arranged in a number of rows and columns. This figure further illustrates an exploded view 1610 of one of the logic circuits 1605*a*. As shown in this view, the logic circuit 1605*a* is formed by four UMUX's 1615 and one interconnect circuit 1620. Each of the UMUX's receives input signals and user-design signals, which direct the UMUX to output one of its input signals. The UMUX output signals are provided to the configurable interconnect circuit 1620, which then outputs one or more of these output signals as the output of the logic circuit 1605*a*.

In some embodiments, all the logic circuits 1605 in the array 1600 have the structure of the logic circuit 1605*a*. In other embodiments, only some of the logic circuits 1605 have this structure, while other logic circuits have a different structure. For instance, some embodiments use configurable logic circuits in combination with the UMUX-based logic circuits (i.e., with logic circuits that are similar to the circuit 1605*a*). Other embodiments use non-configurable logic circuits with the UMUX-based logic circuits. Yet other embodiments use a combination of configurable logic circuits, non-configurable logic circuits, and UMUX-based logic circuits.

IV. Applications

A. Supering

Figure 17:
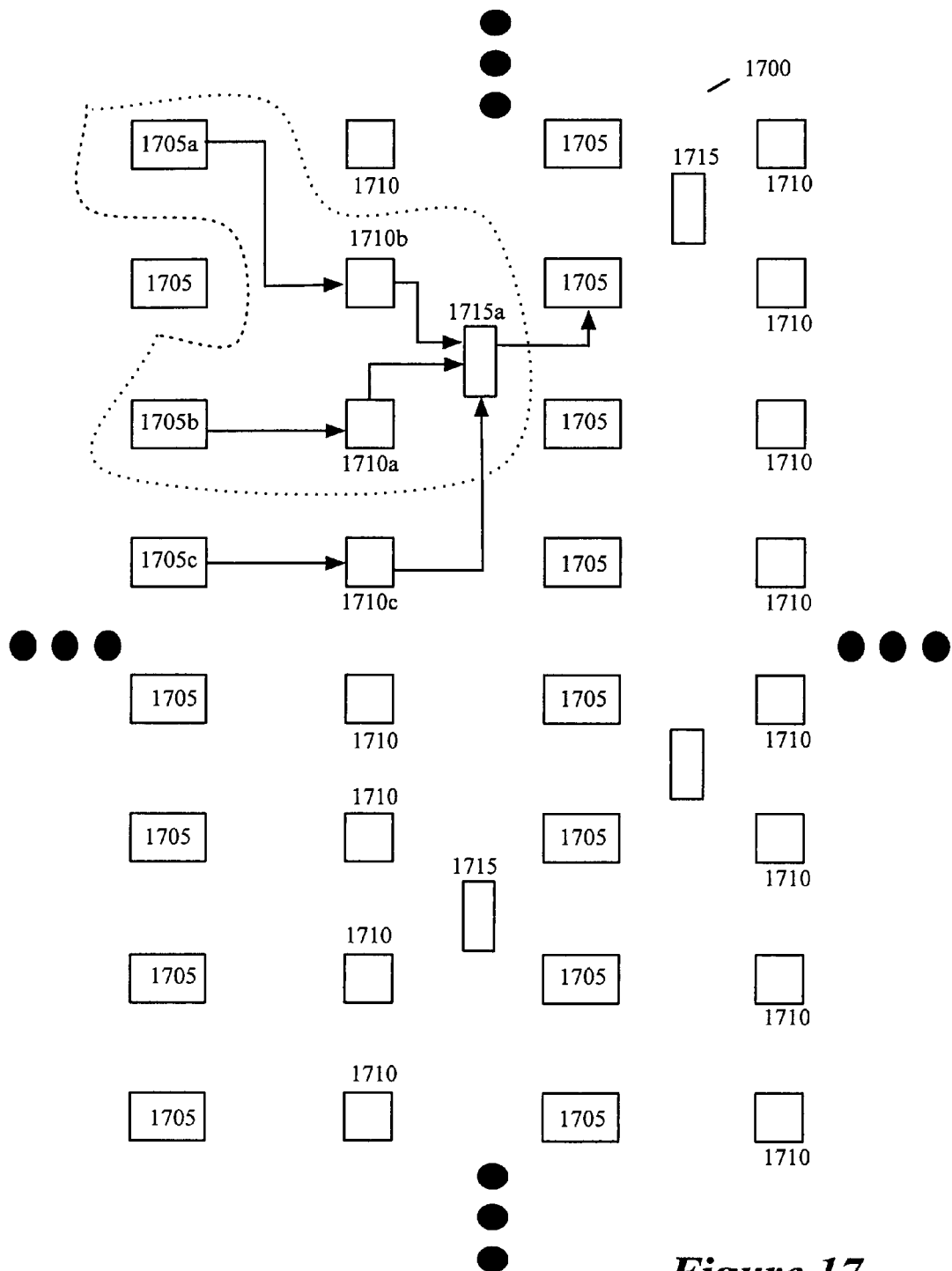
FIG. 17 illustrates an example of "supering" multiple logic circuits that use of UMUX's.

Some embodiments use UMUX's for "supering" multiple logic circuits. Supering refers to combining the outputs of multiple logic circuits to form a more complex logic circuit. FIG. 17 illustrates one such embodiment. This figure illustrates a macro-level view of a configurable circuit arrangement 1700 with numerous (e.g., hundreds, thousands, etc.) circuits arranged in rows and columns. This array includes numerous configurable volatile logic circuits 1705, configurable volatile interconnect circuits 1710, and UMUX's 1715.

As shown in FIG. 17, one UMUX 1715*a* receives as input signals the outputs of two logic circuits 1705*a* and 1705*b* through two intervening configurable interconnect circuits 1710*a* and 1710*b*. This UMUX 1715*a* also receives as a select signal the output of a logic circuit 1705*c* through an intervening configurable interconnect circuit 1710*c*, which is a volatile configurable circuit in some embodiments. Based on the received select signal, the UMUX 1715*a* performs a function on its received input signals. The UMUX performs this function by outputting one of its input signals along its output line based on the value of the received select signal.

The circuit structure illustrated in FIG. 17 can be used to implement a four-input LUT with two three-input LUT's and a UMUX. In other words, if the logic circuits 1705*a* and 1705*b* are three-input LUT's, the UMUX 1715*a* can be used to create a "super" four-input LUT by combining the outputs of three-input LUT's 1705*a* and 1705*b* based on the output of the logic circuit 1705*c*. In this case, the supered four-input LUT is the circuit formed by LUT's 1705*a* and 1705*b*, the interconnect circuit 1710*a*, and the UMUX 1715*a*.

B. Memory

Figure 18:
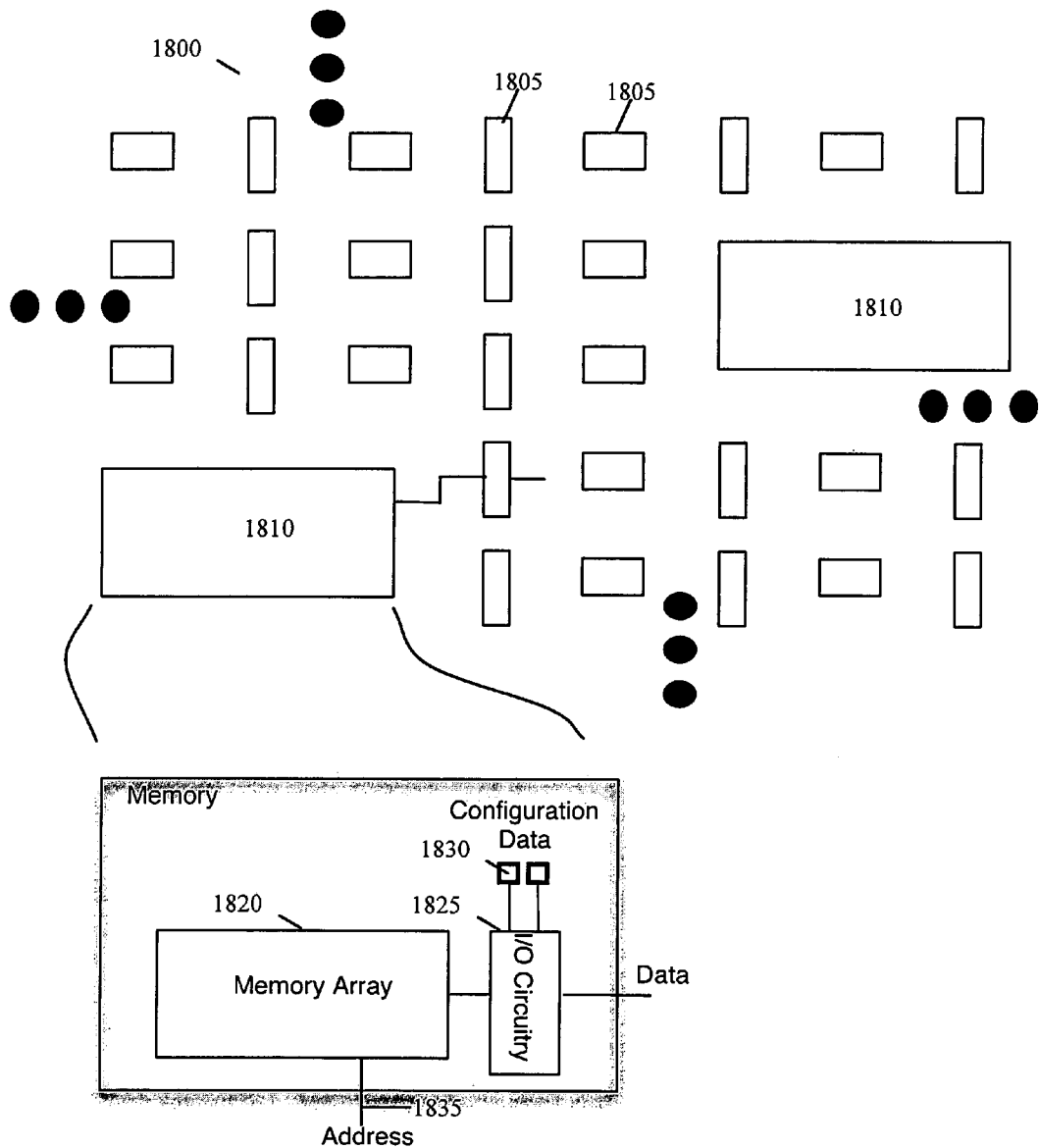
FIG. 18 illustrates one such prior configurable circuit arrangement.

Some embodiments of the invention use UMUX's to implement configurable circuit arrangements with configurable memory read and write operations. Some configurable IC's today have configurable circuit arrangements with configurable memory structures. FIG. 18 illustrates one such prior configurable circuit arrangement 1800. This circuit arrangement includes numerous configurable circuits 1805 that are arranged in rows and columns. It also includes two configurable memories 1810. Each of these two memories includes a memory array 1820, i/o circuitry 1825, and configuration-storing storage elements 1830.

The configuration-storing storage elements 1830 store configuration data. This data configures each memory to input and/or output a certain number of bits. Specifically, the memory array 1820 receives an address along its address line 1835. During a write operation, the address identifies a location in the memory to which the i/o circuitry needs to write a fixed number of bits. Alternatively, during a read operation, this address identifies a location in the memory from which the i/o circuitry needs to read a fixed number of bits (e.g., 8 bits).

The i/o circuitry 1825 receives configuration data from the storage elements 1830. Based on the received configuration data, the i/o circuitry then outputs a sub-set of the data bits (e.g., outputs 4 bits) that it receives from the memory array 1820 during a read operation. In other words, the number of bits that the i/o circuitry might output from a location in the memory array depends on the configuration data stored in the configuration-storing storage elements 1830.

Requiring the memories 1810 to have configuration storage elements 1830 and/or circuitry responsive to these storage elements complicates the structure of these memories, and thereby increases their size. Accordingly, to use simpler memory structures in a configurable circuit arrangement of a configurable IC, some embodiments use UMUX's to implement configurable circuit arrangements with configurable memory read operations.

Figure 19:
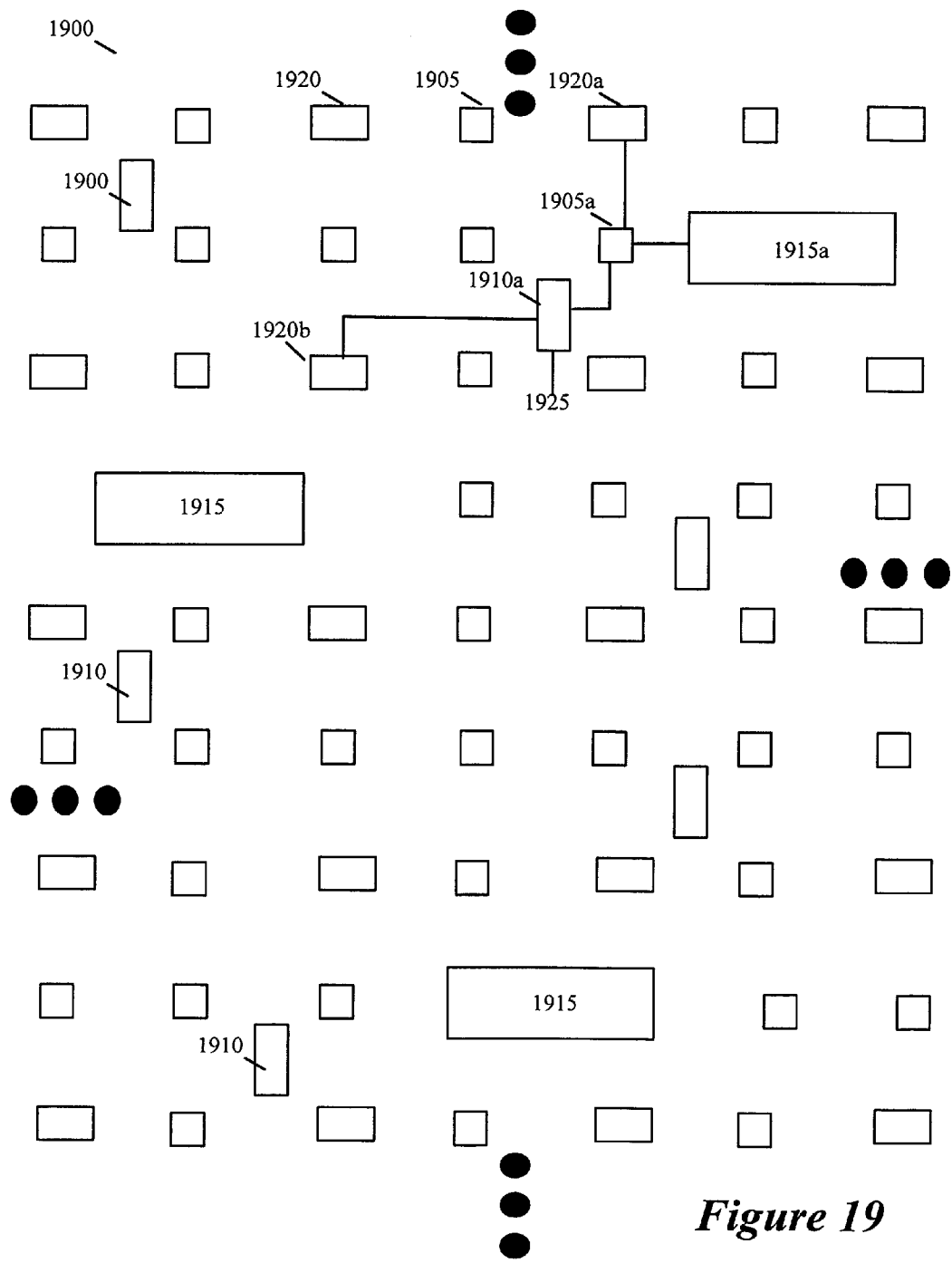
FIG. 19 illustrates a configurable circuit arrangement that includes numerous configurable interconnect circuits, UMUX's, and logic circuits.

FIG. 19 illustrates one such embodiment. This figure illustrates a configurable circuit arrangement 1900 that includes numerous configurable interconnect circuits 1905, UMUX's 1910, and logic circuits 1920. The interconnect circuits 1905 are arranged in an arrangement with several rows and columns. Dispersed within this arrangement of interconnect circuits are the logic circuits, which are also arranged in an arrangement with multiple rows and columns. The UMUX's are dispersed within these arrangements. Several memories 1915 are also dispersed within these arrangements. In some embodiments, these memories all have the same width. For instance, in some cases, these memories are 256 byte memories that output eight-bit words.

FIG. 19 illustrates two examples for reading out data from a non-configurable memory 1915a. The output of each of these memories is always eight-bits wide. To read out a byte of data (i.e., to read out eight bits of data), each memory (e.g., 1915a) receives an eight-bit address that identifies one of 256 locations in the memory.

As shown in FIG. 19, the eight-bit wide output of the memory 1915a can be supplied directly to a logic circuit 1920a through an interconnect circuit 1905a. Alternatively, as shown in this figure, a four-bit wide output of the memory 1915a can be supplied to the logic circuit 1920b through a UMUX 1910a. Specifically, through the interconnect circuit 1905a, the eight-bit wide output can be supplied to the UMUX 1910a. The UMUX 1910a is an 8×4 multiplexer that outputs either its bottom four input signals or its top four input signals to a logic circuit 1920b. Specifically, the UMUX 1910a receives a signal 1925 on its select line. Based on the value of this signal, the UMUX then selects its bottom four input signals or its top four input signals to output.

The bit 1925 that the UMUX 1910a receives can be viewed as a ninth address bit that helps identify and output a 4-bit word from the memory 1915a. In other words, the UMUX 1910a allows the 256×8 memory, which is accessed with an eight-bit address, to be treated as a 512×4 memory that is accessible with a nine-bit address.

Figure 20:
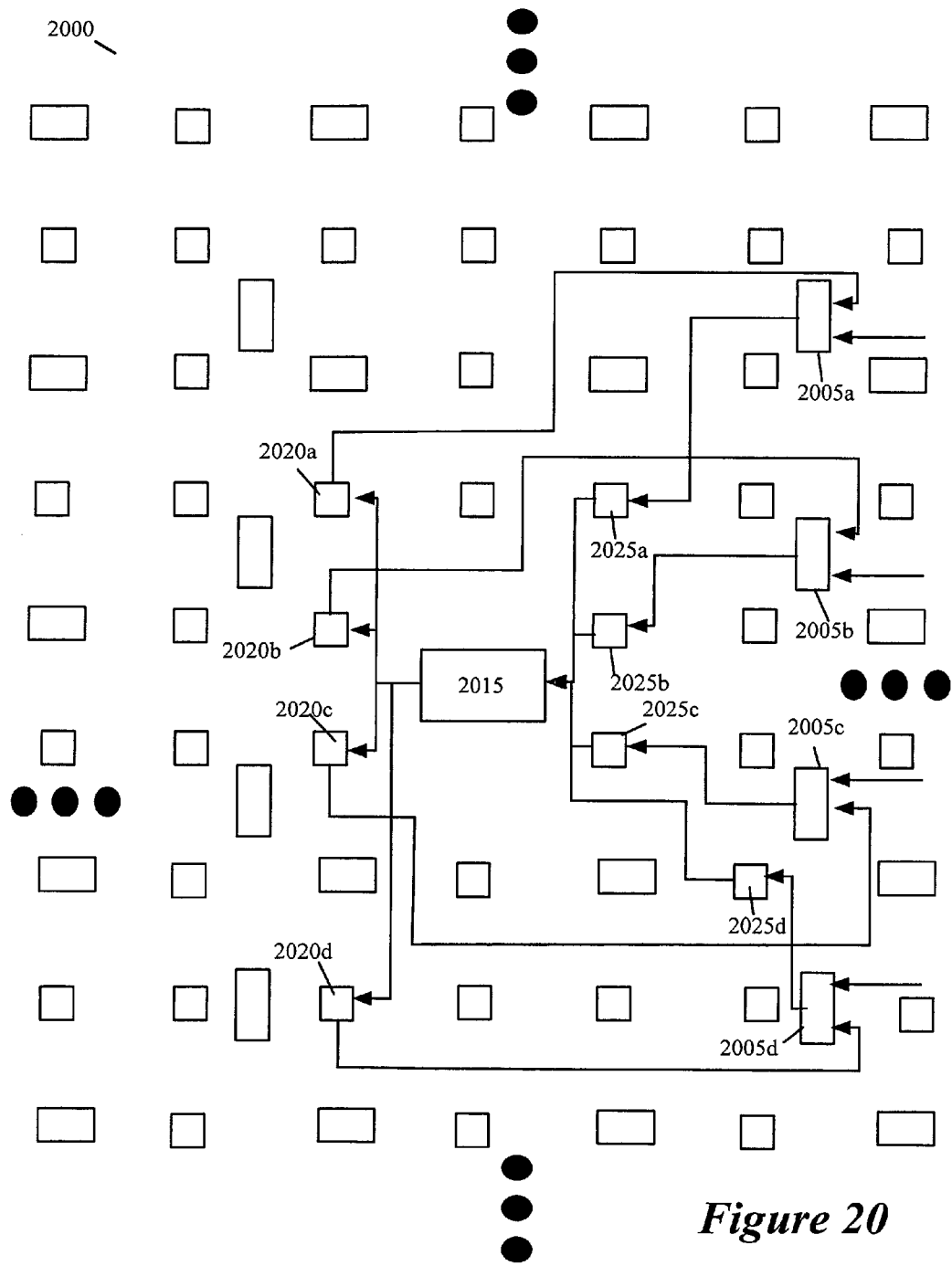
FIG. 20 illustrates an example of using UMUX's to write data to a non-configurable memory array in a configurable circuit arrangement.

FIG. 20 illustrates an example of using UMUX's to write data to a non-configurable memory array 2015 in a configurable circuit arrangement 2000. In this figure, the memory array has a set 2005 of four UMUX's to the right of the memory array. In the example illustrated in FIG. 20, the UMUX set 2005 is used for writing data to the memory array. The output of the UMUX set 2005 connects to the memory array through a set of configurable interconnects 2025, while the input of the UMUX set 2005 connects to the memory array through a set of configurable interconnects 2020.

During a write operation, an address is supplied to the memory array 2015 that identifies a four-bit location in this array. This four-bit location is a location to which the memory array will write four bits that are supplied through the UMUX set 2005 via the interconnect set 2025. Each UMUX in the UMUX set 2005 receives two bits. During a write operation, one bit comes from the user design, while the other bit comes from the memory. Specifically, during a write operation, the memory array 2015 provides the four bits currently stored in the location identified by the received address to the UMUX set 2005 through the interconnect set 2020.

During the write operation, each of the UMUX's 2005 receives a user signal on its select line that specifies, which of its two inputs (the user design input or the fedback, memory input) it should output. Through configurable interconnect set 2025, the outputs of the UMUX's are then provided to the memory array 2015 as data to write to the identified four-bit location.

The advantage of the UMUX-driven approach for accessing memories is that it allows all the memories in a configurable circuit arrangement to have the adjustable widths without requiring the use of configuration data. For instance, in the example illustrated in FIG. 20, the UMUX set 2005 allows two bits to be written in a memory that always reads and writes on a four-bit basis. Specifically, by providing one additional address bit that is decoded to provide two UMUX select signals, two UMUX provide two new bits to the memory while the other two UMUX write back to the memory two bits that it currently stores.

The UMUX-driven approach also allows the memories to have a relatively simple structure as these memories no longer need to store configuration data or circuitry responsive to configuration data. Moreover, the UMUX-driven approach allows the user to effectively have different memory operations with simpler memory structures simply through the programmable operation of the IC.

C. Shifter

Figure 21:
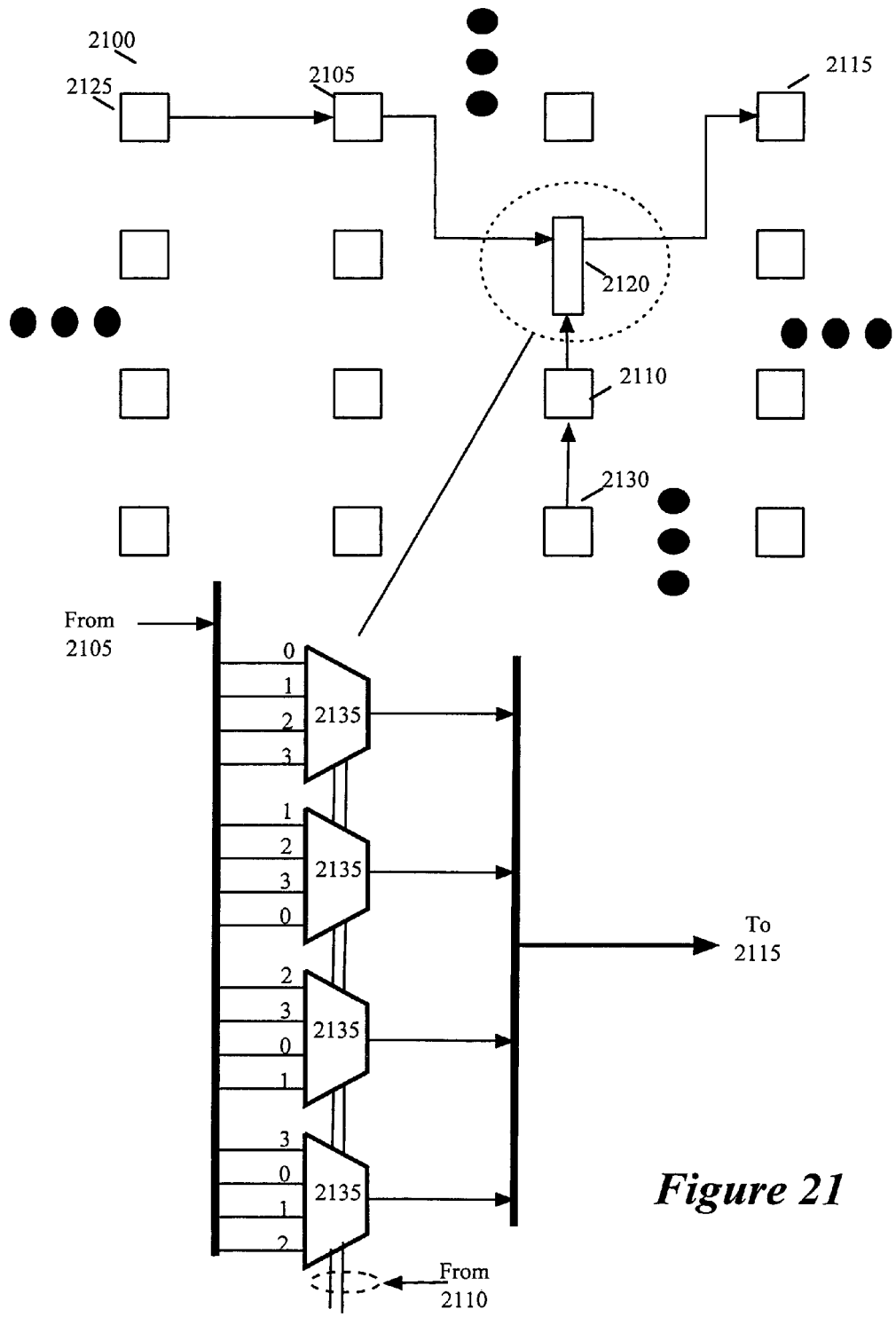
FIG. 21 illustrates the use of UMUX's to implement circuit arrangements with configurable shift operations.

Some embodiments of the invention use UMUX's to implement circuit arrangements with configurable shift operations. FIG. 21 illustrates one such embodiment. Specifically, this figure illustrates a circuit arrangement 2100 that has numerous circuits arranged in numerous rows and columns. These circuits include volatile configurable interconnect circuits 2105, 2110, and 2115, and logic circuits 2120, 2125 and 2130.

The logic circuit 2120 includes four four-to-one UMUX's 2135. Each of these UMUX's serves as a shifter. These UMUX's can be used to seamlessly perform a variable shift operation whenever the output of a logic circuit in the arrangement 2100 needs to be shifted by a certain number of bits that is to be determined by the output of another logic circuit. All that needs to be done is to supply to the UMUX's through configurable interconnect circuits (1) the bits that need to be shifted, and (2) the bits that need to specify the amount of the shift.

FIG. 21 illustrates one example of configurably connecting the UMUX's 2135 to logic circuits in the circuit arrangement 2100. Specifically, this figure illustrates the supplying of the output of logic circuit 2125 to the UMUX's 2135 through the configurable interconnect circuit 2105. In this example, the output of the logic circuit 2125 is four bits wide. Also, in this example, each UMUX 2135 receives the four-bit output of the logic circuit 2125 in a different order, as shown in FIG. 21.

FIG. 21 also illustrates the supplying of the output of the logic circuit 2130 to the UMUX's 2135 through the configurable interconnect circuit 2110. In this example, the output of the logic circuit 2130 is two-bits wide. The value of these two bits cause each of the UMUX's 2135 to output a particular one of their four input bits. This output operation of the UMUX's 2135 can result in a shift of the output of the logic circuit 2125. For instance, lets assume that the logic circuit 2130 output is a binary value of 10. For the order of the inputs of the UMUX's 2135 illustrated in FIG. 21, this output from logic circuit 2130 causes the UMUX's 2135 to output 2301 (where 0, 1, 2, 3 refer to bits in the four bit output from the logic circuit 2125 and the order of that these bits are received is 0123).

D. Interconnect Circuits

An HUMUX blurs the line between a communication circuit and a computation circuit. In a configurable IC that can be reconfigured in real time (i.e., in a reconfigurable IC), an HUMUX can serve as a logic circuit during some clock cycles, while serving as an interconnect circuit during other clock cycles. This ability is advantageous in a variety of contexts.

1. Hybrid Routing Mux and Logic Circuit

An HUMUX can be used as a hybrid routing multiplexer and logic circuit in a circuit arrangement of a configurable IC. In a circuit arrangement, a routing multiplexer is an interconnect circuit that connects other logic and/or interconnect circuits in the arrangement. In some embodiments, a routing multiplexer either provides its output to several logic and/or interconnect circuits (i.e., has a fan out greater than 1), or provides its output to other interconnect circuits. An HUMUX acts as a routing mux (i.e., does not perform any computation and only serves to relay signals from other circuits) when its operation is completely controlled by configuration data. On the other hand, an HUMUX serves as a logic circuit when its operation is not completely controlled by configuration data.

Figure 22:
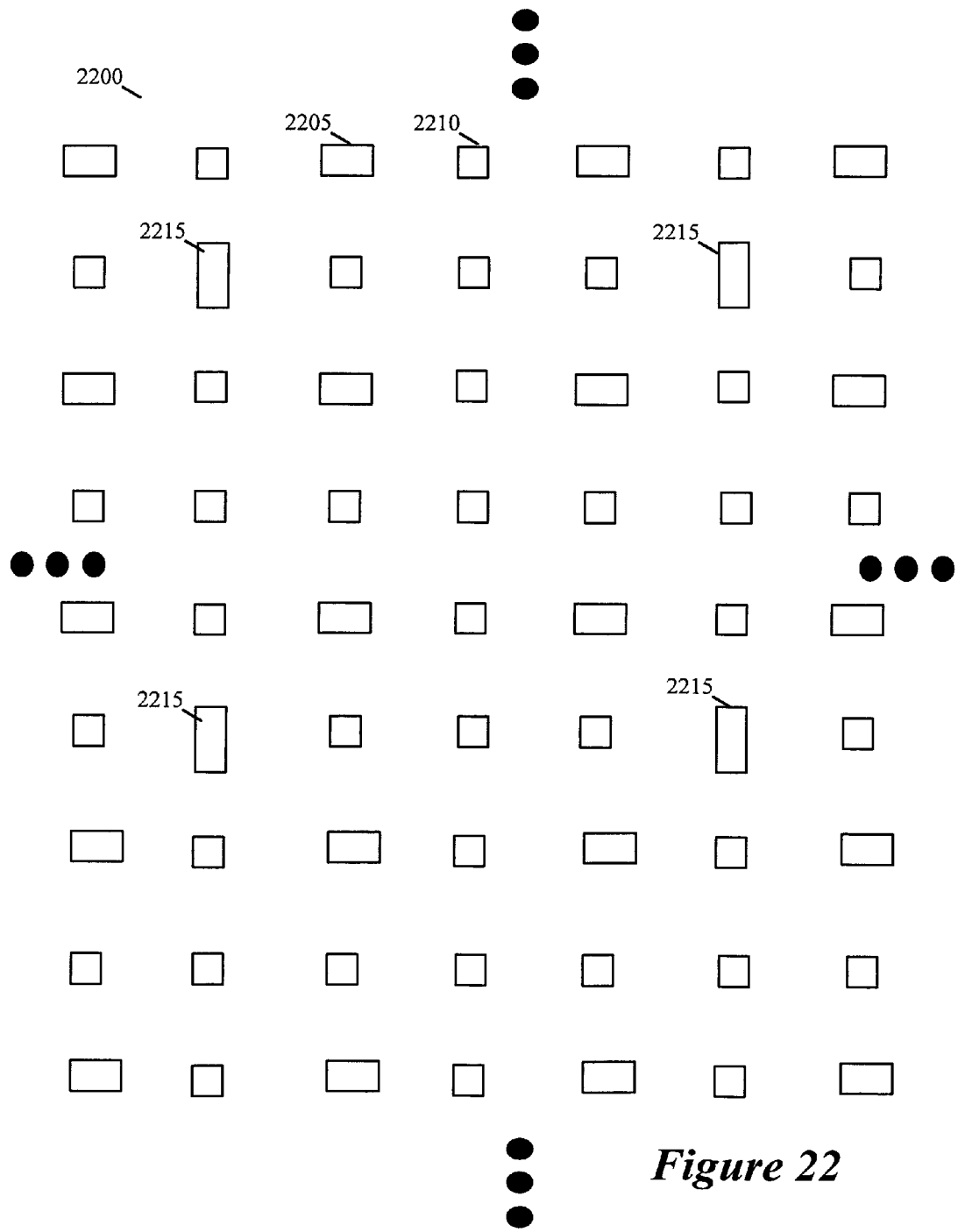
FIG. 22 illustrates an example of a circuit arrangement that includes numerous logic circuits, interconnect circuits, and HUMUX's.

FIG. 22 illustrates an example of a circuit arrangement 2200 that includes numerous logic circuits 2205, interconnect circuits 2210, and HUMUX's 2215. In some embodiments, some or all of the logic circuits and/or interconnect circuits are configurable circuits. The above-described HUMUX 900 of FIG. 9 is an example of an HUMUX that can be used as the HUMUX's 2215. The HUMUX 900 acts as a four-to-one multiplexer that passes one of its four data inputs 905 to its one data output 910 based on the value of two of the four signals that it receives along its four select lines 915. The HUMUX 900 receives two user-design signals and two configuration data bits on its four select lines. The four-to-two multiplexer 920 of this HUMUX passes two of these four signals to the two select terminals 940 of the four-to-one multiplexer 925 of the HUMUX, which, in turn, identify one of the four input signals 905 for the multiplexer 925 to output.

Accordingly, the HUMUX's operation (1) is completely controlled by the configuration data bits when the two signals supplied to the select terminals 940 are the configuration data bits, (2) is completely controlled by the user-design signals when the two signals supplied to the select terminals 940 are users signals, and (3) is partially controlled by the user-design signals when the two signals supplied to the select terminals 940 include one user-design signal and one configuration data bit.

As mentioned above, an HUMUX acts as a routing multiplexer when its operation is completely controlled by configuration data; otherwise, the HUMUX serves as a logic circuit. Hence, when the HUMUX 900 is used as an HUMUX 2215, the HUMUX 2215/900 acts as a routing multiplexer when the two signals supplied to the select terminals 940 are the configuration data bits stored in the configuration data elements 945. Otherwise, when at least one of the two signals supplied to the select terminals 940 is a user-design signal, the HUMUX 900 acts as a logic circuit.

It is advantageous to use HUMUX's in a circuit arrangement of a configurable IC, because they can be used to augment the routing resources in some cycles, while augmenting the computational resources in other cycles. Having such dual-use devices not only increases the flexibility of the design of the configurable IC, but also reduces the size of the IC by requiring fewer overall number of logic and interconnect circuits.

2. Hybrid Input-Select Multiplexer and Logic Circuit

An HUMUX can also be used as a hybrid input-select multiplexer and logic circuit in a circuit arrangement of a configurable IC. In a circuit arrangement, an input-select multiplexer is an interconnect circuit associated with a particular logic circuit in the arrangement. This interconnect circuit receives several input signals and passes a sub-set (e.g., one) of these input signals to its corresponding logic circuit. Accordingly, in some embodiments, an input-select multiplexer provides its output to only one logic circuit (i.e., has a fan out of 1), although this is not the case in all embodiments, as further discussed below.

Figure 23:
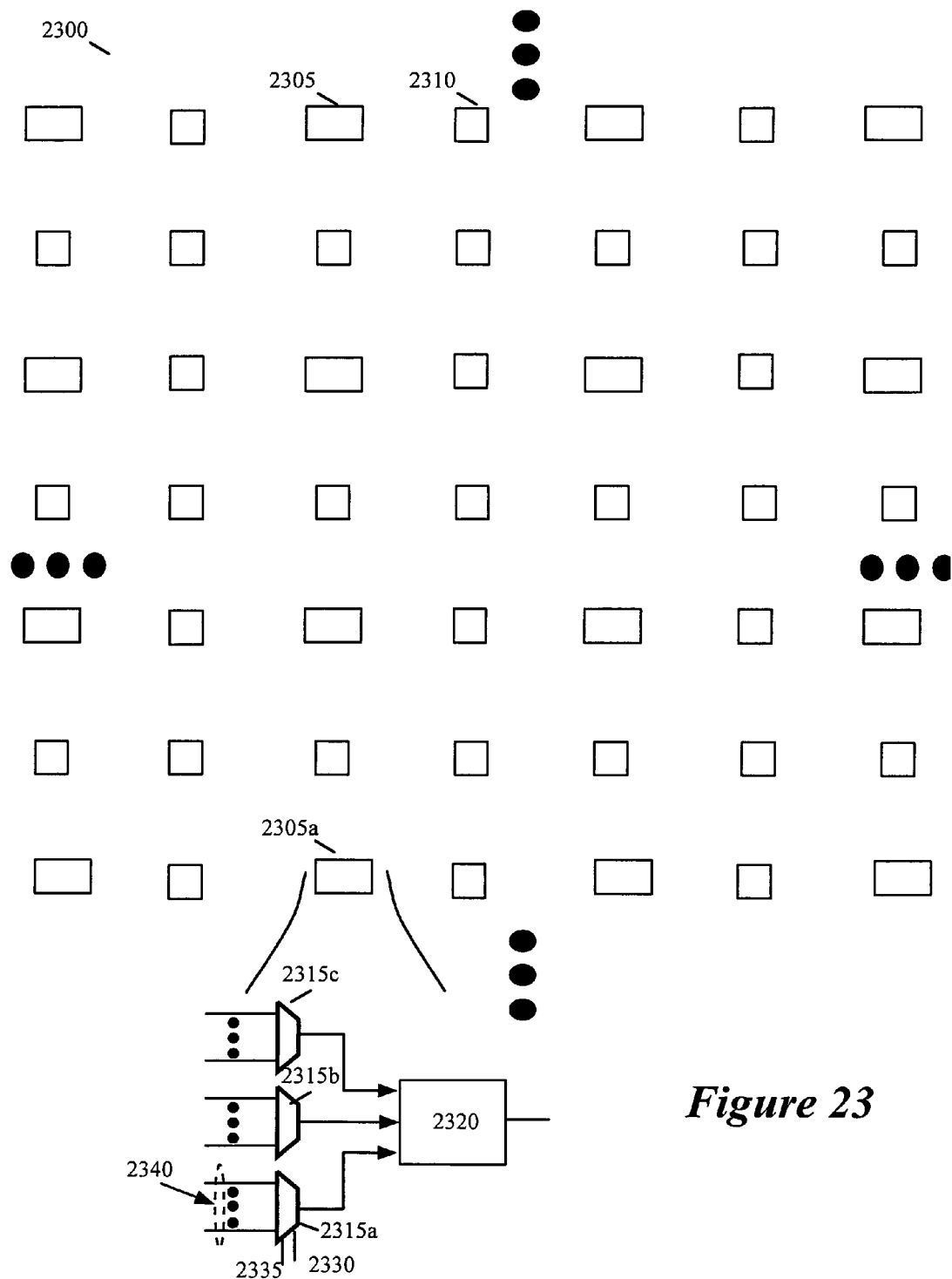
FIG. 23 illustrates an example of a circuit arrangement with numerous logic circuits and routing interconnect circuits.

One example of input-select multiplexers is presented in FIG. 23. This figure illustrates an example of a circuit arrangement 2300 with numerous logic circuits 2305 and routing interconnect circuits 2310. The interconnect circuits 2310 are responsible for relaying signals between logic circuits and/or other interconnect circuits. The logic circuits, on the other hand, are responsible for performing computations on their respective input signals. In some embodiments, some or all the interconnect and/or logic are configurable circuits.

As shown in FIG. 23, a logic circuit 2305a includes three input-select multiplexers 2315 and a core logic circuit 2320. The three input-select multiplexers 2315 receive input signals for the core logic circuit 2320. When operating as input-select multiplexers, these multiplexers pass a sub-set of the received input signals to the core logic circuit 2320, which performs a function on these input signals.

HUMUX's can be used for one or more of the input-select multiplexers 2315. Some embodiments have an HUMUX for only one of the input-select multiplexers 2315. An HUMUX acts as an input-select multiplexer (i.e., does not perform any computation and only serves to relay a signal to its associated logic circuit) when its operation is completely controlled by configuration data. For instance, when the HUMUX 900 of FIG. 9 is used as the HUMUX 2315a, the HUMUX 900 acts as an input-select multiplexer when the two signals supplied to the select terminals 940 are the configuration data bits stored in the configuration storage elements 945.

Otherwise, when the operation of the HUMUX is not completely controlled by configuration data, the HUMUX 2315a acts as a logic circuit. For instance, when the HUMUX 900 is used as an HUMUX 2315a, the HUMUX 900 acts as a logic circuit when at least one of the two signals supplied to the select terminals 940 is a user-design signal.

When such an HUMUX (i.e., an HUMUX at the input of a logic circuit) acts as a logic circuit, the HUMUX augments the computational abilities of the logic circuit. For instance, in the example illustrated in FIG. 23, lets assume that the core logic circuit 2320 is a three-input LUT that receives three inputs from three multiplexers 2315. Lets further assume that the four-to-one HUMUX 900 is used as the HUMUX 2315a at the input of the core logic circuit 2320. This HUMUX receives two user-signal bits 2330 and 2335 that would select one of the four inputs 2340 for output to the three-input LUT 2320.

The combination of the logic circuit formed by the three-input LUT 2320 and the HUMUX 2315a (acting as a logic circuit) serves as a four-input logic circuit. It is expected that such a four-input logic circuit would be capable of implementing as many as 50 of the 220 most prevalent four-input functions that a configurable logic circuit can perform. Such added functionality comes relatively inexpensively, as it only comes at the expense of the slightly larger size of the HUMUX as the input select multiplexer 2315. Also, such added functionality not only increases the flexibility of the design of the configurable IC, but also might reduce the overall size of the IC by requiring fewer overall number of logic circuits.

In some embodiments, an input-select multiplexer can have a fan out of greater than 1. In these embodiments, the input-select multiplexer still connects directly to one logic circuit so that it can select an input of this logic circuit. However, in these embodiments, the input-select multiplexer also can provide its output to other circuits in the circuit arrangement.

3. HUMUX's as Input-Select Multiplexers, Routing Muxes, and Logic Circuits

Figure 24:
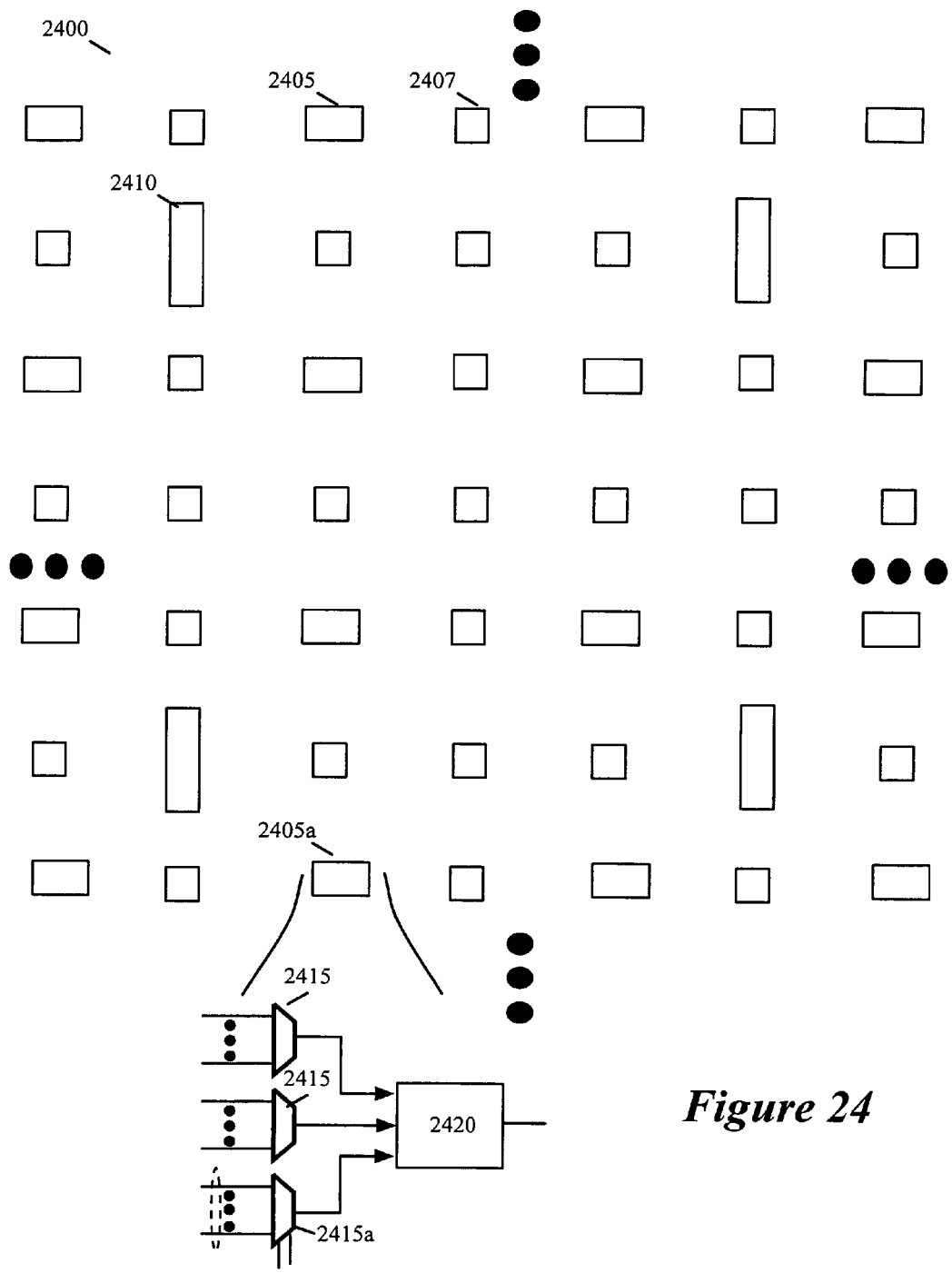
FIG. 24 illustrates a circuit arrangement that has numerous logic circuits and interconnect circuits arranged in numerous rows and columns.

The IC's of some embodiments have circuit arrangements that use HUMUX's as both input-select multiplexers and routing multiplexers. FIG. 24 illustrates one such embodiment. Specifically, this figure illustrates a circuit arrangement 2400 that has numerous logic circuits 2405 and interconnect circuits 2407 arranged in numerous rows and columns. This circuit arrangement 2400 also includes several HUMUX's as routing interconnect circuits 2410 and several HUMUX's 2415a as input select multiplexers 2415 of some logic circuits 2405a.

It is advantageous to use in a configurable IC HUMUX's as both input select multiplexers and routing interconnect multiplexers. This is because such HUMUX's allow the configurable IC to form very complex logic circuit structures relatively easily by supering logic and HUMUX circuits. Some embodiments, however, use HUMUX's only for input select multiplexers.

V. HUMUX Useful for Decomposing all Functions

HUMUX's are hybrid interconnect/logic circuits. In other words, as mentioned above, HUMUX's can serve as logic and interconnect circuits in a configurable IC. This hybrid quality is especially advantageous since, as logic circuits, HUMUX's can be used to decompose and implement functions. In order to decompose and implement functions with HUMUX's, some embodiments define one input of some or all HUMUX's to be a permanently inverting input.

More specifically, some embodiments use Shannon and Davio decomposition to decompose functions. Some embodiments use the multiplexer function of the HUMUX to implement the "if-then-else" (ITE) expression needed for a Shannon decomposition. Through this ITE expression, these embodiments implement the AND function and its NPN equivalents, where NPN stands for negate input, permute input, and negate output.

Figure 25:
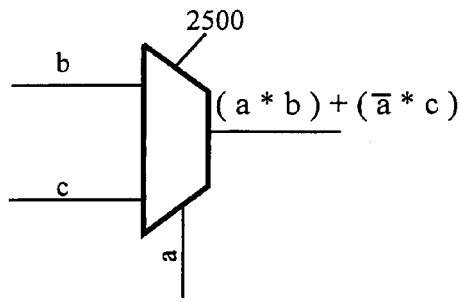
FIG. 25 illustrates a two-input multiplexer that receives variables "b" and "c" on its input lines and variable "a" on its select line.

FIGS. 25-30 illustrate how the multiplexer functionality of an HUMUX allows the HUMUX to implement the AND function and its NPN equivalents. Specifically, FIG. 25 illustrates a two-input multiplexer 2500 that receives variables "b" and "c" on its input lines and variable "a" on its select line. As shown in this figure, this multiplexer 2500 has an output (i.e., performs a function) that can be expressed as $[(a \cdot b) + (\overline{a} \cdot c)]$.

Figure 26:
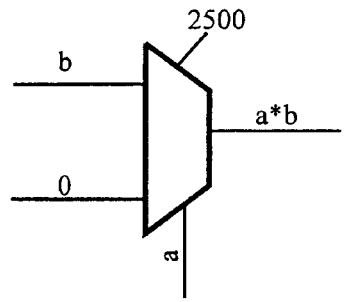
FIG. 26 illustrates that the multiplexer can perform the AND function by routing a binary 0 to its second input.
Figure 27:
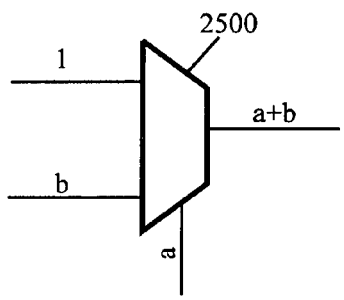
FIG. 27 illustrates that routing a binary 1 to the multiplexer's first input, allows the multiplexer to perform the OR function, which is one of the NPN equivalent functions of the AND function.

The multiplexer 2500 can be used to generate the AND function and its NPN equivalents by routing constants to one of the multiplexer inputs and/or performing NPN operations. For instance, FIG. 26 illustrates that the multiplexer can perform the AND function by routing a binary 0 to its second input. Similarly, FIG. 27 illustrates that routing a binary 1 to the multiplexer's first input, allows the multiplexer to perform the OR function, which is one of the NPN equivalent functions of the AND function.

Figure 28:
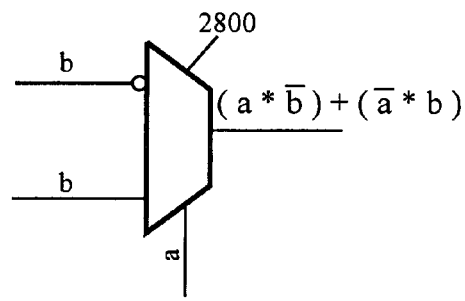
FIG. 28 illustrates a two-input multiplexer that implements an XOR function.

Like Shannon decomposition, Davio decomposition relies on the multiplexer functionality. However, unlike Shannon decomposition, Davio decomposition uses the XOR function to decompose a function. FIG. 28 illustrates a two-input multiplexer 2800 that implements an XOR function. As shown in this figure, the multiplexer 2800 has two inputs, one of which is permanently inverting. Both inputs of the multiplexer 2800 receives the same input signal "b", while this multiplexer's select line receives the input signal "a". Because of these input signals and the permanently inverting input, the multiplexer computes $[(a \cdot \overline{b}) + (\overline{a} \cdot b)]$, which is another representation of $(a \oplus b)$, i.e., of "a" XOR "b". The multiplexer 2800 can also compute NPN equivalents of the XOR function through NPN operations (i.e., through negating its inputs, permuting its inputs, and/or negating its output).

Figure 29:
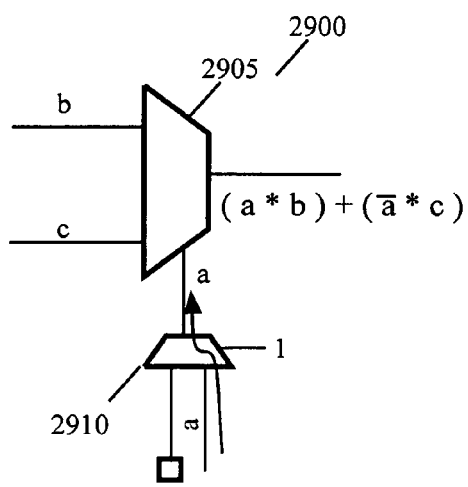
FIG. 29 illustrates an example of an HUMUX that has a core multiplexer that operates like the multiplexer of FIGS. 25-27 as it receives the user signal "a" through the select multiplexer

The multiplexers illustrated in FIGS. 25-28 can all be the core multiplexer of an HUMUX (e.g., a multiplexer like the four-to-one multiplexer 925 of the HUMUX 900 of FIG. 9). When the HUMUX acts as a logic circuit, this core multiplexer receives a user signal. For instance, FIG. 29 illustrates an example of an HUMUX 2900 that has a core multiplexer 2905 that operates like the multiplexer 2500 of FIGS. 25-27 as it receives the user signal "a" through the select multiplexer 2910.

Figure 30:
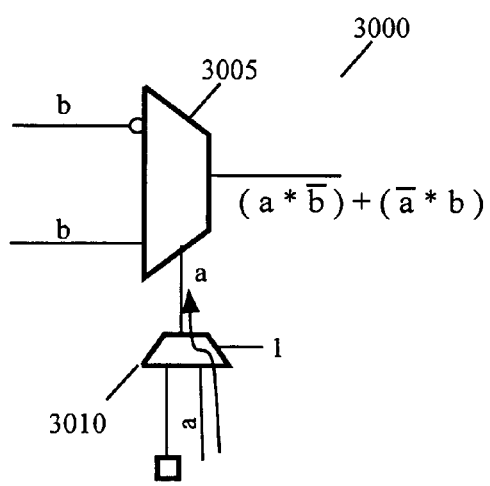
FIG. 30 illustrates another example of an HUMUX that has a core multiplexer that operates like the multiplexer of FIG. 28 as it receives the user signal "a" through the select multiplexer.

FIG. 30 illustrates another example of an HUMUX 3000 that has a core multiplexer 3005 that operates like the multiplexer 2800 of FIG. 28 as it receives the user signal "a" through the select multiplexer 3010. Like the multiplexer 2800, the core multiplexer 3005 has one permanently inverting input. One of ordinary skill will realize that other embodiments might obviate the need for a permanently inverting input in the core multiplexer of an HUMUX by routing inverted inputs to such a multiplexer.

Figure 31:
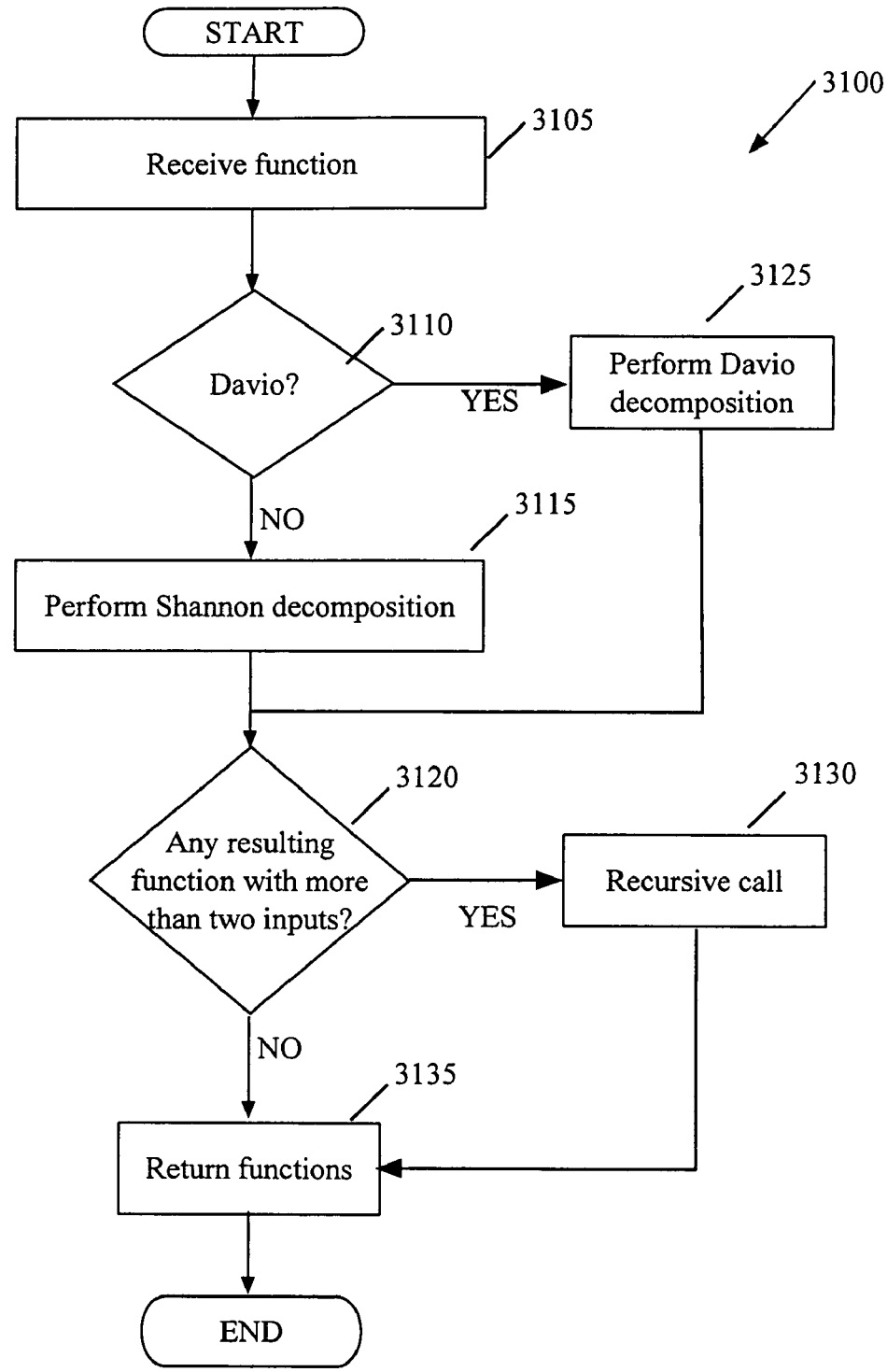
FIG. 31 illustrates a recursive process that a synthesizer can perform to decompose a function.

FIG. 31 illustrates a recursive process 3100 that a synthesizer can perform to decompose a function. This process uses a series of Shannon and/or Davio decompositions to decompose a function with more than two inputs into one or more functions with two inputs. The synthesizer can then implement each two-input function by the multiplexers illustrated in FIGS. 25-28 and their NPN equivalents.

As shown in FIG. 31, the process 3100 initially receives (at 3105) a function with more than two inputs. It then determines (at 3110) whether it should use Shannon or Davio decomposition to remove one variable from the received function, in order to decompose the function. In some embodiments, the process makes this determination by using commonly known techniques, such as sifting on ordered Kronecker Decision Diagrams. For instance, some of these techniques determine whether the received function is highly dependent on a variable that the process can determine (at 3110) to remove. If so, the process determines (at 3110) to use the Shannon decomposition to remove the variable. Otherwise, the process determines (at 3110) to use the Davio decomposition to remove the variable.

When the process determines (at 3110) to use the Shannon decomposition to remove the variable, the process transitions to 3115. At 3115, the process performs Shannon decomposition on the received function. The decomposition operation results in a new expression of the received function that is dependent on the removed variable and two functions that are not dependent on the removed variable. Equation (A) illustrates an example of a Shannon decomposition for a five variable function F(a,b,c,d,e).

$$F(a,b,c,d,e) = [\{a \cdot F_1(b,c,d,e)\} + \{\overline{a} \cdot F_0(b,c,d,e)\}]. \quad (A)$$

As expressed in Equation (A), the Shannon decomposition can decompose the five-variable function F(a,b,c,d,e) into two four-variable functions $F_1$ and $F_0$, which are individually AND'ed with the removed variable "a" and its complement, where the result of the AND operations are OR'ed together. After performing the Shannon decomposition at 3115, the process 3100 transitions to 3120, which will be described further below.

When the process determines (at 3110) to use the Davio decomposition to remove the variable, the process transitions to 3125. At 3125, the process performs Davio decomposition on the received function. This decomposition operation results in a new expression of the received function that is dependent on the removed variable and two functions that are not dependent on the removed variable.

There are two variations of Davio decomposition, a positive Davio decomposition and a negative Davio decomposition. Equation (B) illustrates an example of a positive Davio decomposition for the five variable function F(a,b,c,d,e).

$$F(a,b,c,d,e) = [\{a \cdot F_1(b,c,d,e)\} \oplus \{F_2(b,c,d,e)\}]. \quad (B)$$

where $$F_2(b,c,d,e) = F_1(b,c,d,e) \oplus F_0(b,c,d,e), \quad (C)$$

where $F_0$ and $F_1$ are identical in Equations (A), (B), and (C). As expressed in Equation (B), the positive Davio decomposition can decompose the five-variable function F(a,b,c,d,e) into two four-variable functions $F_1$ and $F_2$, with the first function $F_1$ AND'ed with the removed variable "a" and the result XOR'ed with the second function $F_2$.

Equation (D) illustrates an example of a negative Davio decomposition for the five variable function F(a,b,c,d,e).

$$F(a,b,c,d,e) = [\{a \cdot F_0(b,c,d,e)\} \oplus \{F_2(b,c,d,e)\}]. \quad (D)$$

where $F_0$ and $F_2$ are identical in Equations (A), (B), (C), and (D). As expressed in Equation (D), the negative Davio decomposition can decompose the five-variable function F(a,b,c,d, e) into two four-variable functions $F_0$ and $F_2$, with the first function $F_0$ AND'ed with the removed variable "a" and the result XOR'ed with the second function $F_2$.

After performing the Davio decomposition at 3125, the process 3100 transitions to 3120. At 3120, the process determines whether any of the functions that resulted from the decomposition (e.g., whether functions $F_0$, $F_1$, or $F_2$) has more than two variables. When the process determines (at 3120) that none of the resulting functions have more than two variables, the process returns (at 3135) the two-input functions that the process identified itself or identified through its recursive calls, and then ends. On the other hand, if the process determines (at 3120) that one or more of the resulting functions has more than two variables, the process recursively calls itself (at 3130) once for each of these functions. Once the process has received the result of its recursive call, it returns (at 3135) the two-input functions that the process identified itself or identified through its recursive calls, and then ends.

When the original function has been broken down into a series of two-input functions, the original function can be implemented by a series of HUMUX's that perform two-input function AND and/or XOR operations and their NPN equivalents. When an HUMUX has more than two input lines and more than one select line, the HUMUX can be reduced into a two input HUMUX by setting all the select lines except one to default values, which, in turn, renders all the inputs of the HUMUX irrelevant except two of its inputs.

The process 3100 decomposes a function into a series of two-input functions. It is not necessary, however, for the decomposition operation to decompose the function into a series of two-input functions. The end result of other decomposition processes might include functions with three or more variables. These more complex functions, in turn, can be implemented by using other logic circuits (e.g., three or four input LUT's) or using HUMUX's with more than two inputs.

As further described below, some embodiments use the HUMUX's as the input select multiplexers of configurable logic circuits (e.g., as two of the input select multiplexers of the three-input LUT's). These embodiments can have each configurable logic circuit and its associated set of HUMUX's to implement more complex m-input functions than the n-bit configurable logic circuit might otherwise be able to perform, where m is an greater than n. For instance, as further described below, some embodiments use three-input LUT's with three input-select interconnects. When two of the input-select interconnects are HUMUX's, one three input LUT and its two HUMUX might perform six input function (i.e., perform f(a,b,c,d,e,f) when (1) one HUMUX receives one input variable "a" along its input line (with the other input line receiving a 0, for example) and an input "b" (i.e., a user signal "b") along its select line, (2) one HUMUX receives two input variables "c" and "d" along its two input lines and an input "e" (i.e., a user signal "e") along its select line, (3) the LUT receives the outputs of the two HUMUX's along with another variable "f" from its third input select multiplexer.

Accordingly, the above-described process 3100 presents only one manner of decomposing a function. This process 3100 serves as an example of how a function with more than two variables can be decomposed through Shannon and/or Davio decomposition into a series of two input functions that can be implemented by HUMUX's.

Also, the discussion above focuses on using HUMUX's to decompose and implement complex functions. FUMUX's, however, can also be used to decompose and implement complex functions, by having some FUMUX's with at least one input that is a permanently inverting input or that receives an inverted version of another of its inputs. The advantage of using HUMUX's in an IC, however, is that HUMUX's can serve not only as logic circuits (that can decompose and implement complex functions) but can also server as interconnect circuits.

VI. Sub-cycle Reconfigurable HUMUX

Reconfigurable IC's are one type of configurable IC's. Reconfigurable IC's are configurable IC's that can reconfigure during runtime. In other words, a reconfigurable IC is an IC that has reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it receives a different set of configuration data. Some embodiments of the invention are implemented in reconfigurable IC's that are sub-cycle reconfigurable (i.e., can reconfigure circuits on a sub-cycle basis).

In some embodiments, runtime reconfigurability means reconfiguring without resetting the reconfigurable IC. Resetting a reconfigurable IC entails in some cases resetting the values stored in the state elements of the IC, where state elements are elements like latches, registers, and non-configuration memories (e.g., memories that store the user signals as opposed to the memories that store the configuration data of the configurable circuits). In some embodiments, runtime reconfigurability means reconfiguring after the reconfigurable IC has started processing of the user data. Also, in some embodiments, runtime reconfigurability means reconfiguring after the reconfigurable IC has powered up. These definitions of runtime reconfigurability are not mutually exclusive.

FIGS. 32-36 illustrate a more detailed example of an HUMUX 3200 of some embodiments of the invention. This example is a sub-cycle reconfigurable HUMUX that is implemented in complementary pass logic (CPL) for a sub-cycle reconfigurable IC. In a CPL implementation of a circuit, a complementary pair of signals represents each logic signal, where an empty circle at the input or output of a circuit denotes the complementary input or output of the circuit in the figures. In other words, the circuit receives true and complement sets of input signals and provides true and complement sets of output signals. A sub-cycle reconfigurable IC is an IC that has reconfigurable circuits that can receive configuration data sets on a sub-cycle basis and therefore can reconfigure on a sub-cycle basis. Examples of sub-cycle reconfigurable circuits are disclosed in U.S. Patent Application entitled "Configurable IC with Interconnect Circuits that also Perform Storage Operations", which is filed concurrently with the present application, with the Ser. No. 11/081,859. This application is incorporated herein by reference.

Figure 32:
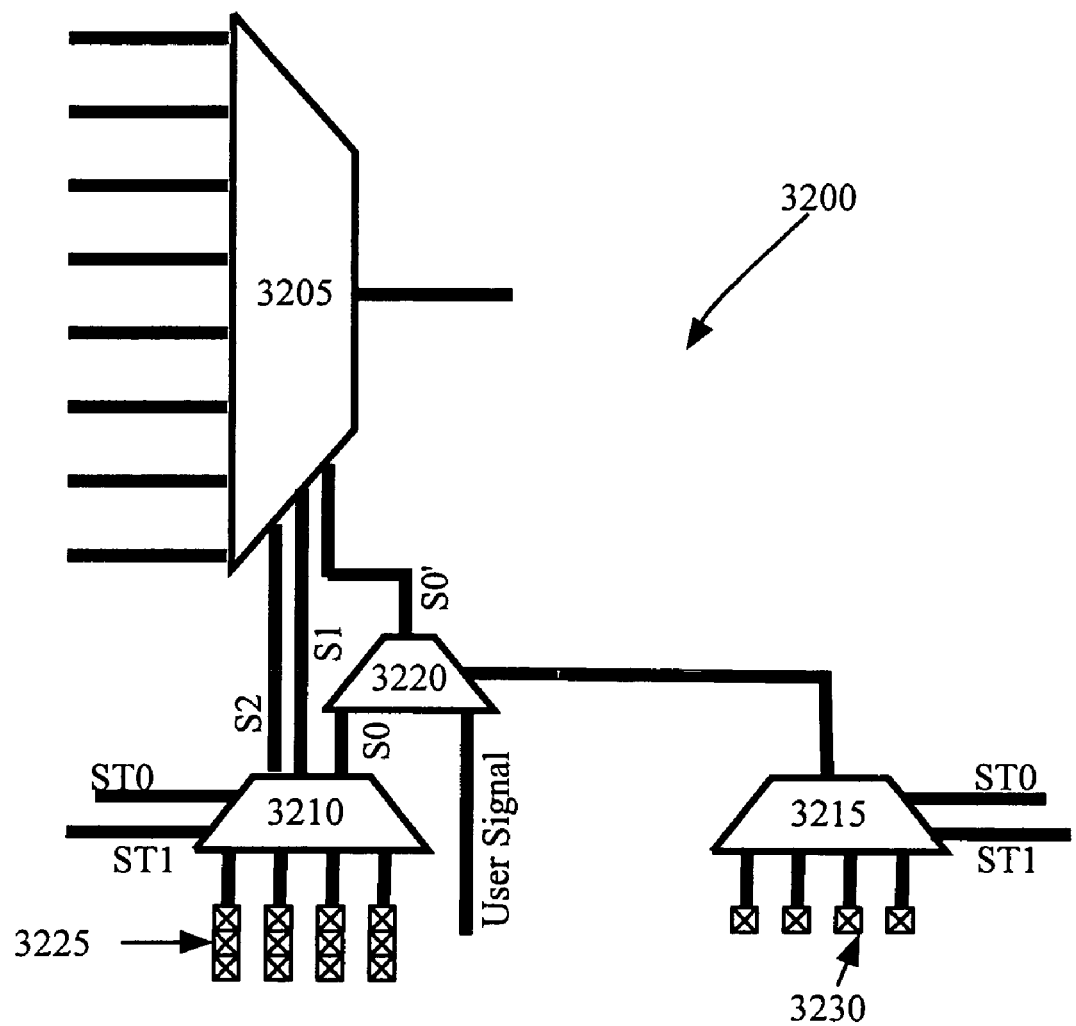
FIG. 32 illustrates an eight-to-one HUMUX that is formed by four multiplexers.

As shown in FIG. 32, the HUMUX 3200 is an eight-to-one HUMUX that is formed by four multiplexers 3205, 3210, 3215, and 3220. The inputs and outputs of these multiplexers are shown as thick lines to indicate that each of these lines represents a CPL true/complement pair of lines.

As shown in FIG. 32, the multiplexer 3205 is an eight-to-one multiplexer that, on a sub-cycle basis, connects one of its input lines to its output line based on the values of the signals S2, S1, and S0', which it receives along its three select lines. In response to three signals ST0, ST1, and CLK (which is not illustrated in FIG. 32), the multiplexer 3210 supplies two of the select signals S2 and S1 to the multiplexer 3205 on a sub-cycle basis. Specifically, based on the signals ST0 and ST1 that it receives on its select lines, the multiplexer 3210 connects one of its four three-bit input lines (each of which connects to a storage element 3225 that stores configuration data) to its three output lines. Hence, the three output lines of multiplexer 3210 provide three configuration select signals S2, S1, and S0. Two of these output lines connect to the third and second select lines of the multiplexer 3205, in order to provide the select signals S2 and S1.

The first output line of the multiplexer 3210 carries the first select signal S0. This output line connects to one of the two input lines of the multiplexer 3220. The other input line of the multiplexer 3220 receives a user signal. Through its two input lines, the multiplexer 3220 receives two inputs on a sub-cycle basis. Based on the signal that it receives on a sub-cycle basis on its select line from the multiplexer 3215, the multiplexer 3220 supplies one of its two inputs to its output line. This output line connects to the first select line of the multiplexer 3205 to provide the select signal S0'. Hence, the signal S0' is a signal that in each sub-cycle might be either a user signal or configuration-driven select signal S0.

Which of these signals gets routed to the multiplexer 3205 as the select signal S0' depends on the value of the configuration data output from the multiplexer 3215 on a sub-cycle basis. The multiplexer 3215 is a four-to-one multiplexer that (1) has its four inputs connected to four storage elements storing four configuration data bits, and (2) has one output that receives one of the four configuration data bits in each sub-cycle based on the signals ST0 and ST1 supplied to the select lines of the multiplexer 3215.

Figure 33:
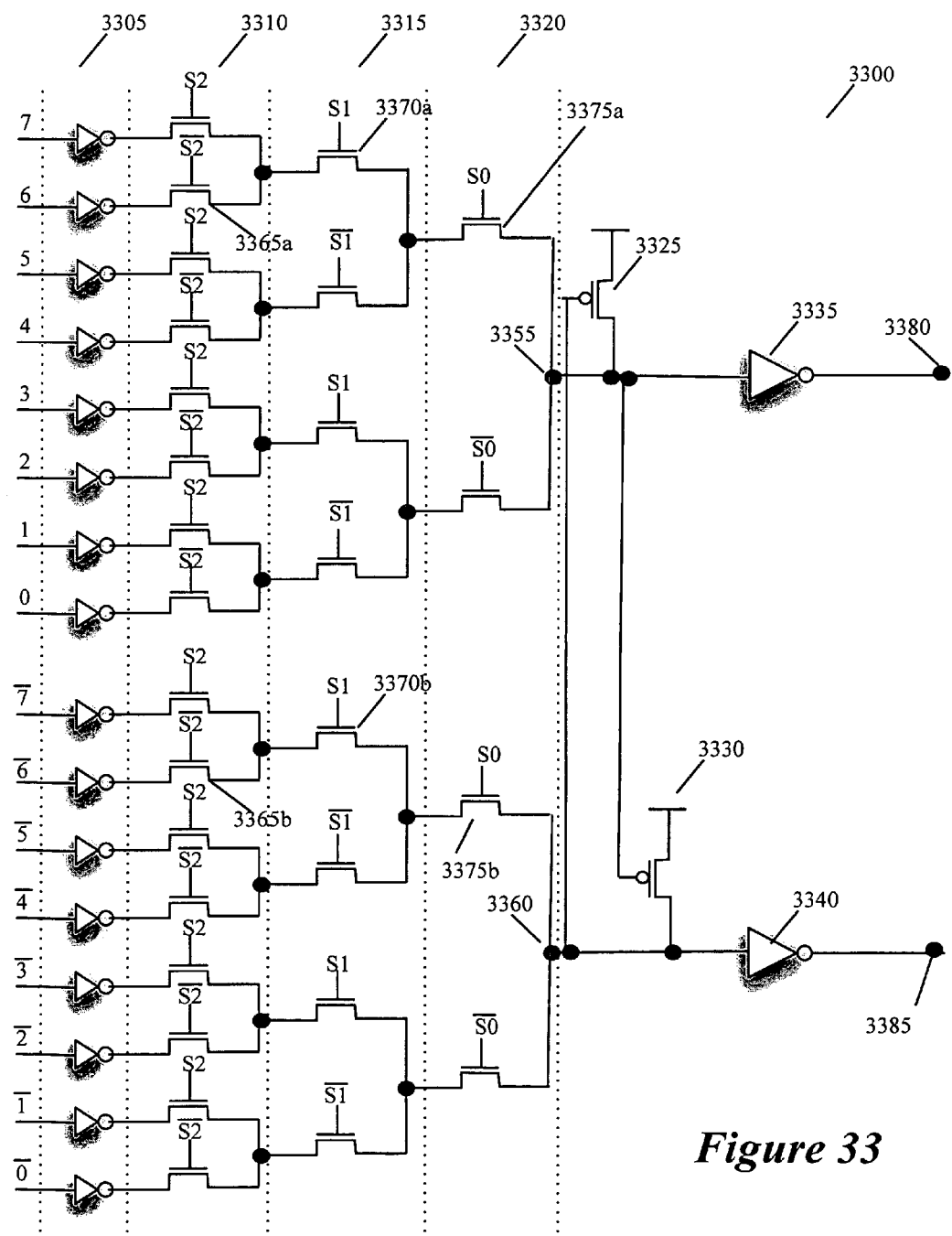
FIG. 33 illustrates a multiplexer that is used as the multiplexer in FIG. 32.

FIG. 33 illustrates a multiplexer 3300 that in some embodiments is used as the multiplexer 3205. As shown in FIG. 33, the multiplexer 3300 includes one set of input buffers 3305, three sets of pass transistors 3310, 3315, and 3320, two pull-up PMOS transistors 3325 and 3330, and two output buffers 3335 and 3340. One subset of the input buffers 3305 receives eight input bits (0-7), while another subset of the input buffers 3305 receives the complement of the eight input bits (i.e., receives $\overline{0}$-$\overline{7}$). These input buffers serve to buffer the first set 3310 of pass transistors.

The first set 3310 of pass transistors receive the third select bit S2 or the complement of this bit, while the second set 3315 of pass transistors receive the second select bit S1 or the complement of this bit. The third set 3320 of pass transistors receive the first select bit S0' or its complement. The three select bits S2, S1, and S0 cause the pass transistors to pass one of the input bits and the complement of this input bit to two intermediate output nodes 3355 and 3360 of the circuit 3300. For instance, when the enable signal is low, and the select bits are 011, the pass transistors 3365a, 3370a, 3375a, and 3365b,  3370b, and 3375b turn on to pass the 6 and $\overline{6}$ input signals to the intermediate output nodes 3355 and 3360.

The pull-up PMOS transistors 3325 and 3330 are used to pull-up quickly the intermediate output nodes 3355 and 3360, and to regenerate the voltage levels at the nodes that have been degenerated by the NMOS threshold drops, when these nodes need to be at a high voltage. In other words, these pull-up transistors are used because the NMOS pass transistors are slower than PMOS transistors in pulling a node to a high voltage. Thus, for instance, when the $6^{th}$ input signal is high, the enable signal is low, and the select bits are 011, the pass transistors 3365-3375 start to pull node 3355 high and to push node 3360 low. The low voltage on node 3360 turns on the pull-up transistor 3325, which, in turn, accelerates the pull-up of node 3355.

The output buffer inverters 3335 and 3340 are used to allow the circuit 3300 to drive a load. These buffers are formed by more than one inverter in some embodiments. The outputs of these buffers are the final output 3380 and 3385 of the multiplexer 3300. It should be noted that, in some embodiments, the output buffers 3335 and 3340 are followed by multiple inverters.

Although FIG. 32 conceptually illustrates the multiplexer 3220 as a separate multiplexer that is after the multiplexer 3210, some embodiments implement the multiplexer 3220 as part of a multiplexer structure that is used to define the multiplexer 3210. In some embodiments, the multiplexer 3210 of FIG. 32 is formed by three multiplexer structures. One structure is used to generate the third select signal S2, the other structure is used to generate the second select signal S1, and the last structure is used to generate the first select signal S0'.

Figure 34:
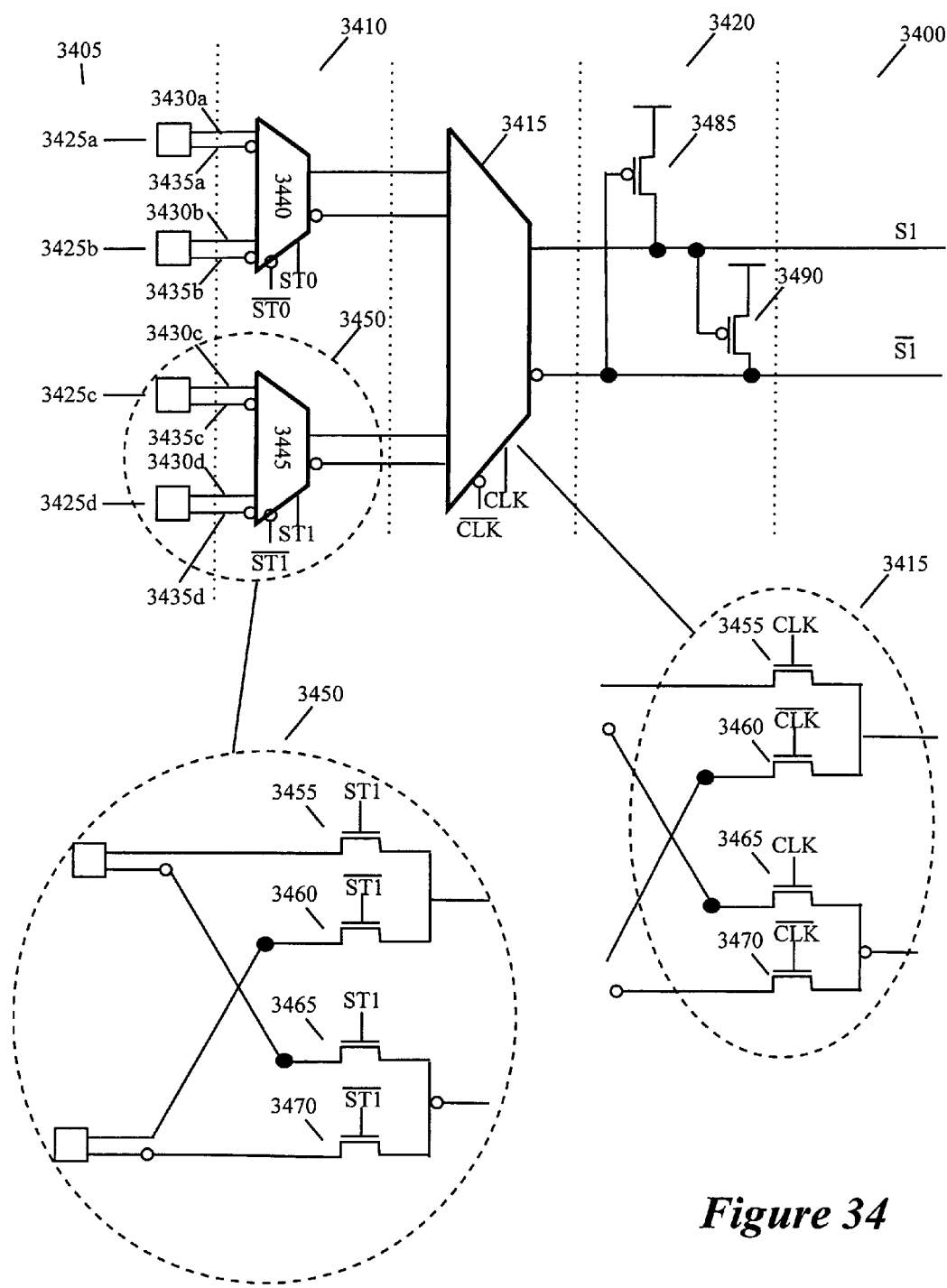
FIG. 34 illustrates a CPL implementation of a two-tier multiplexer structure for generating the second signal S1 and its complement.

FIG. 34 illustrates a CPL implementation of a two-tier multiplexer structure 3400 for generating the second signal S1 and its complement. The multiplexer structure for generating the third select signal S2 is identical to the structure 3400. In addition, an identical circuit can be used to implement the multiplexer 3215 of FIG. 32. The multiplexer structure 3400 is a two-tiered multiplexer structure, where one tier of multiplexers is driven by the signals ST0 and ST1, while the other tier of multiplexers are driven by the clock signal CLK that operates at twice the rate of the signals ST0 and ST1, as further described below.

As illustrated in FIG. 34, the select signal generation circuit 3400 can be divided into four sections, which are (1) storage cell section 3405, (2) first two-to-one multiplexer section 3410, (3) second two-to-one multiplexer section 3415, and (4) pull-up PMOS transistor sections 3420. The first section 3405 includes four storage cells 3425a-3425d that store four configuration bits for four sub-cycles. In other words, each storage cell provides a configuration bit 3430 and the complement of this bit 3435, where each such pair of bits provides the select bit signal S1 and its complement during a particular sub-cycle.

The second section includes two multiplexers 3440 and 3445 that are driven by two signals ST0 and ST1 that are offset by 90°, and the differential complement $\overline{ST0}$ and $\overline{ST1}$ of these signals. The third section is one two-to-one multiplexer 3415 that is driven by the clock signal CLK and its differential complement $\overline{CLK}$.

Figure 35:
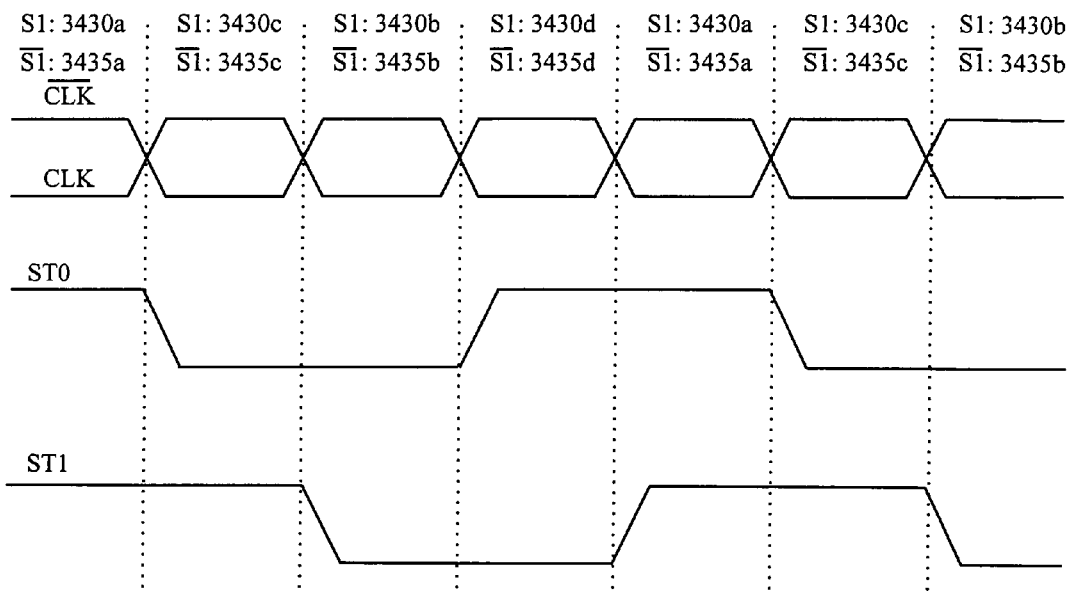
FIG. 35 illustrates an example of the signals CLK, ST0, and ST1.

FIG. 35 illustrates an example of the signals CLK, ST0, and ST1. Some embodiments use the multiplexer/storage circuit 3300 and the select-signal generator 3400 in a configurable IC that implements a design that has a primary clock rate of X MHZ (e.g., 200 MHZ) through a four sub-cycle implementation that effectively operates at 4X MHZ. In some of these embodiments, the two signals ST0 and ST1 would operate at X MHZ, while the clock signal CLK would operate at 2X MHZ.

The fourth section 3420 includes two pull-up PMOS transistors 3485 and 3490, which are used to quickly pull-up the output of the multiplexer 3415 that is high. The two complementary outputs of the multiplexer 3415 provide the select signal S1 and its complement. The S1 select signal and its complement drive the pass transistor set 3315 in FIG. 33.

FIG. 34 illustrates one possible implementation 3450 of the multiplexer 3445 and the connections of this multiplexer 3445 and the storage cells 3425c and 3425d. As shown in this figure, the multiplexer 3445 can be implemented by four pass transistors, where two transistors 3455 and 3460 receive the true configuration bits 3430c and 3430d from the third and fourth storage cells 3425c and 3425d, while the other two transistors 3465 and 3470 receive the complement configuration bits 3435c and 3435d from the third and fourth storage cells. As further shown, transistors 3455 and 3465 are driven by signal ST1, while transistors 3460 and 3470 are driven by the complement $\overline{ST1}$ of signal ST1. A similar implementation can be used for multiplexer 3440. However, the pass transistors 3455-3470 of the multiplexer 3440 would be driven by the signal ST0 and its complement $\overline{ST0}$.

FIG. 34 also illustrates one possible implementation of the two-to-one multiplexer 3415. This implementation is similar to the implementation 3450 of the multiplexer 3445. However, instead of the signal ST1, the pass transistors 3455-3470 of the multiplexer 3415 are driven by the CLK and $\overline{CLK}$ signals. Also, these transistors receive a different set of signals. Specifically, the transistors 3455 and 3465 of the multiplexer 3415 receive the true and complement outputs of the multiplexer 3440, while the transistors 3460 and 3470 of the multiplexer 3415 receive the true and complement outputs of the multiplexer 3445.

The transistors 3455 and 3465 of the multiplexer 3445 (1) output the true and complement configuration bits stored in the storage cells 3425c when the signal ST1 is high, and (2) output the true and complement configuration bits stored in the storage cells 3425d when the signal ST1 is low. Similarly, the transistors 3455 and 3465 of the multiplexer 3440 (1) output the true and complement configuration bits stored in the storage cells 3425a when the signal ST0 is high, and (2) output the true and complement configuration bits stored in the storage cells 3425b when the signal ST0 is low. Finally, the transistors 3455 and 3465 of the multiplexer 3415 (1) output the true and complement output bits of the multiplexer 3440 when the clock CLK is high, and (2) output the true and complement output bits of the multiplexer 3445 when the clock signal CLK is low.

Given the above-described operations of multiplexers 3440, 3445, and 3415, and given the 90° offset between signals ST0 and ST1 and the faster frequency of the clock signal CLK, FIG. 35 illustrates the value of the select signal S1 and its complement that the circuit 3400 generates during each half-cycle of the clock signal CLK. This clocking scheme hides all the timing of the selection of the configuration bits from the storage cells 3425 behind the two-to-one multiplexer 3415. For instance, while the multiplexer 3440 is switching between outputting the configuration bits stored in cell 3425a and the bits stored in cell 3425b, the clocking scheme directs the multiplexer 3415 to output the configuration bits previously selected by the multiplexer 3445 (i.e., the configuration bits stored in cell 3425c). Similarly, while the multiplexer 3445 is switching between outputting the configuration bits stored in cell 3425c and the bits stored in cell 3425d, the clocking scheme directs the multiplexer 3415 to output the configuration bits previously selected by the multiplexer 3440 (i.e., the configuration bits stored in cell 3425b).

When implementing a design that has a primary clock rate of X MHZ through a four sub-cycle implementation that effectively operates at 4X MHZ, this clocking scheme allows the configuration bits to be read from the storage cells at an effective rate of 4X MHZ without the need for a 4X MHZ clock. Some embodiments globally distribute the differential pair of CLK and $\overline{CLK}$ signals, while locally generating the differential signals ST0, $\overline{ST0}$, ST1, and $\overline{ST1}$. Examples of such distribution and generation are further described in U.S. Patent Application entitled "Configurable IC with Interconnect Circuits that also Perform Storage Operations", which was incorporated above.

Figure 36:
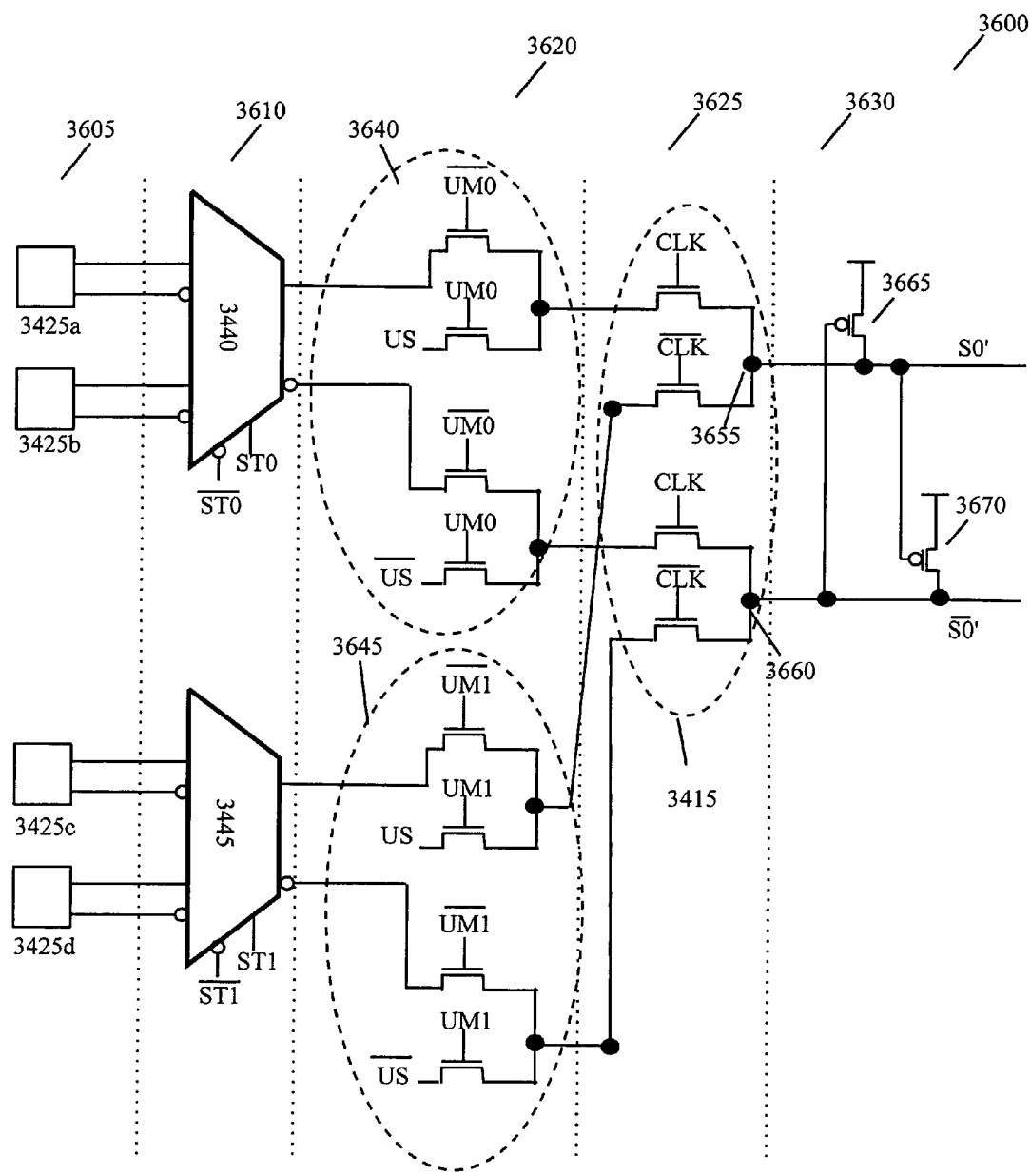
FIG. 36 illustrates a circuit implementation of the combined multiplexer structure.

As mentioned above, FIG. 32 conceptually illustrates the multiplexer 3220 as a separate multiplexer that is after the multiplexer 3210. However, some embodiments implement the multiplexer 3220 in conjunction with the multiplexer structure of the multiplexer 3210 that is used to generate the signal S0 and its complement. FIG. 36 illustrates a CPL implementation of this combined multiplexer structure 3600 of some embodiments.

This multiplexer structure 3600 outputs the select signal S0', which is provided to the first select line of the multiplexer 3205. The circuit 3600 illustrated in FIG. 36 can be divided into five sections, which are (1) storage cell section 3605, (2) first two-to-one multiplexer stage 3610, (3) a second two-to-one multiplexer stage 3620, (4) a third two-to-one multiplexer section 3625, and (5) a second pull-up transistor stage 3630.

The storage cell section 3605 is identical to the storage cell section 3405 of the circuit 3400 of FIG. 34, with the exception that the storage cells in FIG. 36 store configuration bits for the first select signal S0, instead of storing configuration bits for the second select signal S1. In other words, each storage cell 3425 provides a configuration bit 3430 and the complement of this bit 3435, where each such pair of bits provides the select bit signal S0 and its complement during a particular sub-cycle.

The second section 3610 includes two multiplexers 3440 and 3445 that are identical to the two multiplexers 3440 and 3445 of the circuit 3400 of FIG. 34. As in circuit 3400, the multiplexers 3440 and 3445 are for outputting the configuration bits from cells 3425a, 3425b, 3425c, and 3425d. The outputs of the second section 3610 can be tied to four pull-up PMOS transistors, which can quickly pull-up the outputs of the multiplexers 3440 and 3445 that are high. Some embodiments, on the other hand, might not include such pull-up PMOS transistors.

The third section 3620 includes two two-to-one multiplexers 3640 and 3645 that select respectively between the output of the multiplexer 3440 and the user signal US, and between the output of the multiplexer 3445 and the user signal US, based on the output UM and $\overline{UM}$ of the multiplexer 3215. As mentioned above, the output of the multiplexer 3215 specifies whether the select signal S0' should be the user signal or the select signal S0 stored in the configuration data cell for the current sub-cycle.

The fourth section 3625 is one two-to-one multiplexer 3415 that is driven by a clock signal CLK, which operates at twice the frequency of the signals ST0 and ST1. The signals ST0, ST1, and CLK are illustrated in FIG. 35, as described above. Also, as mentioned above, the use of the two-to-one multiplexer 3415 and the signals CLK, ST0, and ST1 and their differential complements, hides all the timing of the selection of the configuration bits from the storage cells 3425 behind the two-to-one multiplexer 3415.

The fifth section 3630 includes two pull-up transistors 3665 and 3670 that are used to pull-up quickly the output nodes 3655 and 3660 of the fourth section 3625, and to regenerate the voltage levels at the nodes that have been degenerated by the NMOS threshold drops, when these nodes need to be at a high voltage. The nodes 3655 and 3660 provide the first select signal S0' and its complement for the first select line of the multiplexer 3205.

VII. Alternate Implementation of an HUMUX

Figure 37:
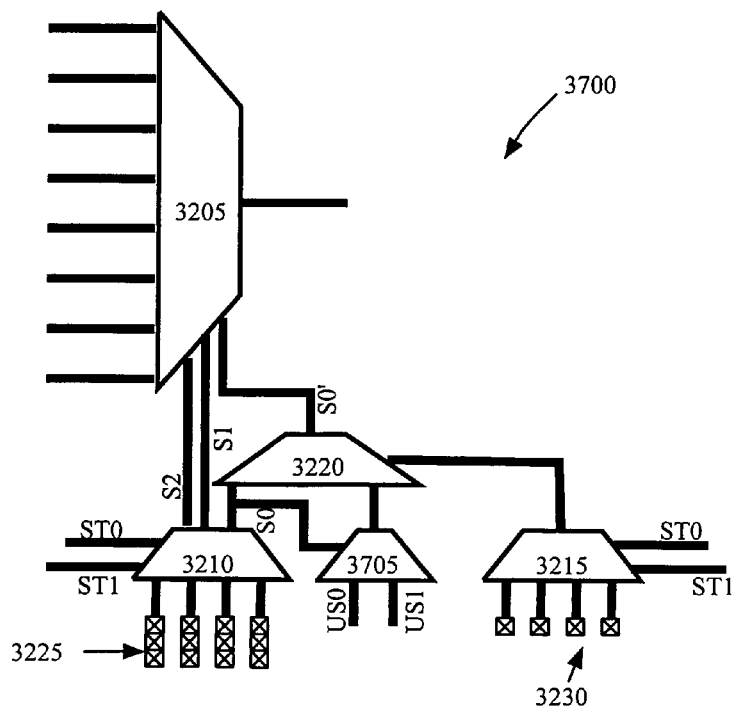
FIG. 37 illustrates another implementation of an HUMUX, which can operate based on a configuration-derived select signal S0, a first user signal US0, or a second user signal US1.

In the HUMUX 3200, the first select line of the multiplexer 3205 can configurably receive either a configuration-derived select signal S0 or a user signal. Hence, the operation of the HUMUX 3200 can be based either on the configuration-derived select signal S0 or on the user signal. FIG. 37 illustrates another implementation of an HUMUX, which can operate based on a configuration-derived select signal S0, a first user signal US0, or a second user signal US1. Specifically, in the HUMUX 3700 of this figure, the first select line of the multiplexer 3205 can configurably receive either the configuration-derived select signal S0, the first user signal US0, or the second user signal US1.

The HUMUX 3700 is identical to the HUMUX 3200 except that the HUMUX 3700 also includes a multiplexer 3705. This multiplexer 3705 provides the HUMUX 3700 with the ability to supply the first select line of the multiplexer 3205 with one of two user signals US0 and US1, in addition to the select signal S0 output from the multiplexer 3210. In particular, the multiplexer 3705 receives the two user signals US0 and US1 as input signals. It also receives the select signal S0 along its select line. Based on the value of the select signal S0, the multiplexer 3705 routes one of the two user signals US0 and US1 to the multiplexer 3220, which also receives the select signal S0 as one of its input signals. Based on the value that the multiplexer 3220 receives on its select line, the multiplexer 3220 then outputs as select signal S0' either the select signal S0 or the user signal that it receives. The select signal S0' then drives the first select line of the multiplexer 3205 as described above.

FIG. 37 conceptually illustrates the multiplexer 3705, 3220, and 3210 as separate multiplexers. However, some embodiments implement the two multiplexers 3705 and 3220 in conjunction with the multiplexer structure of the multiplexer 3210 that is used to generate the signal S0 and its complement.

Figure 38:
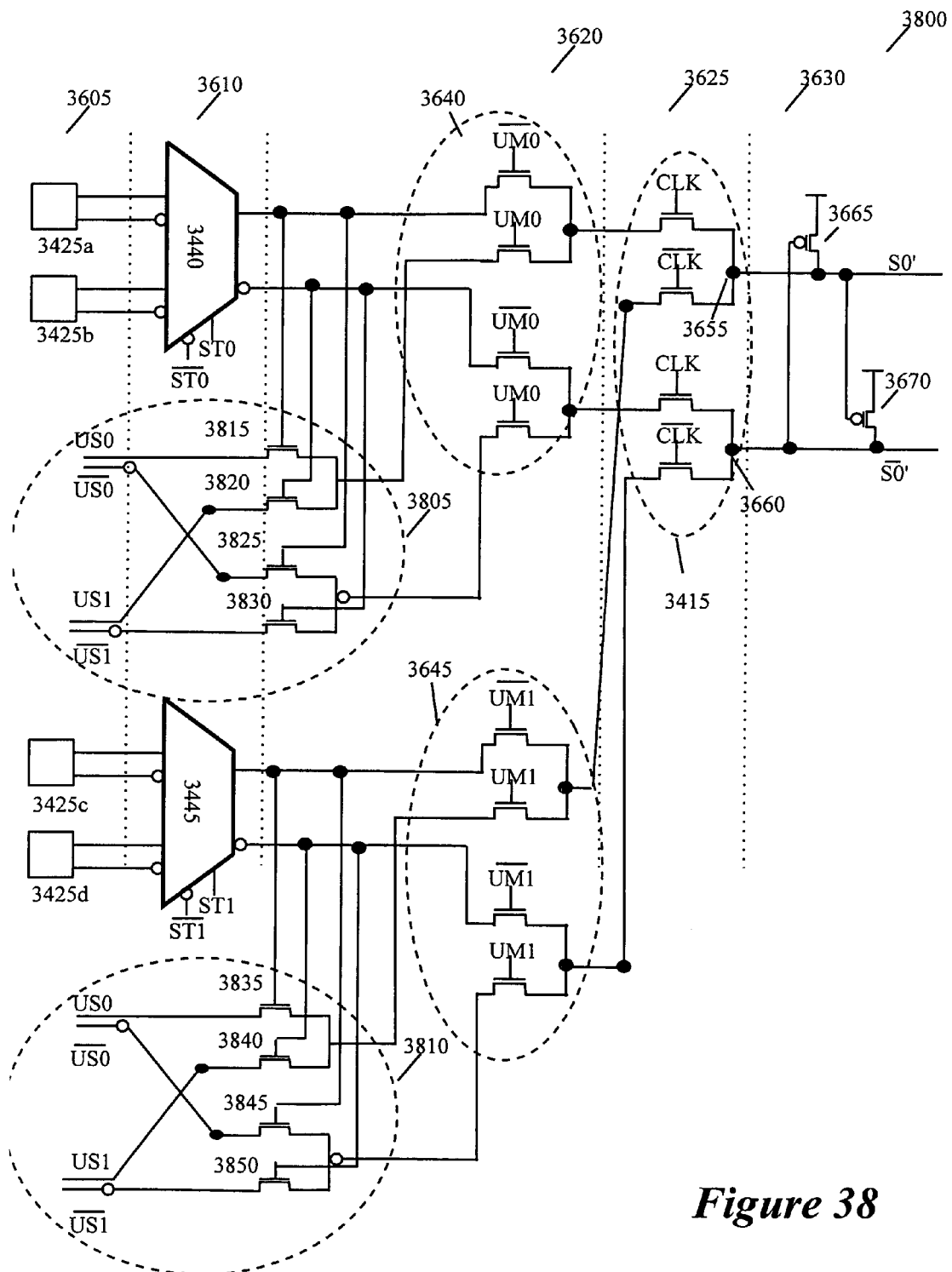
FIG. 38 illustrates a circuit implementation of the combined multiplexer structure of FIG. 37.

FIG. 38 illustrates a CPL implementation of this combined multiplexer structure 3600 of some embodiments. This combined multiplexer structure is identical to the combined multiplexer structure 3600 of FIG. 36, except that the multiplexer structure 3600 also includes 2 two-to-one multiplexers 3805 and 3810.

The multiplexer 3805 selects between the user signals US0 and US1 based on the output of the multiplexer 3440, while the multiplexer 3810 selects between the user signals US0 and US1 based on the output of the multiplexer 3445. Each multiplexer includes two transistors (3815 and 3825, or 3835 and 3845) that receive the user signals US0 and its complement, and two transistors (3820 and 3830, or 3840 and 3850) that receive the user signals US1 and its complement. The transistors that receive the user signal US0 and its complement are driven by the true output of the multiplexer 3440 or 3445, while the transistors that receive the user signal US1 and its complement are driven by the complement output of the multiplexer 3440 or 3445.

The true and complement outputs of each two-to-one multiplexer 3805 and 3810 is supplied to the two-to-one multiplexers 3640 and 3645 of the third section 3620. These multiplexers then select respectively between the output of the multiplexer 3440 and the user signal (US0 or US1) supplied by the multiplexer 3805, and between the output of the multiplexer 3445 and the user signal (US0 or US1) supplied by the multiplexer 3810. The selection of these multiplexers 3640 and 3645 are based on the output UM and $\overline{UM}$ of the multiplexer 3215, which specifies whether the select signal S0' should be the user signal or the select signal S0 stored in the configuration data cell for the current sub-cycle.

Several embodiments were described above by reference to examples of sub-cycle reconfigurable circuits that operate based on four different sets of configuration data. In some of these examples, a reconfigurable circuit receives its four different configuration data sets sequentially in an order that loops from the last configuration data set to the first configuration data set. Such a sequential reconfiguration scheme is referred to as a 4 "loopered" scheme.

Other embodiments, however, might be implemented as six or eight loopered sub-cycle reconfigurable circuits. In a six or eight loopered reconfigurable circuit, a reconfigurable circuit receives six or eight configuration data sets in an order that loops from the last configuration data set to the first configuration data set. Several examples of how to make a four loopered circuit into a six and eight loopered circuit and the clocking scheme for such circuits are described in the above mentioned U.S. Patent Application entitled "Configurable IC with Interconnect Circuits that also Perform Storage Operations", which is filed concurrently with the present application, with the Ser. No. 11/081,859.

VIII. Alternative Two Tiered Structura for Retrieving Data

Several circuits described above utilize a two-tiered structure for retrieving data (e.g., configuration data, etc.) on a sub-cycle basis. Examples of such circuits are the circuits illustrated in FIGS. 34, 36, and 38. These circuits employ multiple storage elements 3425 that store multiple sets of data for multiple sub-cycles. They also include two tiers of multiplexers, where two two-to-one multiplexers (e.g., 3440 and 3445) form the first tier and one two-to-one multiplexer (e.g., 3415) forms the second tier. In some circuits, the two tiers of multiplexers have intervening circuits between them, such as AND'ing transistors or gates, etc. The second-tier multiplexer runs at the clock rate CLK, while the first-tier multiplexers runs at half that rate. From the storage elements, these multiplexers together output data at a sub-cycle rate that is twice the clock rate CLK.

Figure 39:
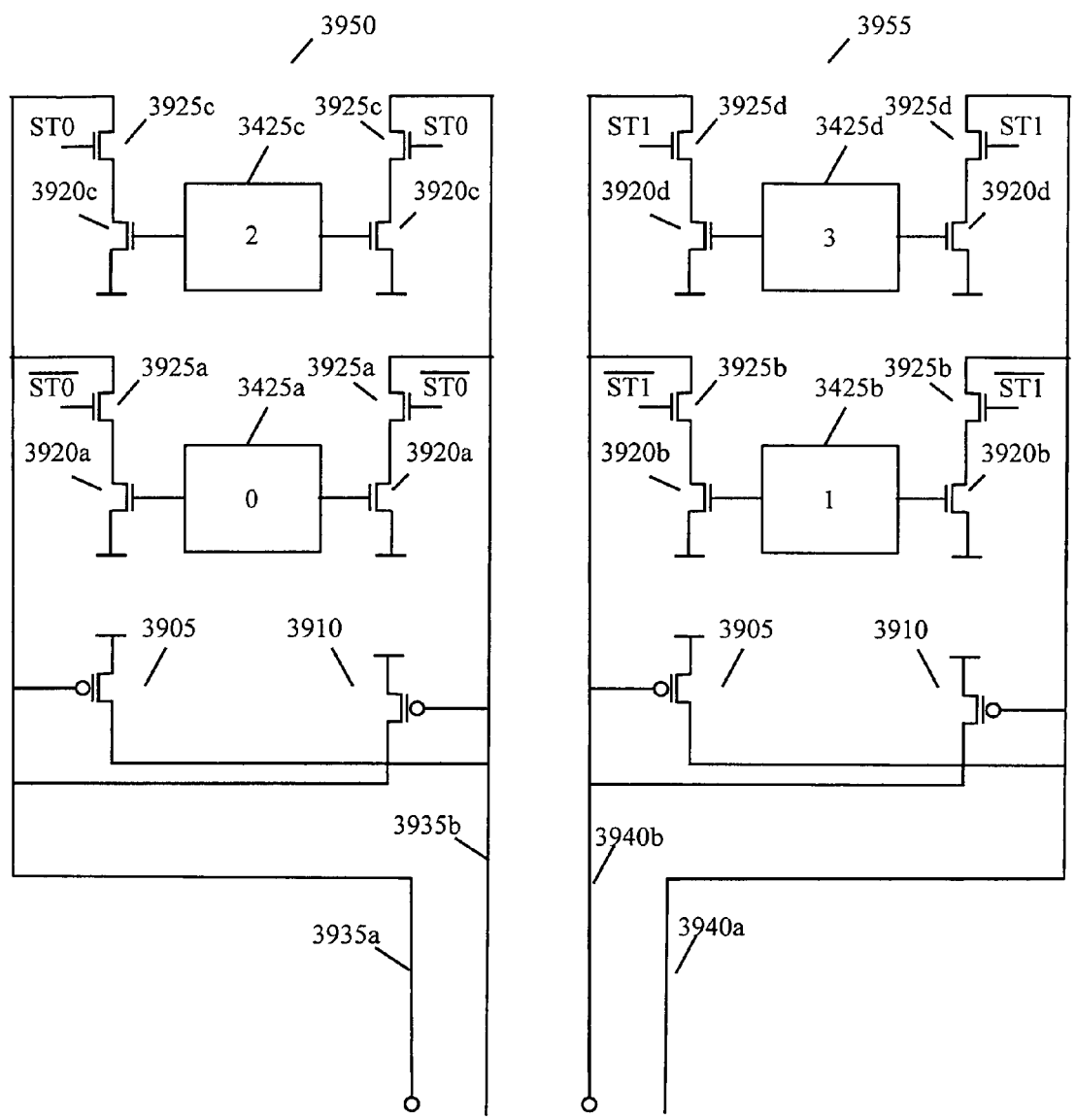
FIG. 39 illustrates another alternative circuit structure for one set of multiplexers in a two-tiered multiplexer structure of some embodiments.

Some embodiments that use this two-tiered structure, build the first tier of multiplexers into the sensing circuitry of the storage elements 3425. FIG. 39 illustrates an example of such an approach. Specifically, this figure illustrates four storage elements 3425a-3425d that are arranged in two columns 3950 and 3955. Each storage element stores one logical bit of data in a complementary format. This data might be configuration data, enable data, or any other data that needs to be provided to the reconfigurable IC on a sub-cycle basis.

Each of the two complementary outputs of each storage element 3425 connects to a pair of stacked NMOS transistors 3920 and 3925. One transistor 3925 in each stacked pair of NMOS transistors is part of a first tier multiplexer structure. Specifically, in the two-tiered circuit structure 3900 illustrated in FIG. 39, the first tier multiplexer structure is formed by the eight transistors 3925, which receive the sub-cycle signals ST0, ST1, or the complements of these signals.

Through the sub-cycle signals ST0, ST1, $\overline{ST0}$, and $\overline{ST1}$, the multiplexer transistors 3925 selectively connect the NMOS transistors 3920 to the cross-coupled PMOS transistors 3905 and 3910. One pair of PMOS transistors 3905 and 3910 exists in each column and form part of the sensing amplifier for the storage elements in that column.

Specifically, when the NMOS transistors 3920 associated with one storage element 3425 connect to the PMOS transistors 3905 and 3910, they form a level-converting sense amplifier. This amplifier then translates the signals stored in the storage element to the bit lines 3935 or 3940. The circuit 3900 provides the content of the storage elements through level-converting sense amplifiers, because, in some embodiments, the storage elements are storage cells that use a reduced voltage to store their data in order to conserve power. One such example of a reduced power storage cell is provided in United States. Application entitled "Method and Apparatus for Reduced Power Cell," filed concurrently with the present application, with the Ser. No. 11/081,874.

The bit lines 3935 and 3940 connect to the next stage in the circuit that they are used. Specifically, the bit lines 3935 and 3940 are provided to the two-to-one multiplexer 3415 in the circuit 3400, while they are provided to transistor stages 3640 and 3645 in the circuits 3600 and 3800, which, in turn, connect to the multiplexer 3415. As described above, the multiplexer 3415 is controlled through the clock signal CLK and its complement. Accordingly, when the clock signals CLK and $\overline{CLK}$, and the sub-cycle signals ST0, ST1, $\overline{ST0}$, and $\overline{ST1}$, have the timing relationship illustrated in FIG. 35, the first tier multiplexer (formed by the transistors 3925) and the second tier multiplexer 3415 operate to output data from the storage elements 3425 at a rate that is twice the rate of the clock signal CLK. This outputting is analogous to how the circuit 3400 outputs the S1 select signal on the sub-cycle basis that is illustrated in FIG. 35.

By building the first multiplexer stage into the sense amplifier section of the storage elements, this circuit reduces signal path delay from the storage elements. Also, it operates with storage elements that have less power consumption. Furthermore; it reduces power consumption by using NMOS transistors 3920 that are not driven by full voltage levels, and sharing the PMOS transistors 3905 and 3910 that are necessary for level conversion between two storage elements.

The two-tiered structure of the circuit 3900 of FIG. 39 can be easily extended to six and eight loopered structures. For a six loopered structure, all that needs to be done is to stack another pair of storage elements above elements 3425c and 3425d, and to drive the transistors 3925 with two sets of three one-hot signals. Similarly, for an eight loopered structure, all that needs to be done is to stack two pairs of storage elements on top of elements 3425c and 3425d, and to drive the transistors 3925 with the two sets of four one-hot signals. These sets of one-hot signals are further described in the U.S. Patent Application entitled "Configurable IC with Interconnect Circuits that also Perform Storage Operations", which is filed concurrently with the present application, with the Ser. No. 11/081,859.

IX. Configurable IC Architectures

Figure 40:
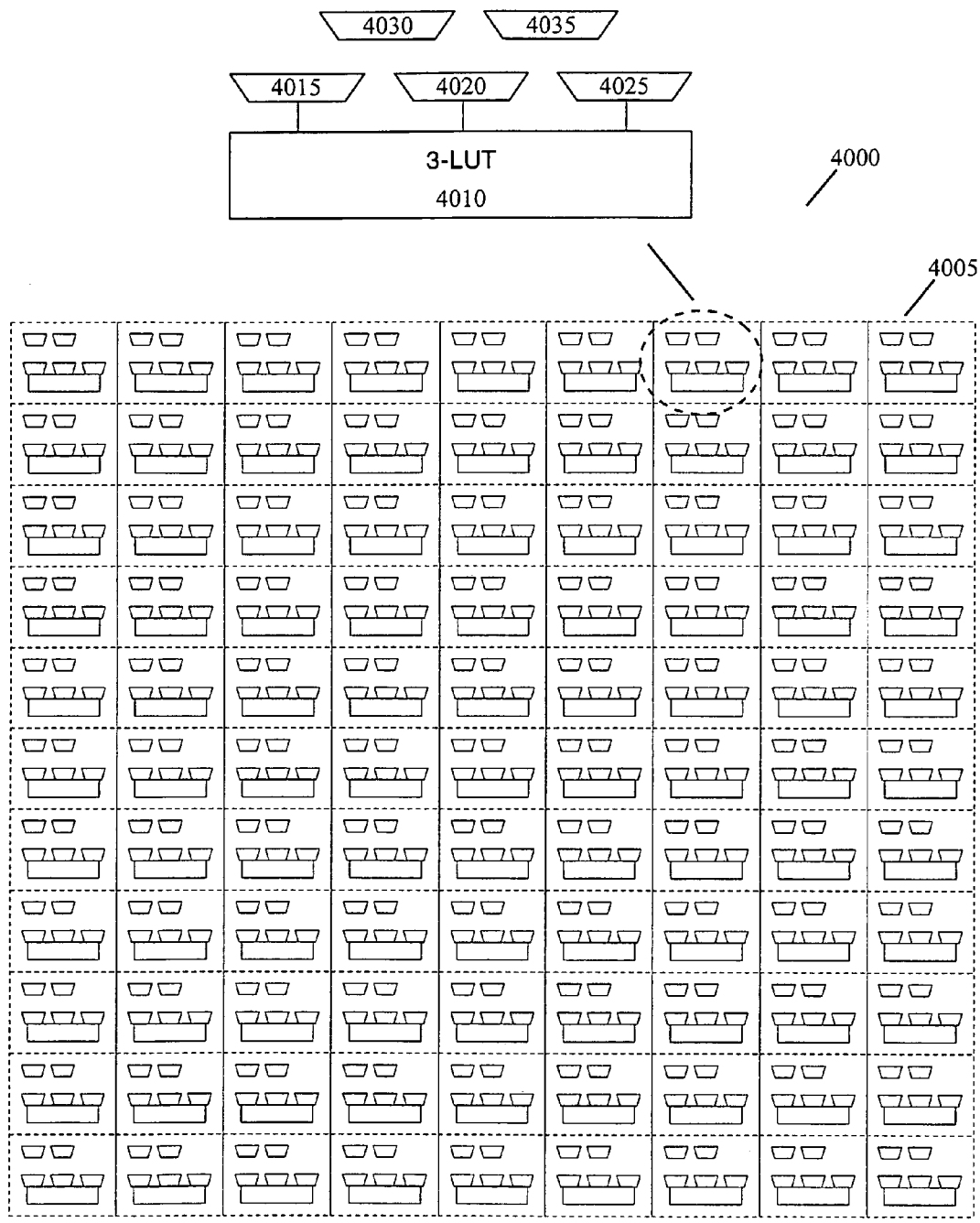
FIG. 40 illustrates an architecture that is formed by numerous configurable tiles that are arranged in an arrangement with multiple rows and columns.
Figure 41:
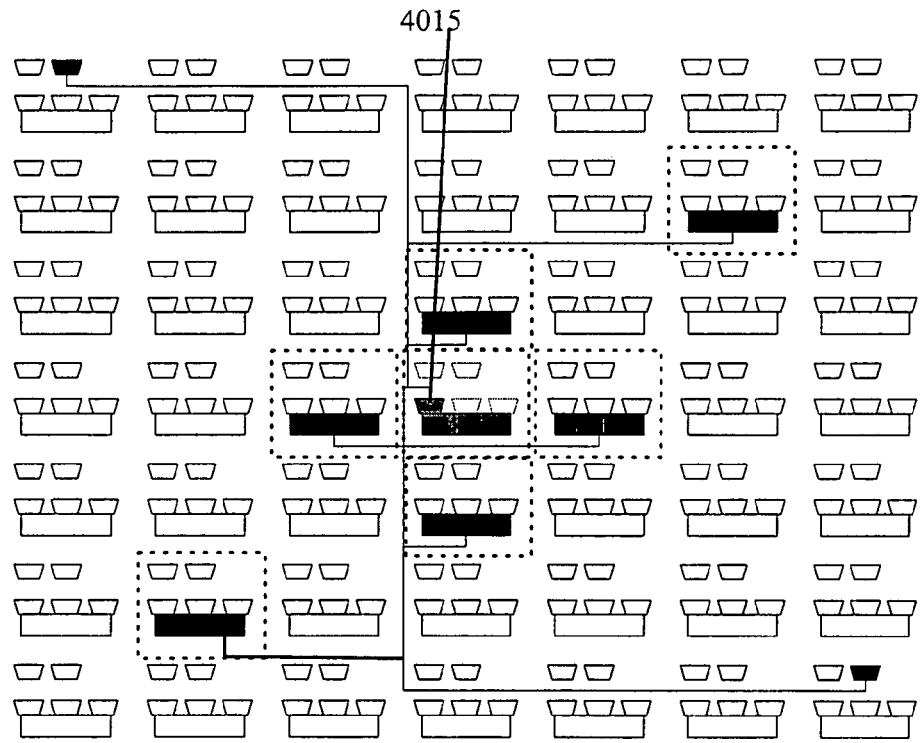
FIGS. 41-45 illustrate the connection scheme used to connect the multiplexers of one tile with the LUT's and multiplexers of other tiles.
Figure 42:
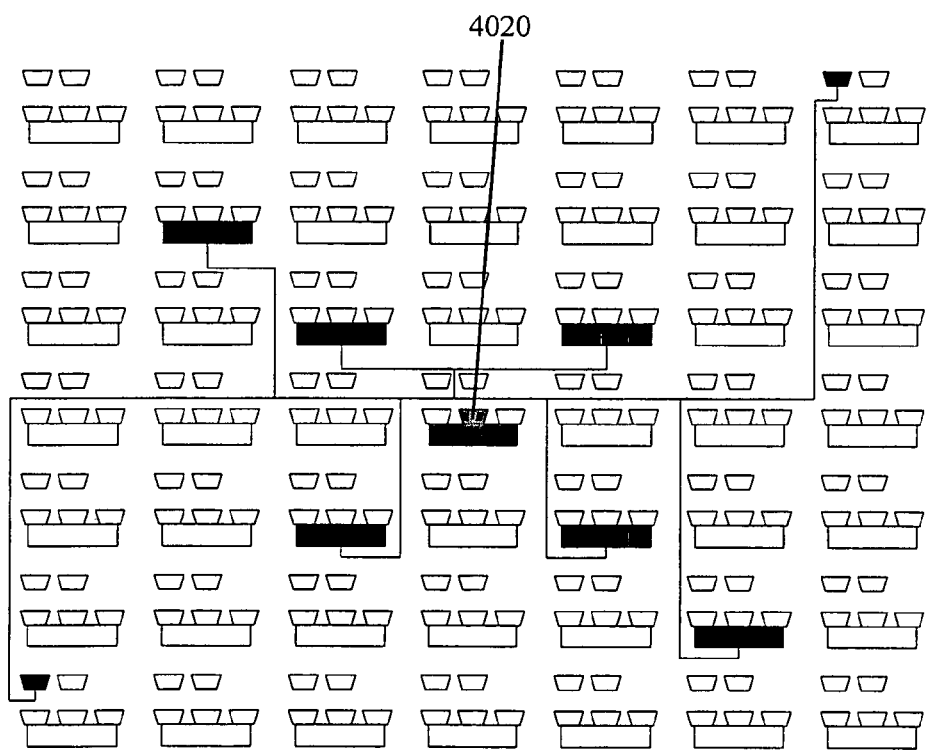
Figure 43:
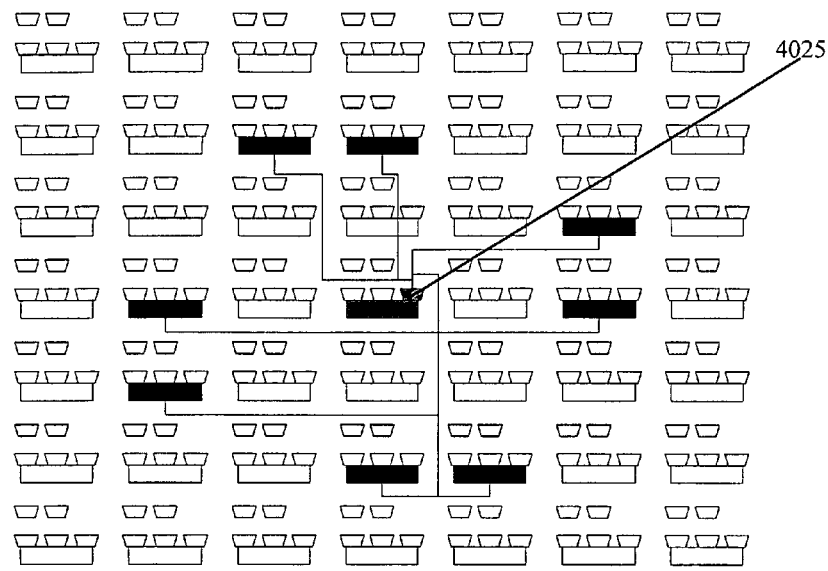
Figure 44:
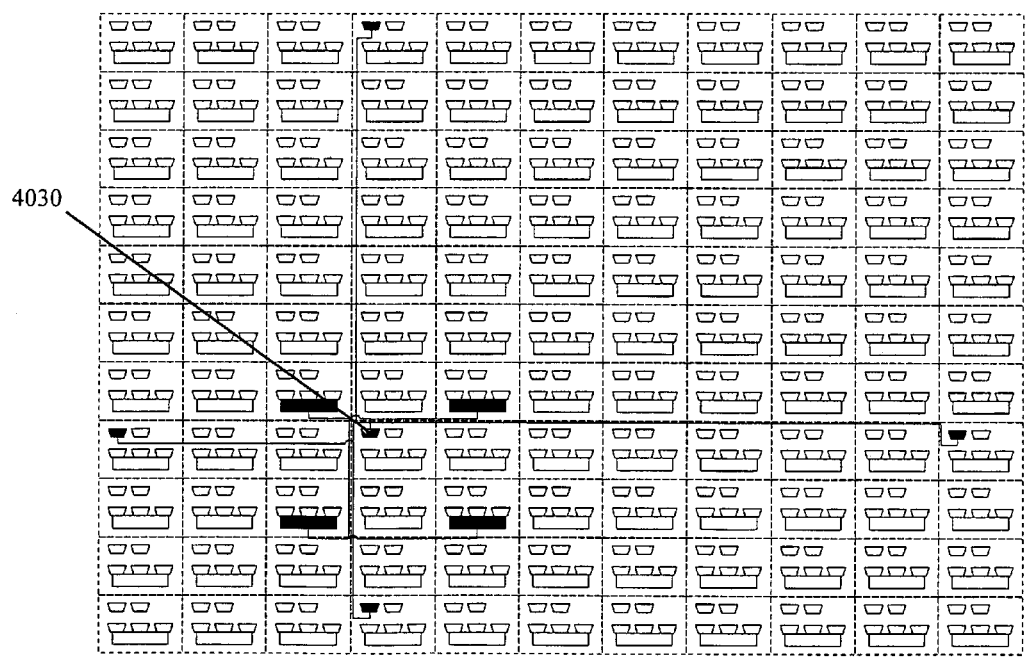
Figure 45:
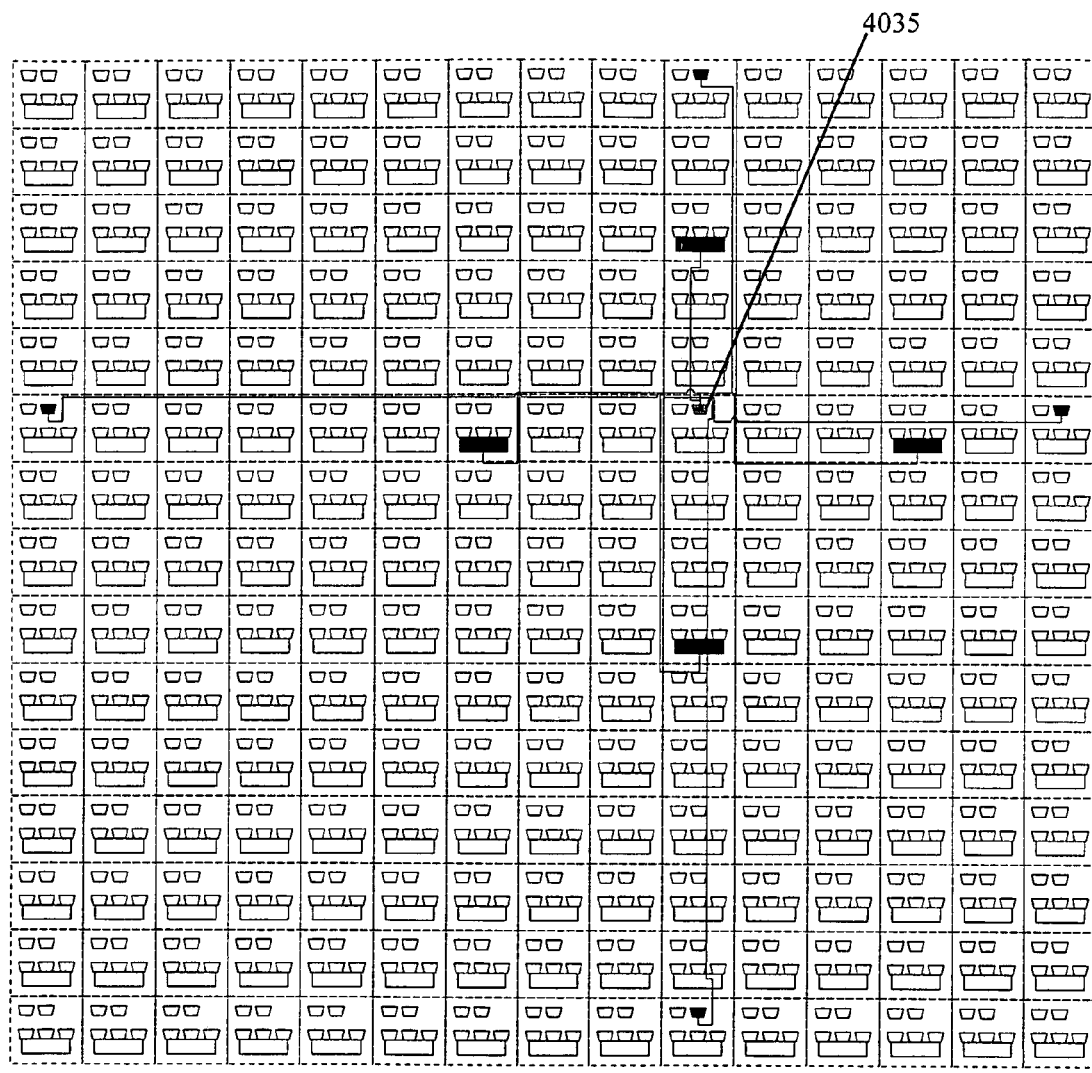

Different embodiments of the invention are implemented in different configurable IC's with different architectures. FIGS. 40-45 illustrate the architecture of some embodiments of the invention. As shown in FIG. 40, this architecture is formed by numerous configurable tiles 4005 that are arranged in an array with multiple rows and columns. In FIGS. 40-45, each configurable tile includes a sub-cycle reconfigurable three-input LUT 4010, three sub-cycle reconfigurable input-select multiplexers 4015, 4020, and 4025, and two sub-cycle reconfigurable routing multiplexers 4030 and 4035. Other configurable tiles can include other types of circuits, such as memory arrays instead of logic circuits.

In FIGS. 40-45, an input-select multiplexer is an interconnect circuit associated with the LUT 4010 that is in the same tile as the input select multiplexer. One such input select multiplexer receives several input signals for its associated LUT and passes one of these input signals to its associated LUT.

In FIGS. 40-45, a routing multiplexer is an interconnect circuit that at a macro level connects other logic and/or interconnect circuits. In other words, unlike an input select multiplexer in these figures that only provides its output to a single logic circuit (i.e., that only has a fan out of 1), a routing multiplexer in some embodiments either provides its output to several logic and/or interconnect circuits (i.e., has a fan out greater than 1), or provides its output to other interconnect circuits.

FIGS. 41-45 illustrate the connection scheme used to connect the multiplexers of one tile with the LUT's and multiplexers of other tiles. This connection scheme is further described in U.S. Application entitled "Configurable IC with Routing Circuits with Offset Connections", filed concurrently with this application with the Ser. No. 11/082,193. This application is incorporated herein by reference.

In the architecture illustrated in FIGS. 40-45, each tile includes one three-input LUT, three input-select multiplexers, and two routing multiplexers. Other embodiments, however, might have a different number of LUT's in each tile, a different number of inputs for each LUT, a different number of input-select multiplexers, and/or a different number of routing multiplexers. For instance, some embodiments might employ an architecture that has in each tile: one three-input LUT, three input-select multiplexers, and eight routing multiplexers. Also, in some embodiments, one or more of the input-select multiplexers (e.g., two of these multiplexers) are HUMUX's. Several such architectures are further described in the above-incorporated patent application.

Figure 46:
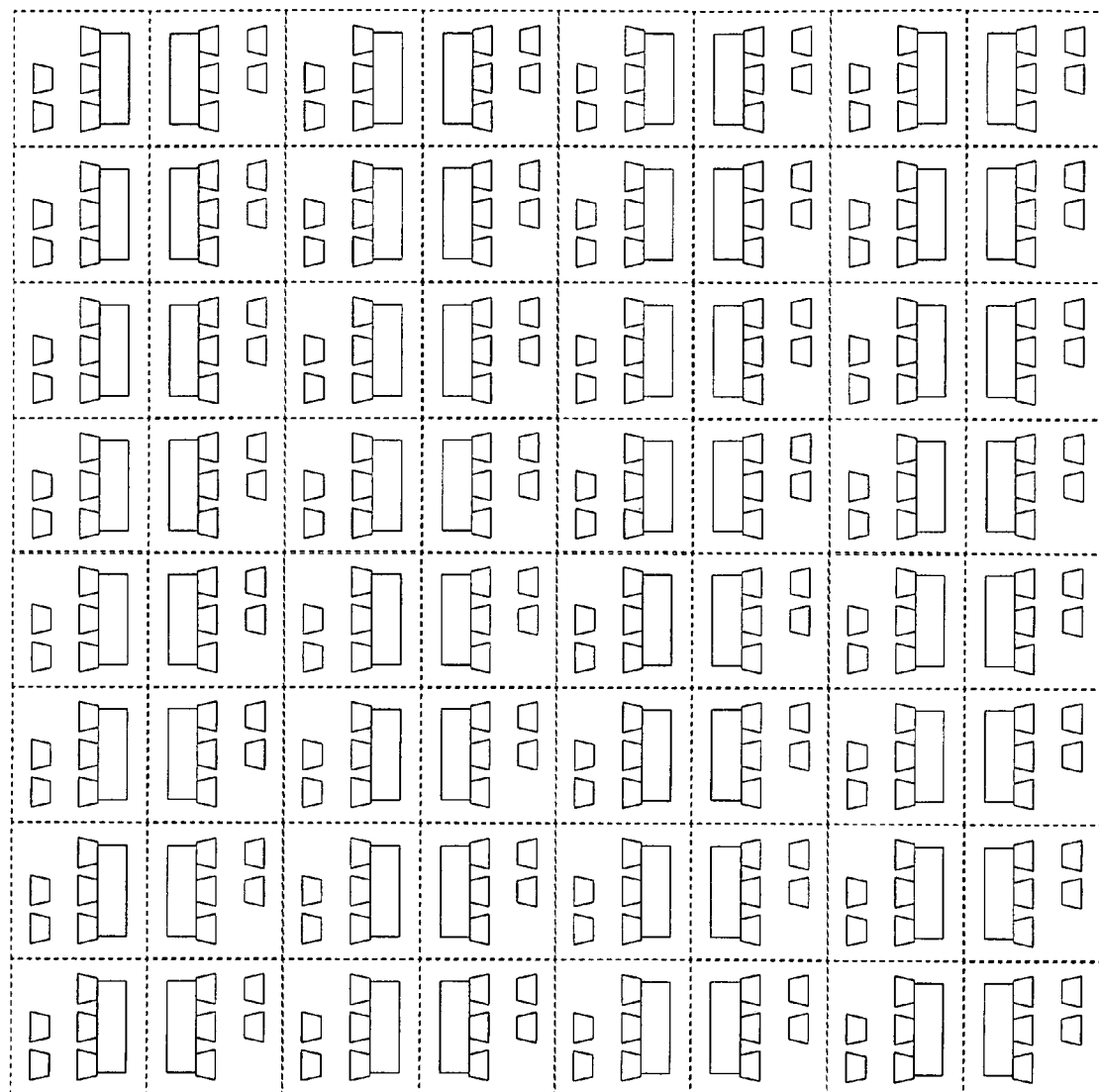
FIG. 46 illustrates a possible physical architecture of the configurable IC illustrated in FIG. 40.

In some embodiments, the examples illustrated in FIGS. 40-45 represent the actual physical architecture of a configurable IC. However, in other embodiments, the examples illustrated in FIGS. 40-45 topologically illustrate the architecture of a configurable IC (i.e., they show connections between circuits in the configurable IC, without specifying (1) a particular geometric layout for the wire segments that establish the connection, or even (2) a particular position of the circuits). In some embodiments, the position and orientation of the circuits in the actual physical architecture of a configurable IC is different than the position and orientation of the circuits in the topological architecture of the configurable IC. Accordingly, in these embodiments, the IC's physical architecture appears quite different than its topological architecture. For example, FIG. 46 provides one possible physical architecture of the configurable IC 4000 illustrated in FIG. 40. This and other architectures are further described in the above-incorporated patent application.

X. Configurable IC and System

Some embodiments described above are implemented in configurable IC's that can compute configurable combinational digital logic functions on signals that are presented on the inputs of the configurable IC's. In some embodiments, such computations are state-less computations (i.e., do not depend on a previous state of a value).

Some embodiments described above are implemented in configurable IC's that can perform a continuous function. In these embodiments, the configurable IC can receive a continuous function at its input, and in response, provide a continuous output at one of its outputs.

Figure 47:
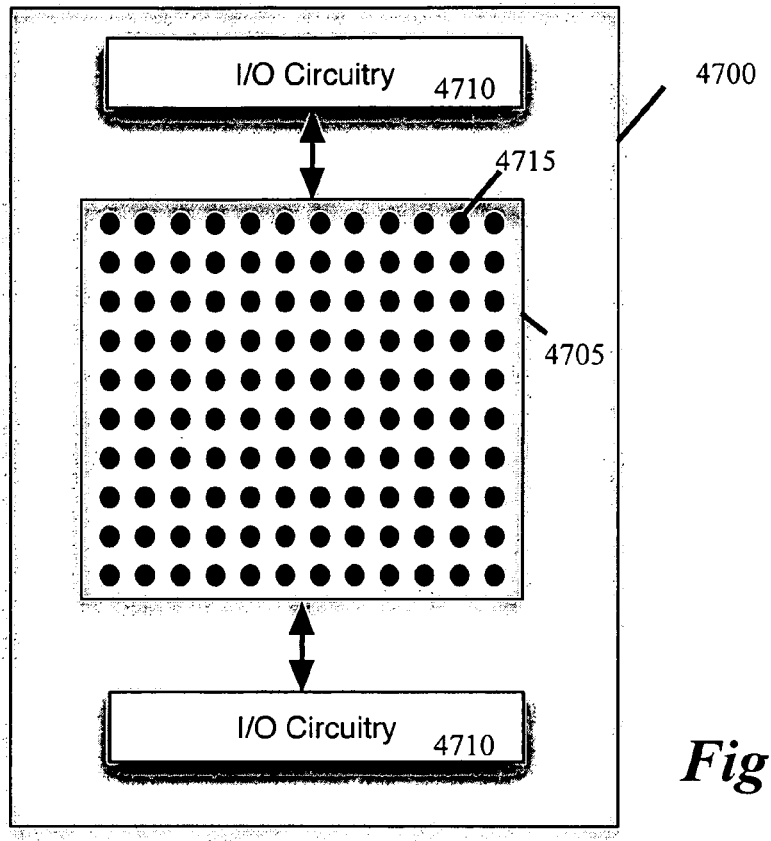
FIG. 47 illustrates a portion of a configurable IC of some embodiments of the invention.

FIG. 47 illustrates a portion of a configurable IC 4700 of some embodiments of the invention. As shown in this figure, this IC has a configurable circuit arrangement 4705 and I/O circuitry 4710. The configurable circuit arrangement 4705 can be any of the invention's configurable circuit arrangements that were described above. The I/O circuitry 4710 is responsible for routing data between the configurable circuits 4715 of the arrangement 4705 and circuits outside of the arrangement (i.e., circuits outside of the IC, or within the IC but outside of the arrangement 4705). As further described below, such data includes data that needs to be processed or passed along by the configurable circuits.

Figure 48:
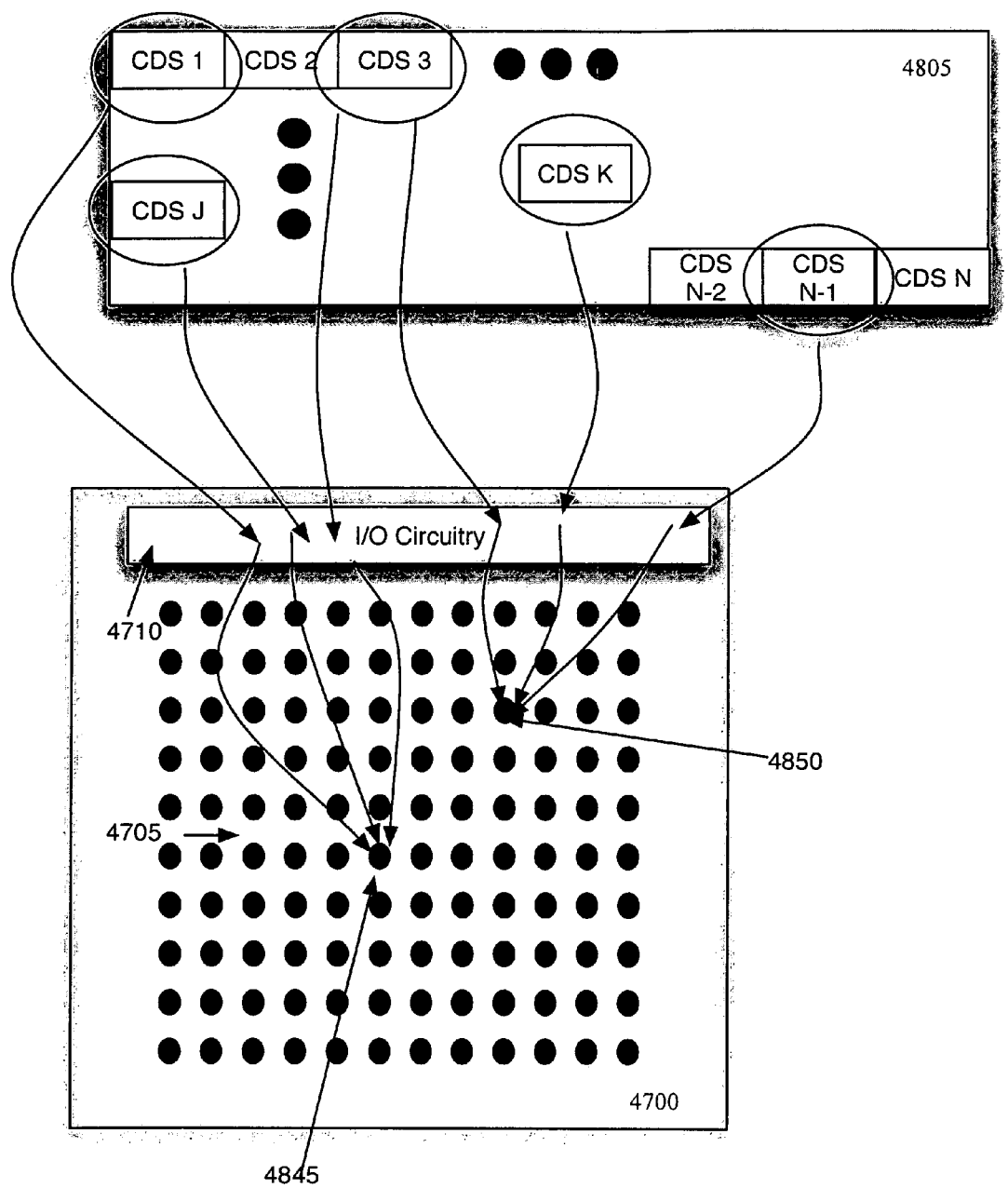
FIG. 48 illustrates a detailed example of configuration data that configure the circuits to perform particular operations.

The data also includes in some embodiments configuration data that configure the circuits to perform particular operations. FIG. 48 illustrates a more detailed example of this. Specifically, this figure illustrates a configuration data pool 4805 for the configurable IC 4700. This pool includes N configuration data sets (CDS). As shown in FIG. 48, the input/output circuitry 4710 of the configurable IC 4700 routes different configuration data sets to different configurable circuits of the IC 4700. For instance, FIG. 48 illustrates configurable circuit 4845 receiving configuration data sets 1, 3, and J through the I/O circuitry, while configurable circuit 4850 receives configuration data sets 3, K, and N−1 through the I/O circuitry. In some embodiments, the configuration data sets are stored within each configurable circuit. Also, in some embodiments, a configurable circuit can store multiple configuration data sets so that it can reconfigure quickly by changing to another configuration data set. In some embodiments, some configurable circuits store only one configuration data set, while other configurable circuits store multiple such data sets.

Figure 49:
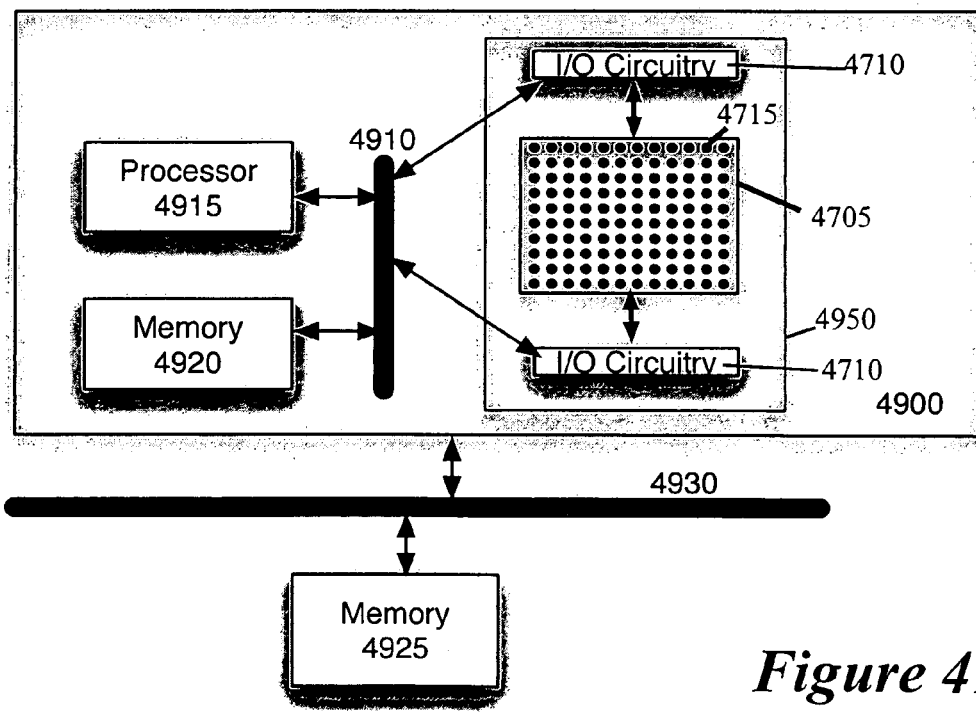
FIG. 49 illustrates a system on chip ("SoC") implementation of a configurable IC.

A configurable IC of the invention can also include circuits other than a configurable circuit arrangement and I/O circuitry. For instance, FIG. 49 illustrates a system on chip ("SoC") implementation of a configurable IC 4900. This IC has a configurable block 4950, which includes a configurable circuit arrangement 4705 and I/O circuitry 4710 for this arrangement. It also includes a processor 4915 outside of the configurable circuit arrangement, a memory 4920, and a bus 4910, which conceptually represents all conductive paths between the processor 4915, memory 4920, and the configurable block 4950. As shown in FIG. 49, the IC 4900 couples to a bus 4930, which communicatively couples the IC to other circuits, such as an off-chip memory 4925. Bus 4930 conceptually represents all conductive paths between the components of the IC 4900.

This processor 4915 can read and write instructions and/or data from an on-chip memory 4920 or an offchip memory 4925. The processor 4915 can also communicate with the configurable block 4950 through memory 4920 and/or 4925 through buses 4910 and/or 4930. Similarly, the configurable block can retrieve data from and supply data to memories 4920 and 4925 through buses 4910 and 4930.

Figure 50:
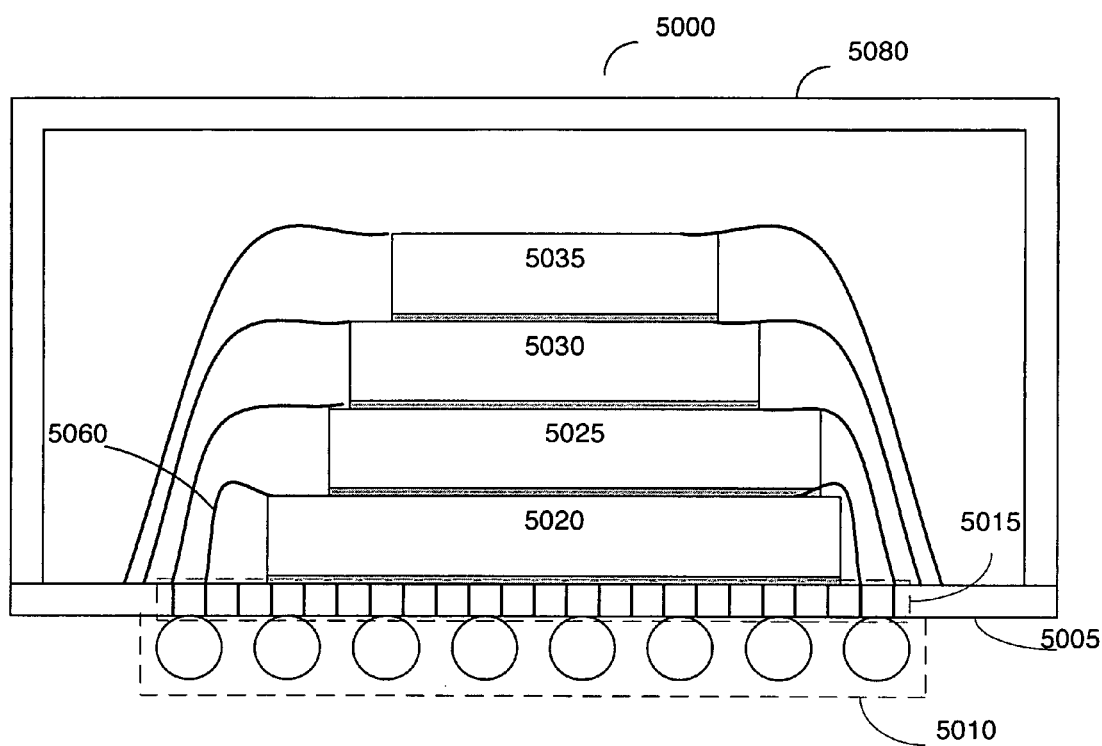
FIG. 50 illustrates a system in package ("SiP") implementation for a configurable IC.

Instead of, or in conjunction with, the system on chip ("SoC") implementation for a configurable IC, some embodiments might employ a system in package ("SiP") implementation for a configurable IC. FIG. 50 illustrates one such SiP 5000. As shown in this figure, SiP 5000 includes four IC's 5020, 5025, 5030, and 5035 that are stacked on top of each other on a substrate 5005. At least one of these IC's is a configurable IC that includes a configurable block, such as the configurable block 4950 of FIG. 49. Other IC's might be other circuits, such as processors, memory, etc.

As shown in FIG. 50, the IC communicatively connects to the substrate 5005 (e.g., through wire bondings 5060). These wire bondings allow the IC's 5020-5035 to communicate with each other without having to go outside of the SiP 5000. In some embodiments, the IC's 5020-5035 might be directly wire-bonded to each other in order to facilitate communication between these IC's. Instead of, or in conjunction with the wire bondings, some embodiments might use other mechanisms to communicatively couple the IC's 5020-5035 to each other.

As further shown in FIG. 50, the SiP includes a ball grid array ("BGA") 5010 and a set of vias 5015. The BGA 5010 is a set of solder balls that allows the SiP 5000 to be attached to a printed circuit board ("PCB"). Each via connects a solder ball in the BGA 5010 on the bottom of the substrate 5005, to a conductor on the top of the substrate 5005.

The conductors on the top of the substrate 5005 are electrically coupled to the IC's 5020-5035 through the wire bondings. Accordingly, the IC's 5020-5035 can send and receive signals to and from circuits outside of the SiP 5000 through the wire bondings, the conductors on the top of the substrate 5005, the set of vias 5015, and the BGA 5010. Instead of a BGA, other embodiments might employ other structures (e.g., a pin grid array) to connect a SiP to circuits outside of the SiP. As shown in FIG. 50, a housing 5080 encapsulates the substrate 5005, the BGA 5010, the set of vias 5015, the IC's 5020-5035, the wire bondings to form the SiP 5000. This and other SiP structures are further described in United States Patent Application entitled "Method for Manufacturing a Programmable System in Package", filed concurrently herewith with the Ser. No. 11/081,820.

Figure 51:
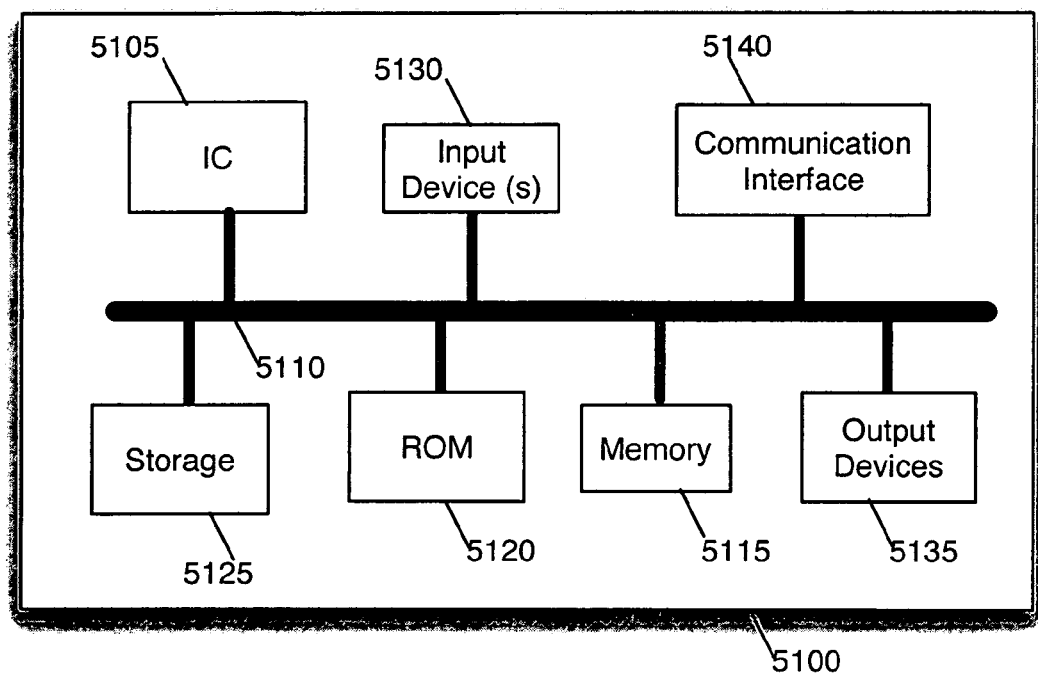
FIG. 51 conceptually illustrates a more detailed example of a computing system that has an IC, which includes one of the invention's configurable circuit arrangements that were described above.

FIG. 51 conceptually illustrates a more detailed example of a computing system 5100 that has an IC 5105, which includes one of the invention's configurable circuit arrangements that were described above. The system 5100 can be a stand-alone computing or communication device, or it can be part of another electronic device. As shown in FIG. 51, the system 5100 not only includes the IC 5105, but also includes a bus 5110, a system memory 5115, a read-only memory 5120, a storage device 5125, input devices 5130, output devices 5135, and communication interface 5140.

The bus 5110 collectively represents all system, peripheral, and chipset interconnects (including bus and non-bus interconnect structures) that communicatively connect the numerous internal devices of the system 5100. For instance, the bus 5110 communicatively connects the IC 5110 with the read-only memory 5120, the system memory 5115, and the permanent storage device 5125.

From these various memory units, the IC 5105 receives data for processing and configuration data for configuring the IC's configurable logic and/or interconnect circuits. When the IC 5105 has a processor, the IC also retrieves from the various memory units instructions to execute. The read-only-memory (ROM) 5120 stores static data and instructions that are needed by the IC 5110 and other modules of the system 5100. The storage device 5125, on the other hand, is read-and-write memory device. This device is a non-volatile memory unit that stores instruction and/or data even when the system 5100 is off. Like the storage device 5125, the system memory 5115 is a read-and-write memory device. However, unlike storage device 5125, the system memory is a volatile read-and-write memory, such as a random access memory. The system memory stores some of the instructions and/or data that the IC needs at runtime.

The bus 5110 also connects to the input and output devices 5130 and 5135. The input devices enable the user to enter information into the system 5100. The input devices 5130 can include touch-sensitive screens, keys, buttons, keyboards, cursor-controllers, microphone, etc. The output devices 5135 display the output of the system 5100.

Finally, as shown in FIG. 51, bus 5110 also couples system 5100 to other devices through a communication interface 5140. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. A computer-implemented synthesis method for implementing a logic function in an integrated circuit ("IC") comprising a plurality of multiplexers, the method comprising:
   decomposing the logic function into a plurality of smaller logic sub-functions; and
   assigning a particular multiplexer that comprises a permanently inverting input terminal to perform at least one smaller logic sub-function in the IC.

2. The computer-implemented synthesis method of claim 1, wherein the particular multiplexer comprises a set of input terminals, a set of output terminals, and a set of select terminals, wherein the particular multiplexer receives input data along the input and select terminals and performs the smaller sub-function on the received input data.

3. The computer-implemented synthesis method of claim 2, wherein the particular multiplexer further receives at least one constant value along at least one input terminal, while also receiving an input data along at least one input terminal.

4. The computer-implemented synthesis method of claim 1, wherein during one period of operation of the IC, the particular multiplexer receives only configuration data along a set of select terminals, while during another period of operation of the IC, the particular multiplexer receives non-configuration input, along at least one of the select terminals, on which the particular multiplexer performs the smaller logic sub-function.

5. The computer-implemented synthesis method of claim 1, wherein the decomposing comprises using Shannon decomposition to decompose the logic function.

6. The computer-implemented synthesis method of claim 1, wherein the IC comprises a plurality of logic circuits, wherein the particular multiplexer is an input select multiplexer that selects an input to a particular logic circuit.

7. The computer-implemented synthesis method of claim 6, wherein the particular logic circuit performs one of the smaller logic sub-functions.

8. A computer-implemented synthesis method for implementing a logic function in an integrated circuit ("IC") comprising a plurality of multiplexers, the method comprising:
   decomposing the logic function into a plurality of smaller logic sub-functions, wherein the decomposing comprises using Davio decomposition to decompose the logic function; and
   assigning a particular multiplexer that comprises a permanently inverting input terminal to perform at least one smaller logic sub-function in the IC.

9. The computer-implemented synthesis method of claim 8, wherein using Davio decomposition comprises defining an XOR function, wherein using said particular multiplexer with the permanently inverting input terminal comprises using the multiplexer to perform the XOR function.

10. The computer-implemented synthesis method of claim 8, wherein using Davio decomposition comprises defining the smaller logic sub-function as a function that is equivalent to an XOR function that has at least one of a negated input, permuted input, and a negated output.

11. The computer-implemented synthesis method of claim 8, wherein the decomposing further comprises using Shannon decomposition to decompose the logic function.

12. An integrated circuit ("IC") comprising:
   a plurality of logic circuits;
   a set of multiplexers, each multiplexer comprising a set of input terminals, a set of output terminals, and a set of select terminals;
   wherein at least one input terminal of a particular multiplexer is a permanently inverting input terminal;
   wherein, during a particular set of cycles during the operation of the IC, the particular multiplexer performs a particular logic sub-function on an input signal that the particular multiplexer receives along at least one of the particular multiplexer's input terminals, said particular logic sub-function resulting from a decomposition of a particular larger logic function into a plurality of logic sub-functions; and
   wherein, during the particular set of cycles, at least one of the logic circuits performs at least one of the other logic sub-functions resulting from the decomposition of the larger logic function.

13. The IC of claim 12, wherein the particular logic sub-function is an XOR function.

14. The IC of claim 12, wherein the particular logic sub-function is an equivalent of an XOR function.

15. The IC of claim 14, wherein the particular logic sub-function is an NPN equivalent of the XOR function, wherein NPN stands for negate input, permute input, negate output.

16. The IC of claim 12, wherein the particular multiplexer is a first multiplexer, the IC further comprising a second multiplexer for implementing the particular logic sub-function during the set of cycles,
   wherein the second multiplexer does not use permanently inverting input terminals when implementing the particular logic sub-function.

17. An electronic device comprising:
   an integrated circuit ("IC") comprising:
      a plurality of logic circuits; and
      a set of multiplexers, each multiplexer comprising a set of input terminals, a set of output terminals, and a set of select terminals;
   wherein at least one input terminal of a particular multiplexer is a permanently inverting input terminal;
   wherein, during a particular set of cycles during the operation of the IC, the particular multiplexer performs a particular logic sub-function on an input signal that the particular multiplexer receives along at least one of the particular multiplexer's input terminals, said particular logic sub-function resulting from a decomposition of a particular larger logic function into a plurality of logic sub-functions; and
   wherein during the particular set of cycles, at least one of the logic circuits performs at least one of the other logic sub-functions resulting from the decomposition of the larger logic function.

* * * * *